(12) United States Patent
Harter et al.

(10) Patent No.: US 7,301,192 B2
(45) Date of Patent: Nov. 27, 2007

(54) DRAM CELL PAIR AND DRAM MEMORY CELL ARRAY

(75) Inventors: Johann Harter, Dresden (DE); Wolfgang Mueller, Radebeul (DE); Wolfgang Bergner, Dresden (DE); Ulrike Grüning Von Schwerin, Munich (DE); Till Schloesser, Dresden (DE); Rolf Weis, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/222,273

(22) Filed: Sep. 8, 2005

(65) Prior Publication Data

US 2006/0076602 A1 Apr. 13, 2006

(30) Foreign Application Priority Data

Sep. 10, 2004 (DE) .................. 10 2004 043 857

(51) Int. Cl.
*H01L 27/108* (2006.01)
(52) U.S. Cl. .................. 257/301; 257/296; 257/303; 257/E27.086; 257/E27.092; 257/E27.094
(58) Field of Classification Search .......... 257/296, 257/298, 301, 303, 306, 905, E27.086, E27.092, 257/E27.094

See application file for complete search history.

(56) References Cited

U.S. PATENT DOCUMENTS

| | | | | |
|---|---|---|---|---|
| 5,124,765 A | * | 6/1992 | Kim et al. | 257/309 |
| 5,942,777 A | * | 8/1999 | Chang | 257/296 |
| 6,184,548 B1 | | 2/2001 | Chi et al. | |
| 6,493,253 B2 | | 12/2002 | Hofmeister | |
| 2004/0232469 A1 | * | 11/2004 | Fukuzumi | 257/310 |

* cited by examiner

*Primary Examiner*—Sue A. Purvis
*Assistant Examiner*—Benjamin Tzu-Hung Liu
(74) *Attorney, Agent, or Firm*—Dicke, Billig & Czaja, PLLC

(57) ABSTRACT

Stack and trench memory cells are provided in a DRAM memory cell array. The stack and trench memory cells are arranged so as to form identical cell pairs each having a trench capacitor, a stack capacitor and a semiconductor fin, in which the active areas of two select transistors for addressing the trench and stack capacitors are formed. The semiconductor fins are arranged in succession in the longitudinal direction to form cell rows and in this arrangement are spaced apart from one another by in each case a trench capacitor. Respectively adjacent cell rows are separated from one another by trench isolator structures and are offset with respect to one another by half the length of a cell pair. The semiconductor fins are crossed by at least two active word lines, which are orthogonal with respect to the cell rows, for addressing the select transistors realized in the semiconductor fin.

19 Claims, 40 Drawing Sheets

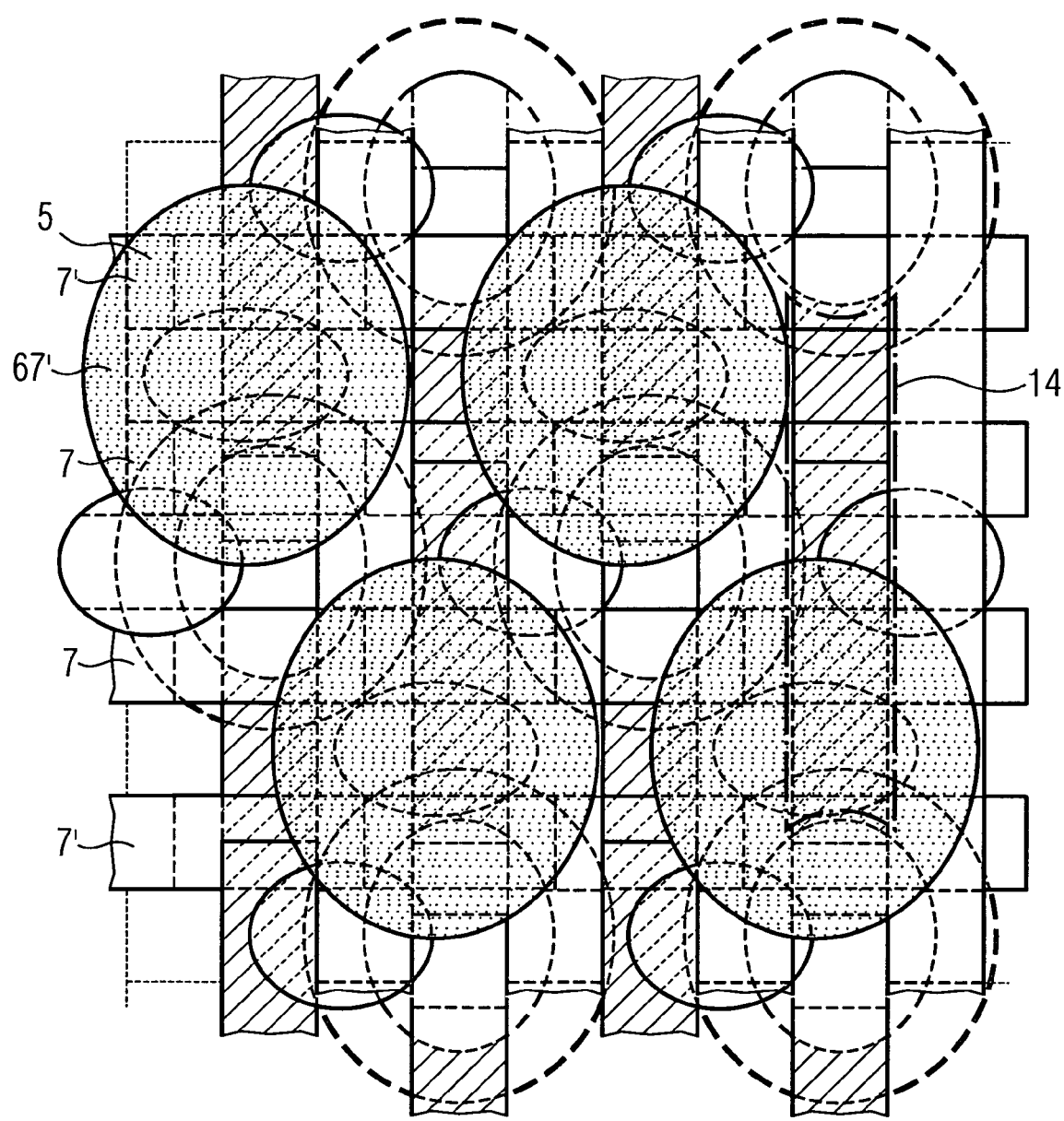

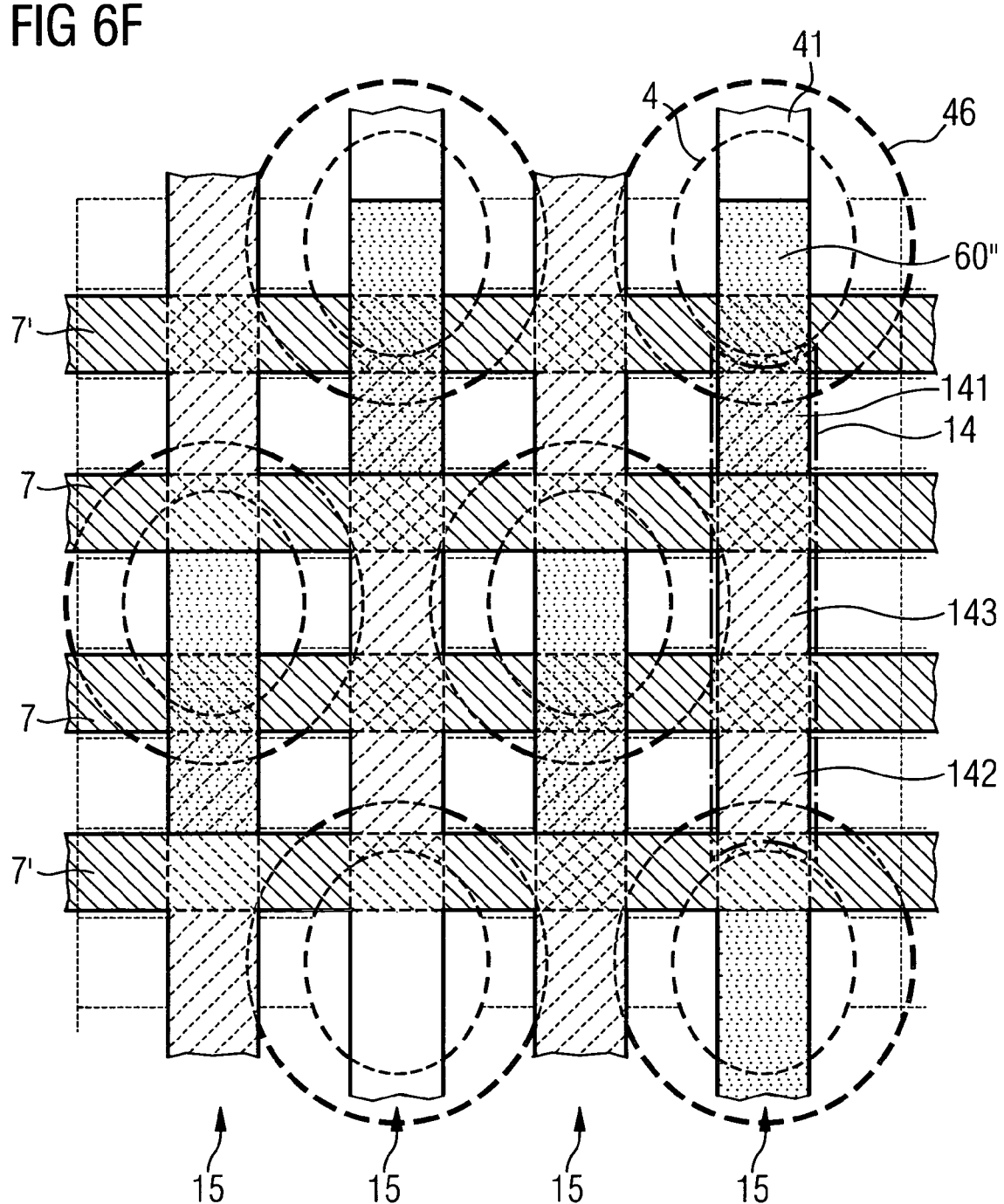

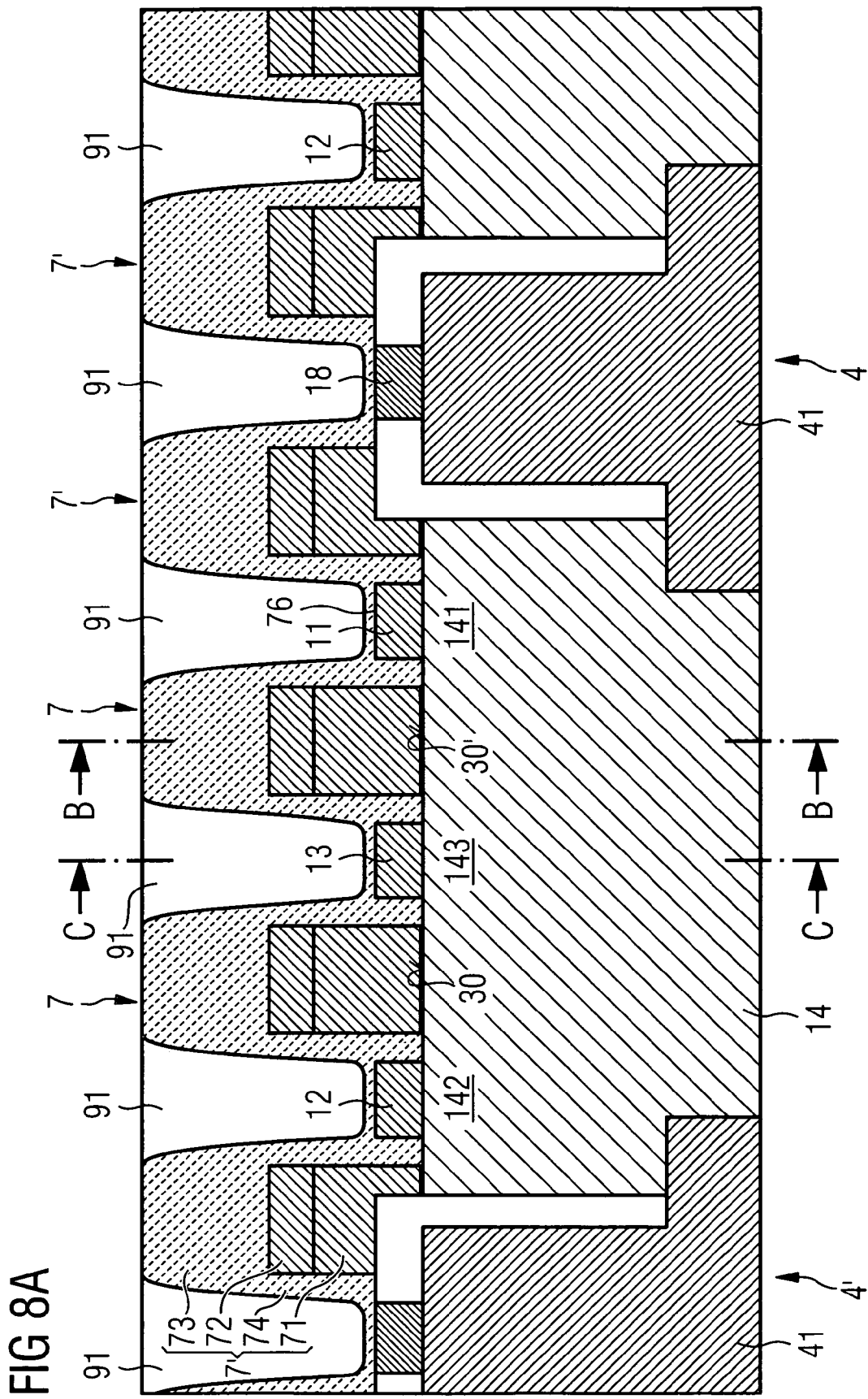

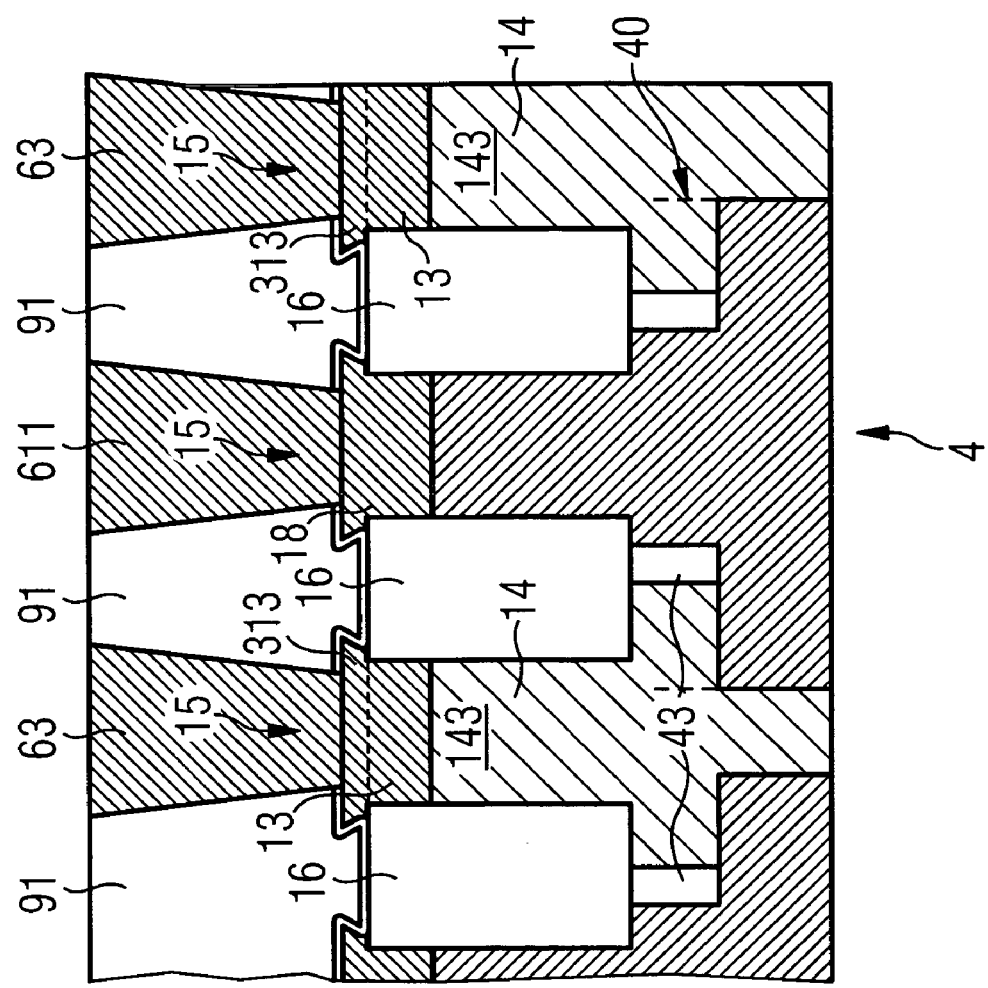
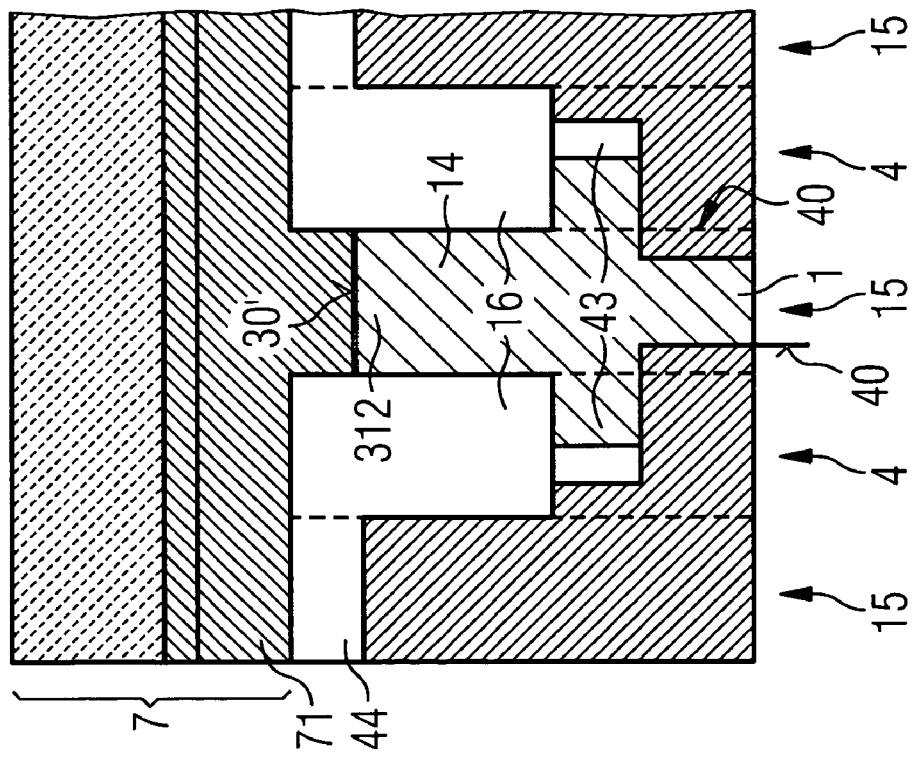

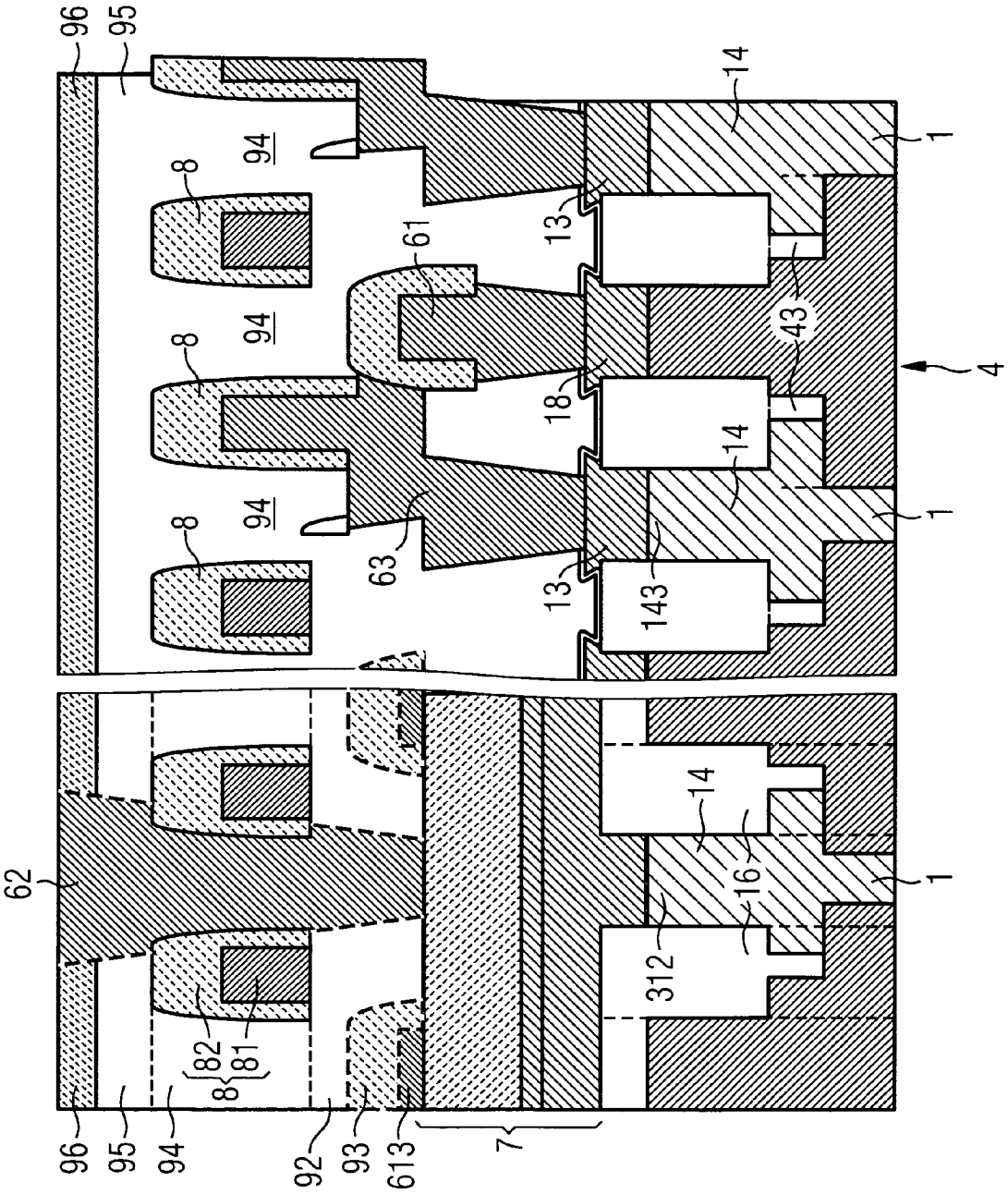

DRAM CELL PAIR AND DRAM MEMORY CELL ARRAY

CROSS-REFERENCE TO RELATED APPLICATIONS

This Utility Patent Application claims priority to German Patent Application No. DE 10 2004 043 857.9, filed on Sep. 10, 2004, which is incorporated herein by reference.

BACKGROUND

Memory cells of dynamic random access memories (DRAMs) in each case include a cell capacitor or storage capacitor for storing an electric charge, which characterizes the information content of the memory cell, and a cell transistor or select transistor for selectively addressing the memory cell.

The select transistors of the memory cells are provided as field-effect transistors each having an active area and a gate electrode. The active area includes two source/drain regions and a channel region. The source/drain regions are usually formed as n-doped regions in each case below a substrate surface in a semiconductor substrate. The channel region is provided as an undoped or lightly p-doped region in the semiconductor substrate and separates the two source/drain regions from one another. The channel regions of the select transistors are connected to a cohesive region of the same conductivity in the semiconductor substrate.

The gate electrodes of the select transistors are arranged above the respective channel region and are insulated from the semiconductor substrate by a gate dielectric which lies on the substrate surface of the semiconductor substrate. The gate electrodes of a plurality of memory cells arranged next to one another are formed as sections of addressing or word lines.

When the memory cell is operating, the formation of a conductive channel between the two source/drain regions by the channel region is controlled by a suitable potential at the gate electrode.

In the ON state of the select transistor, a storage electrode of the storage capacitor is connected to a data line or bit line. In the unaddressed state of the memory cell, the storage electrode is insulated from the bit line.

In the case of trench memory cells, the storage capacitors are formed as trench capacitors oriented at hole trenches which have been introduced into the semiconductor substrate from the substrate surface. The filling of the hole trench forms an inner or storage electrode. The opposite or outer electrode is formed by a doped region in a section of the semiconductor substrate which surrounds a lower section of the hole trench. In an upper section of the hole trench, formed between the substrate surface and the lower section, the filling of the hole trench is insulated from the semiconductor substrate by a collar insulator, and in the lower section opposite the outer electrode, the filling of the hole trench is insulated from the semiconductor substrate by a capacitor dielectric provided at the wall of the hole trench.

The connection of the storage electrode of the trench capacitor to the first source/drain region or the node junction of the associated select transistor, in concepts which are suitable for production lines, is usually effected as a buried strap via an electrically conductive interface (buried strap window) between the generally polycrystalline filling of the hole trench and the adjoining single-crystal semiconductor substrate below the substrate surface.

In the case of stack memory cells, the storage capacitor is provided as a stacked or stack capacitor outside the semiconductor substrate above the word lines. The connection of the storage electrodes of the stack capacitors to the respectively associated first source/drain region or node junction of the select transistor and the connection of bit lines provided above the word lines to the respective second source/drain region are effected in the same way via identical contact structures which pass between the word lines to the semiconductor substrate.

The costs per memory cell are being lowered by an ongoing reduction in the planar dimensions of the memory cells and the resulting higher yield of storage bits per wafer. To partially compensate for the associated loss of capacitance in the storage capacitors, the vertical dimensions of these capacitors are increased above the semiconductor substrate and/or into the depth of the semiconductor substrate relative to the planar dimensions. The aspect ratio of depth to width of trench structures that are to be processed is increased, making processing more difficult.

In cell concepts that provide a combination of stack and trench memory cells, the storage capacitors are realized on two levels. Based on the planar dimensions, there is consequently in principle twice the space available for forming the individual storage capacitors compared to cell concepts which provide exclusively stack or trench memory cells.

A DRAM twin cell is described in U.S. Pat. No. 6,184,548 B1 (Chi et al.). The twin cell includes two cell transistors which are addressed via a common addressing line. A trench capacitor is connected to a first bit line via the first cell transistor, and a stack capacitor is connected to a second bit line via the second cell transistor. The trench capacitor is formed between the two select transistors of the twin cell. On account of the fact that half the storage capacitors are formed above the substrate surface and the other half of the storage capacitors are formed below the substrate surface, it is possible to correspondingly increase the planar dimensions of all the storage capacitors.

One drawback of the concept described is the need for additional insulator structures on all sides of the twin cells.

U.S. Pat. No. 6,493,253 (Hofmeister) describes a DRAM memory cell in which the capacitance of a trench capacitor is increased by a stack capacitor connected in parallel with the trench capacitor.

A further memory cell concept with trench and stack capacitors is disclosed by U.S. Pat. No. 5,942,777 (Chang). The memory cell array in each case includes pairs of trench memory cells and pairs of stack memory cells. The memory cells are connected by means of parallel bit lines and parallel word lines. The trench memory cells are in each case arranged in pairs and formed along the bit lines. Each pair of trench memory cell runs via a common bit contact to the respectively associated bit line. Stack memory cells are likewise organized in pairs, oriented orthogonally with respect to the trench cell pairs and run in pairs onto the common bit contact. The trench memory cells are addressed via word lines running orthogonally with respect to the bit lines. The stack memory cells are addressed via word lines that are formed parallel to the bit lines and arranged alternately with the bit lines. The planar dimensions of the select transistors of trench and stack memory cells are substantially independent of one another in terms of process engineering.

Linking of trench and stack technologies that are currently sufficiently developed to be used in production leads to combined memory cells with a buried semiconductor connection between the trench capacitor and the trench select transistor, as well as a bit-contact-type connection between the stack capacitor and the stack select transistor. The type of connection to the node junction of the respective select transistor influences the characteristics of the associated memory cell. The properties of the trench memory cells and of the stack memory cells can only be matched to one another in a complex and expensive way.

SUMMARY

One embodiment of the invention relates to a DRAM cell pair. Each DRAM cell pair has a trench memory cell having a trench capacitor, which is formed in oriented fashion at a hole trench, which is introduced into a semiconductor substrate from a substrate surface, as storage capacitor. Each DRAM cell pair has a first select transistor connected to the trench capacitor, as well as a stack memory cell, having a stack capacitor arranged above the substrate surface as storage capacitor, and a second select transistor connected to the stack capacitor. The select transistors each have an active area having a first source/drain region, which is connected to a storage electrode of the respectively associated storage capacitor and is formed as a doped region of a first conductivity type. Each have a second source/drain region, which is connected to a bit line for transmitting an electric charge from/to the storage electrode and is formed as a doped region of the first conductivity type. Each have a channel region, which spaces the two source/drain regions apart from one another, is formed as a region which is not doped or is doped by the second conductivity type, opposite to the first conductivity type. The dimensions of the channel region define a channel length and a channel width of the select transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 4A to 4J illustrate a method for fabricating a DRAM memory cell array according to one embodiment of the invention in accordance with an exemplary embodiment on the basis of the photolithographic masks required for this purpose.

FIGS. 6A to 6J illustrate a method for fabricating a DRAM memory cell array according to one embodiment of the invention in accordance with an exemplary embodiment on the basis of the photolithographic masks required for this purpose.

DETAILED DESCRIPTION

Figure 1:
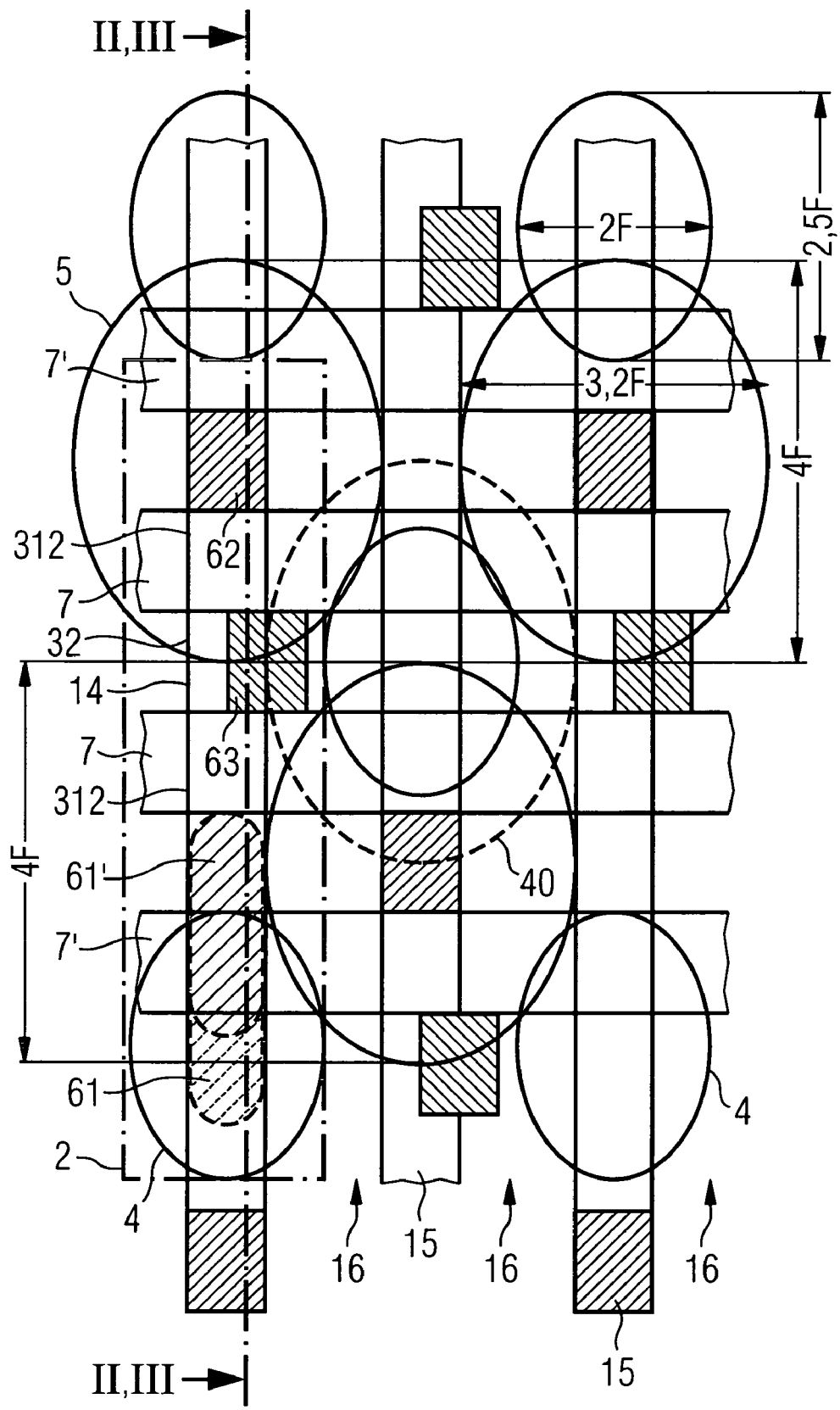
FIG. 1 illustrates a diagrammatic plan view of an excerpt from a DRAM memory cell array according to one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a DRAM memory cell array with DRAM cell pairs each having a stack memory cell and a trench memory cell. The electrical properties of the two cell types are substantially matched to one another, and at the same time, the DRAM cell pairs permit a high packing density of the memory cells. Also described, is a DRAM cell pair which forms the basis of a DRAM memory cell array of this type and methods for fabricating a DRAM memory cell array.

A DRAM memory cell arrangement including DRAM cell pairs is known from U.S. Pat. No. 6,184,548 B1. A cell pair of this type includes a trench memory cell having a first select transistor and a trench capacitor as storage capacitor, and a stack memory cell having a second select transistor and a stack capacitor as storage capacitor. The trench capacitors are in each case formed oriented at hole trenches that have been introduced into a semiconductor substrate from a substrate surface. The stack capacitors are formed above the substrate surface.

Active areas of the respective select transistors each include a first source/drain region, a second source/drain region and a channel region that spaces the two source/drain regions apart from one another. The two source/drain regions are each formed as a doped region of a first conductivity type, for example, of the n-conductivity type, in the semiconductor fin. The first source/drain region is in each case connected, as a node junction, to a storage electrode of the respectively associated storage capacitor. The second source/drain region is connected to a bit line via which an electric charge is carried from or to the storage electrode. The channel region spaces the two source/drain regions apart from one another and is formed as a region which is not doped or as a region which is doped by the second conductivity type, opposite to the first conductivity type. The geometry of the channel region defines a channel length and a channel width of the respective select transistor.

According to one embodiment of the invention, the active areas of the two select transistors of the DRAM cell pair are formed in a semiconductor fin. The semiconductor fin is a section of the semiconductor substrate with two parallel longitudinal sides. The semiconductor fin is delimited by trench isolator structures at two parallel longitudinal sides and by in each case a trench capacitor at two opposite end sides. The trench capacitor of the DRAM cell pair is arranged at one end of the semiconductor fin.

Within the semiconductor fin, the active areas are arranged in succession along a longitudinal axis of the semiconductor fin and are formed in mirror-image fashion with respect to one another, so that the second source/drain regions of the two select transistors form a cohesive bit contact terminal region. The channel regions and the first source/drain regions of the two select transistors in each case lie opposite one another in mirror-image fashion with respect to the bit contact terminal region.

Consequently, in one embodiment the select transistors of the trench memory cell and of the stack memory cell of the respective cell pair are formed in an identical, symmetrical way in a semiconductor fin. The active areas of the select transistors originate from the same processing operation and are substantially identical to one another. Forming the active areas in the same semiconductor fin means that the channel widths of the two select transistors correspond. Therefore, the resistance of the select transistors in the conductive state is substantially equal for both cell types. The electrical properties of the two cell types are substantially identical with regard to the select transistors.

The common bit contact terminal region allows common connection of two memory cells to the associated bit line, so that the planar space required to realize bit line terminals is reduced.

A DRAM memory cell array has memory cells each having a storage capacitor and a select transistor with a gate electrode, with in each case a plurality of the gate electrodes being connected to one another via word lines for selective addressing of the memory cells. In addition, a DRAM memory cell array includes bit lines for transmitting the electric charge stored in the memory cells. The bit lines are each connected to a plurality of the select transistors.

In a DRAM memory cell array according to one embodiment of the invention, in each case two of the memory cells form a DRAM cell pair of the type described above.

In one case, a plurality of DRAM cell pairs are arranged in succession adjacent to one another to form cell rows, so that in each case two cell pairs are separated from one another by the trench capacitor of one of the two cell pairs. The respective trench capacitor becomes part of the cell insulation. In one case, this eliminates the need for additional insulator structures which insulate and decouple the successive memory cells in the cell rows from one another. Within the cell rows, terminal regions for the connection of respective stack and trench capacitors alternate equidistantly, so that a high packing density of both types of capacitors along the cell lines is made possible without the need for further additional measures.

In one embodiment, the DRAM memory cell array includes a plurality of parallel cell rows, which are separated from one another by in each case a trench isolator structure, with in each case two adjacent cell rows being offset with respect to one another along the cell row by the extent of one cell pair. In this case, terminal regions for trench capacitors and stack capacitors also alternate with one another in a direction orthogonal to the cell rows, so that an arrangement of both capacitor types which allows a high packing density results in both planar axes without the need for further measures.

In one embodiment, the bit lines run parallel to the cell rows and the word lines run orthogonally with respect to the cell rows. The word lines are designed in such a way that the cell rows, in the region of a cell pair, above the channel regions of the two select transistors, are crossed by two active word lines which address the cell pair and also, at a distance from the channel regions and at least largely above the trench capacitor, by two passive word lines, which are intended to address memory cells in the respectively adjacent cell rows.

Accordingly, four word lines run over that section of a cell row which is assigned to in each case one cell pair and includes in each case one semiconductor fin and the associated trench capacitor, with active sections of two active word lines running above the channel regions of the two select transistors, and passive sections of two passive word lines running at a distance from the channel regions.

The minimum period (also referred to below as the pitch) within the cell rows and between the word lines defines the space taken up by a cell pair as 8 F×2 F. Consequently, the DRAM memory cell array according to one embodiment of the invention can be realized using the small space of $8 \times F^2$ per memory cell.

The offset of two adjacent cell rows in the longitudinal direction corresponds to half the period of the cell pairs within the cell row and is 4 F.

In a DRAM memory cell array of this type, stack capacitors and trench capacitors are provided alternately. The space available for the respective storage capacitor is doubled compared to memory cell concepts which provide exclusively trench or stack memory cells.

Since the trench capacitor is part of the cell insulation, the DRAM memory cell array according to one embodiment of the invention can be designed such that it takes up only $8 \times F^2$ of space, and therefore with a high packing density compared to other memory cell arrays which have both trench and stack memory cells.

Forming the active areas of the select transistors in segmented rows (segmented liner active areas) relieves the demands imposed on the lithographic process window. Since the space available per capacitor is doubled for the same technology compared to DRAM memory cell arrays which in each case provide exclusively either trench or stack capacitors, a DRAM memory cell array of this type can be better scaled.

The stack capacitor of the cell pair is connected to the node junction of the second (stack) select transistor via a stack connection.

The storage electrode of the trench capacitor is formed as a filling of the respective hole trench and connected via a trench connection to the node junction of the first (trench) select transistor.

In one embodiment, the trench connection is provided above the substrate surface of the semiconductor substrate and is formed from the same material as the stack connection. Stack and trench connections are then identical in form and may include one or more metal-containing sublayers. In one embodiment, the stack connection and the trench connection are formed from the same materials. The physical properties, such as for example thermal stability and resistivity, of the two connections are substantially identical to one another. The electrical properties of the stack memory cell and of the trench memory cell are approximately matched to one another with regard to the resistance between select transistor and storage capacitor, so that consequently characteristic parameters of the memory cells, such as for example the access time, are substantially independent of the particular type of cell.

In one embodiment, the word lines that run orthogonally with respect to the cell rows to form a base layer, which is in each case spaced apart from the channel regions that it passes by a gate dielectric, and a connecting layer connected to the base layer. Base layer and connecting layer may be formed from different materials. The choice of material for the base layer depends on the functional requirements with regard to the adjacent gate dielectric and is in one case doped, for example n-doped, polysilicon. The connecting layer, independently of this, may be provided from a highly conductive material, for example a metal.

Active sections of the respective word line, which in each case form the gate electrodes for controlling the respective select transistor, are defined above the semiconductor fins of the cell pairs that can be addressed by the respective word line. Passive sections of the respective word line are defined above the semiconductor fins of cell pairs which are not addressed by the respective word line, above the trench isolator structures.

In one embodiment of the DRAM memory cell array according to the invention, the base layer is formed in the active sections of the word lines and is not present in the passive sections of the word lines. The base layer is provided in segmented form in separate sections.

The insulation or decoupling of passive sections of the word lines with respect to the underlying structures is improved.

Furthermore, the trench connection can be designed as a surface strip which at the height of the base layer in sections lies on the storage electrode of the trench capacitor and in the region of the respectively associated node junction lies on the semiconductor fin. The surface strip is formed completely between the substrate surface and a bottom edge of the connection layer of the passive word lines and allows relatively low-resistance coupling of the trench capacitor to the associated select transistor. The resistance of the surface strip can be relatively well adjusted by means of the height of the surface strip. The surface strips are decoupled from the passive word lines running above them by a dielectric covering, in one case, of a silicon oxide or silicon nitride.

According to one embodiment of the DRAM memory cell array according to the invention, the base layer along the word lines is in each case formed completely. The trench connections continue in each case beyond at least one passive word line.

The trench connections then in each case include a node section, which runs between two adjacent word lines and contact-connects the semiconductor fin in the region of the node junction, a trench section, which runs between two word lines and electrically contact-connects the storage electrode of the trench capacitor, and a strip section, which connects the node section above the word line in each case located in between to the trench section.

In this case, for example, the length of the trench connection can be matched to that of the stack connection, so that the electrical resistances of the two connections are matched to one another and characteristic parameters of the memory cells are also independent of the type of cell.

According to one method of the invention for fabricating a DRAM memory cell array, first of all in any desired order, trench capacitors arranged to form parallel cell rows and trench isolator structures between the cell rows are introduced into a semiconductor substrate. In one case, hole trenches are first introduced into the semiconductor substrate by means of a perforated mask and to form the trench capacitors, and then strip-like trenches are introduced and filled with an insulator material, for example a silicon oxide. In the text which follows, the trench isolator structures correspond to the trenches filled with the insulator material.

In this context, semiconductor fins with parallel longitudinal sides and two opposite end sides are formed from the semiconductor substrate at a substrate surface of the semiconductor substrate. The semiconductor fins are separated from one another at the longitudinal sides by in each case one of the trench isolator structures and at the end sides by in each case one of the trench capacitors.

After a gate dielectric layer has been formed on the uncovered sections of the semiconductor substrate, in each case two gate conductor dots (GC dots), which are spaced apart from one another and from the end sides of the respective semiconductor fin and also from the adjacent cell rows, are provided above the semiconductor fins.

For the subsequent processing, the gate conductor dots define different sections of the respective semiconductor fin. A bit contact section results between the two gate conductor dots. A trench node section results between the first gate conductor dot and the respective trench capacitor, which is functionally associated with the semiconductor fin, and a stack node section of the respective semiconductor fin results between the second gate conductor dot and the trench capacitor located opposite the associated trench capacitor. A dielectric material, for example, a silicon oxide, which forms a first partial filling of a dielectric gate filling, is introduced between the gate conductor dots.

Vertical side walls of the gate conductor dots are covered, for example by silicon nitride spacers.

The gate filling above the trench node sections and the trench capacitors is removed in sections by means of a patterning method, for example a photolithographic method. The openings that form are filled by deposition of a contact material. The contact material is caused to recede selectively with respect to the gate conductor dots, and in the process the top edge of a trench connection which originated from the contact material and is formed as a surface strip is drawn back considerably, in one case to below half the height of the gate conductor dots. The trench connections connect the trench node sections of the semiconductor fins to the storage electrode of the respective trench capacitor.

The trench connections are covered with a dielectric material as far as the top edge of the gate conductor dots. The material of the coverings of the trench connections can correspond to the material of the gate filling. Alternatively, for better decoupling of the trench connections of word line sections to be provided above, silicon nitride is provided as material of the coverings.

The material that is provided for the coverings is planarized and then the processing of the word lines is continued. For this purpose, a conductive material is applied and patterned in strip form. The patterned conductive material in each case forms a connecting layer of a word line. A plurality of gate conductor dots, which are separated from one another and are each arranged in a line orthogonal to the cell rows, are connected to form a word line via in each case one connecting layer. The gate conductor dots connected via the respective connecting layer form a segmented base layer of the word line.

The material of the base layer is in one case doped, and in particular, if the select transistors are formed as n-channel field-effect transistors, is in one case n-doped polysilicon.

The conductive material of the connecting layer may, for example, be doped polysilicon. Alternatively, in one case the connecting layer is provided as one or more metal-containing sublayers, and consequently with a reduced electrical resistance. The connecting layer then includes one or more barrier, adhesion and/or connecting sublayers.

Prior to the patterning of the conductive material of the connecting layer, a layer of a dielectric material, for example silicon nitride, is applied to it and patterned together with the conductive material. After the patterning, an insulator layer in each case lies on the connecting layers. Spacer insulator structures made from silicon nitride are provided at the vertical side walls of the connecting layer.

The gate filling between the word lines is supplemented by a second partial filling, in one case made from the material of the first partial filling.

The gate filling above the stack node sections and the bit contact sections is removed selectively with respect to the word lines by means of a patterning method, for example in a further photolithographic step.

The openings that have formed are filled with a contact material, with the material of the surface strips, for example by deposition of the contact material in a first step and planarization of the contact material down to the top edge of the word lines in a second step.

The contact material in each case forms a lower section (CA section) of a bit contact structure, which contact-connects the bit contact sections and connects them to bit lines that are yet to be formed, above the bit contact sections of the semiconductor fins, and in each case forms a CA section of a stack connection, which contact-connects the stack node sections and connects them to in each case a stack capacitor which is yet to be formed, above the stack node sections of the semiconductor fins.

In one case, the trench capacitors are introduced by a protective layer, for example of silicon nitride, being applied to the substrate surface. Hole trenches are introduced into the semiconductor substrate through the protective layer, for example by means of a photolithographic method, and trench capacitors are formed in each case oriented at a hole trench.

In this case, the storage electrodes of the trench capacitors are in each case formed as a conductive filling of the respective hole trench and covered with a trench top insulator. The protective layer is removed before the gate conductor dots are formed.

The trench top insulators are provided from the same material as the first partial filling of the gate filling or from a material whereof the etching properties substantially correspond to those of the gate filling. The trench top insulators are then caused to recede together with the gate filling during the removal of first sections of the gate filling, and the storage electrodes are uncovered in sections in the same step.

In one case, the semiconductor substrate is widened by selective expitaxial growth of semiconductor material in the node sections and the bit contact sections prior to the provision of the first partial filling of the dielectric gate filling. In this case, the epitaxially grown semiconductor material, for example silicon, forms node widenings, which adjoin the node sections, and bit contact widenings, which adjoin the bit contact sections.

Overgrowth of the adjacent trench isolator structures increases the surface area of the respective sections of the semiconductor fins. As a result, the demands imposed on the alignment of the subsequent lithographic masks and on the control of subsequent etching processes are relaxed.

Forming the source/drain regions of the select transistors in the grown sections increases the channel length of the select transistors and improves the insulation properties of the respective select transistor in the OFF state.

According to one method of the invention for fabricating a DRAM memory cell array, first of all trench capacitors are introduced into a semiconductor substrate in the manner which has already been described, and semiconductor fins with parallel longitudinal sides and two opposite end sides are formed from the semiconductor substrate between the trench capacitors, the semiconductor fins being adjoined by a trench isolator structure at each of the longitudinal sides and by one of the trench capacitors at each of the end sides.

Unlike in the method that has already been described, strip-like word lines which are formed completely in all layers are subsequently provided.

For this purpose, after a gate dielectric layer has been formed, at least one layer of a conductive material is applied to uncovered sections of the semiconductor fins and patterned in strip form, with word lines which run orthogonally with respect to the cell rows being formed from the at least one conductive material.

In this case, the word lines are arranged in such a way that at least two word lines, which are spaced apart from one another and from the end sides of the respective semiconductor fin, are formed above each semiconductor fin. This type of arrangement of the word lines results in a bit contact section of the semiconductor fin being defined between the two word lines, a trench node section of the semiconductor fin being defined between the first word line and the trench capacitor associated with the semiconductor fin, and a stack node section of the semiconductor fin being defined between the second word line and the trench capacitor located opposite the associated trench capacitor. A dielectric gate filling is introduced between the word lines.

Alternatively, the word lines are formed using Damascene technology, in which case the dielectric gate filling is provided first of all, and strip-like trenches corresponding to the word lines that are to be formed are introduced into this dielectric gate filling. The strip-like trenches are filled by one or a sequence of processes of deposition and removal of material together with the word line layer(s).

The gate filling is removed in sections above the bit contact sections and the node sections of the semiconductor fins and above the trench capacitors, for example by means of a photolithographic method using a strip mask that is aligned with respect to the cell rows. One or more contact materials are applied and caused to recede selectively down to the top edge of the word lines. In the process, lower sections of bit contact structures which contact-connect the bit contact sections, lower sections of stack connections which contact-connect the stack node sections and trench sections which contact-connect the storage electrodes, as well as node sections, which contact-connect the node sections, of trench connections are formed above the bit contact sections.

Strip sections of the trench connections, which lie on the node sections and the trench sections and electrically conductively connect them to one another, are provided by a patterning method, for example by a photolithographic method, above the word line in each case arranged between the trench section and the node section.

In one case, the introduction of the trench capacitors includes, in the manner which has already been described, the covering of the storage electrodes in each case with a trench top insulator. The trench top insulators are opened by a photolithographic step before the gate filling is provided and for the storage electrodes to be uncovered in sections.

Before the dielectric gate filling is provided, in one case the semiconductor substrate is widened by node widenings in the node sections and by bit contact widenings in the bit contact sections, by selective epitaxial growth of semiconductor material.

In one case, the trench top insulators are opened before the semiconductor substrate is supplemented, so that the storage electrodes of the trench capacitors are also supplemented by trench electrode widenings.

In one case, the widenings grow over the respectively adjacent trench insulator structures by at least 5%, and in one case by 25%, of the width of the semiconductor fins, so that the surface area of the respective section is increased by at least 10%, and in one case by 50%.

FIG. 1 illustrates a simplified overview of the arrangement of the storage capacitors and the select transistors within a DRAM memory cell array with cell pairs each having a trench memory cell and a stack memory cell, as well as of the arrangement of the cell pairs with respect to one another.

The region of a cell pair 2 is demarcated by dot-dashed lines in the left-hand part of FIG. 1. The cell pairs 2 are formed with a longitudinal axis oriented along cell rows 15 and include a trench capacitor 4, a stack capacitor 5 and a semiconductor fin 14 with the active areas of two select transistors of the cell pair 2.

The semiconductor fins 14 of cell pairs 2 which are adjacent to one another within the same cell row 15 are spaced apart from one another by in each case a trench capacitor 4. Word lines 7, 7' run over the semiconductor fins 14 or trench capacitors 4 orthogonally with respect to the cell rows 15. Each semiconductor fin 14 is in this case covered by two active word lines 7. Channel regions 312 of the two select transistors are formed in the semiconductor fins 14 below the active word lines 7. A bit contact terminal region 32, which is connected via a bit contact structure 63 to a bit line running above the word lines 7, 7' and below the stack capacitors 5 and orthogonally with respect to the word lines 7, 7', is formed in the semiconductor fin 14 between the two active word lines 7.

A first source/drain region or the node junction of the select transistor assigned to the stack capacitor 5 is connected to the stack capacitor 5 provided above the word lines 7, 7' by means of a stack connection 62 which runs between two word lines 7, 7'. The first source/drain region or the node junction of the first select transistor connected to the trench capacitor 4 is connected to the storage electrode of the respectively associated trench capacitor 4 by means of a trench connection 61, which may be designed as a surface strip 61'.

The surface strip 61' lies on the semiconductor fin 14 and the storage electrode of the storage capacitor 4. The trench connection 61 runs over a passive word line 7', which runs across the cell row 15 approximately at the transition from the semiconductor fin 14 to the trench capacitor 4.

The cell rows 15, which are equidistant from one another, are isolated from one another by trench isolator structures 16. The trench capacitors 4, as indicated by the dashed line 40, are widened in a bottle shape below the substrate surface 10 and below the transistor structures formed in the region of the semiconductor substrate 1 which is close to the surface. The cell rows 15 and the word lines 7, 7' are in each case provided at the minimum distance which results from the lithographic process technique used from one another. FIG. 1 indicates exemplary dimensions, in each case based on the minimum feature size F.

In accordance with the cell concept illustrated, the result is an arrangement of both the stack capacitors 5 and the trench capacitors 4 along cell rows 15, with adjacent cell rows 15 in each case offset with respect to one another by half the length of a cell pair 2 (pitch). A high packing density results both for the trench capacitors 4 and for the stack capacitors 5. The cell pair 2 takes up a planar space of $16 \times F^2$.

The bit contact structures 63 are offset by 0.5 F with respect to the row axis, in order to ensure the contact-connection to bit lines (not shown), which are each provided above the trench isolator structure 16.

FIG. 2 in each case illustrates a longitudinal section through a cell pair 2, along the cell row 15, in accordance with FIG. 1.

The cell pair 2 includes a trench memory cell 21 in the left-hand part and a stack memory cell 22 in the right-hand part. The figure also illustrates the trench capacitor 4' of a cell pair which is adjacent on the right-hand side.

The trench memory cell 21 includes a trench capacitor 4, which is formed oriented at a hole trench that has been introduced into a semiconductor substrate 1, and a trench select transistor, the active area 31 of which is defined within a semiconductor fin 14 which extends between the two trench capacitors 4, 4' and parallel to the cross-section plane is in each delimited by parallel trench isolator structures.

The stack memory cell 22 includes a stack capacitor 5 and a stack select transistor, the active area 31' of which, based on a vertical reference plane of the semiconductor fin 14, is formed mirror-symmetrically with respect to the active area 31 of the trench select transistor orthogonally with respect to the cross-sectional plane illustrated.

The storage electrodes 41, which are in each case formed as a filling of the trench capacitors 4, 4', are in each case insulated from the semiconductor substrate 1 surrounding the hole trenches in an upper section by a collar insulator 43. In a lower section, a counterelectrode, which is spaced apart from the storage electrode 41 by a capacitor dielectric 42, is formed in the semiconductor substrate 1 surrounding the hole trench outside the region illustrated.

The semiconductor fin 14 is a section of the monocrystalline semiconductor substrate 1.

In the exemplary embodiment illustrated, widening sections 11, 12, 13 are grown epitaxially on to an original substrate surface 10 of the semiconductor substrate 1. The bit contact widening 13 which has been grown forms a bit contact terminal region formed from the two second source/drain regions of the two select transistors. The two node junction widenings 11, 12 in each case form the first source/drain regions of the two select transistors. A channel region 312, 312' is defined in the semiconductor fin 14 in each case between the trench node widening 11 and the bit contact widening 13 and between the stack node widening 12 and the bit contact widening 13. A gate conductor dot 71' is arranged above each of the channel regions 312, 312', insulated therefrom by a gate dielectric 30, 30'. The gate conductor dots are in each case part of respective active word lines 7.

The word lines 7, 7' run orthogonally with respect to the cell rows or with respect to the semiconductor fins 14. In the region of a cell pair 2, four word lines 7, 7' run over the respective cell row 15. Two of the four word lines 7, 7' are used as active word lines 7 for addressing the two memory cells of the cell pair 2. In the region of the semiconductor fin 14, the gate conductor dots 71' form a segmented base layer of the respective active word line 7 and adjoin the respective gate dielectric 30, 30'. Mutually associated gate conductor dots are connected to one another by a connecting layer 72 of the respective word line 7, 7'. The connecting layers 72 are strip-like in form and run over the cell array orthogonally with respect to the cell rows. The word lines 7 are isolated with respect to conductive structures on top of them by means of in each case an insulating layer 73 and with respect to adjacent conductive structures by means of spacer insulator structures 74, these conductive structures corresponding, for example, to bit lines 8 and contact structures 61, 62, 63.

In a plane between the lower edge of the stack capacitors 5 and the upper edge of the insulator layers 73 of the word lines 7, 7', there are bit lines 8, which are arranged longitudinally with respect to the cell rows and offset with respect to them, above the trench isolator structures, and each include a metal-containing layer 81 and an insulator layer 82. In the cross-sectional plane illustrated, the bit line is covered and represented by dashed lines.

The two memory cells 21, 22 of the cell pair 2 are connected to the respectively associated bit line 8 via a bit contact structure 63. In the region of the bit contact terminal region or the bit contact widening 13, the bit contact structure 63 lies on the semiconductor fin 14 or the bit contact widening 13.

A trench connection, designed as a surface strip 61', electrically connects the storage electrode 41 to the trench node widening 11, which in the present exemplary embodiment forms the first source/drain region of the trench select transistor. A stack connection 62, in the style of the bit contact structure 63, in each case runs between two word lines 7, 7' from a storage electrode that can be connected to the lower edge of the stack capacitor 5 to the surface of the semiconductor fin 14 or of the stack node widening 12 of the first source/drain region of the stack select transistor.

The select transistors of trench memory cell and stack memory cell are formed symmetrically with respect to one another. In this way, stack capacitor and trench capacitor are connected to the respective select transistor.

Figure 2A:
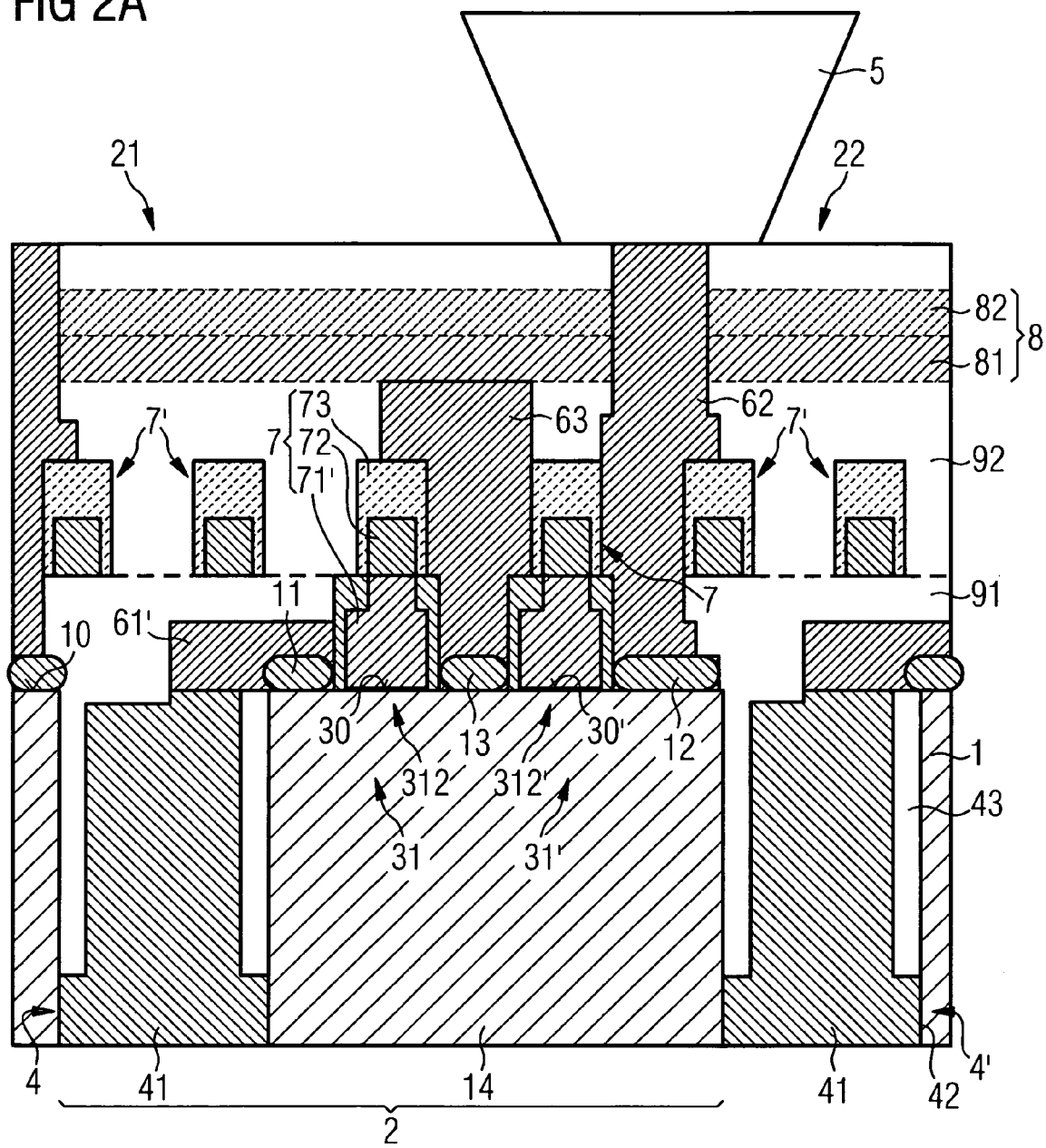
FIG. 2A illustrates a diagrammatic cross section through a cell pair having a trench memory cell and a stack memory cell, along the cell row, in accordance with one exemplary embodiment with gate conductor dots (GC dots) and planar select transistors.

In the memory cell arrangement illustrated in FIG. 2A, the select transistors are formed as planar field-effect transistors. In the case of a planar field-effect transistor, the gate electrode is arranged completely above the semiconductor substrate 1 or an upper silicon edge and lies flat on the semiconductor fin.

Figure 2B:
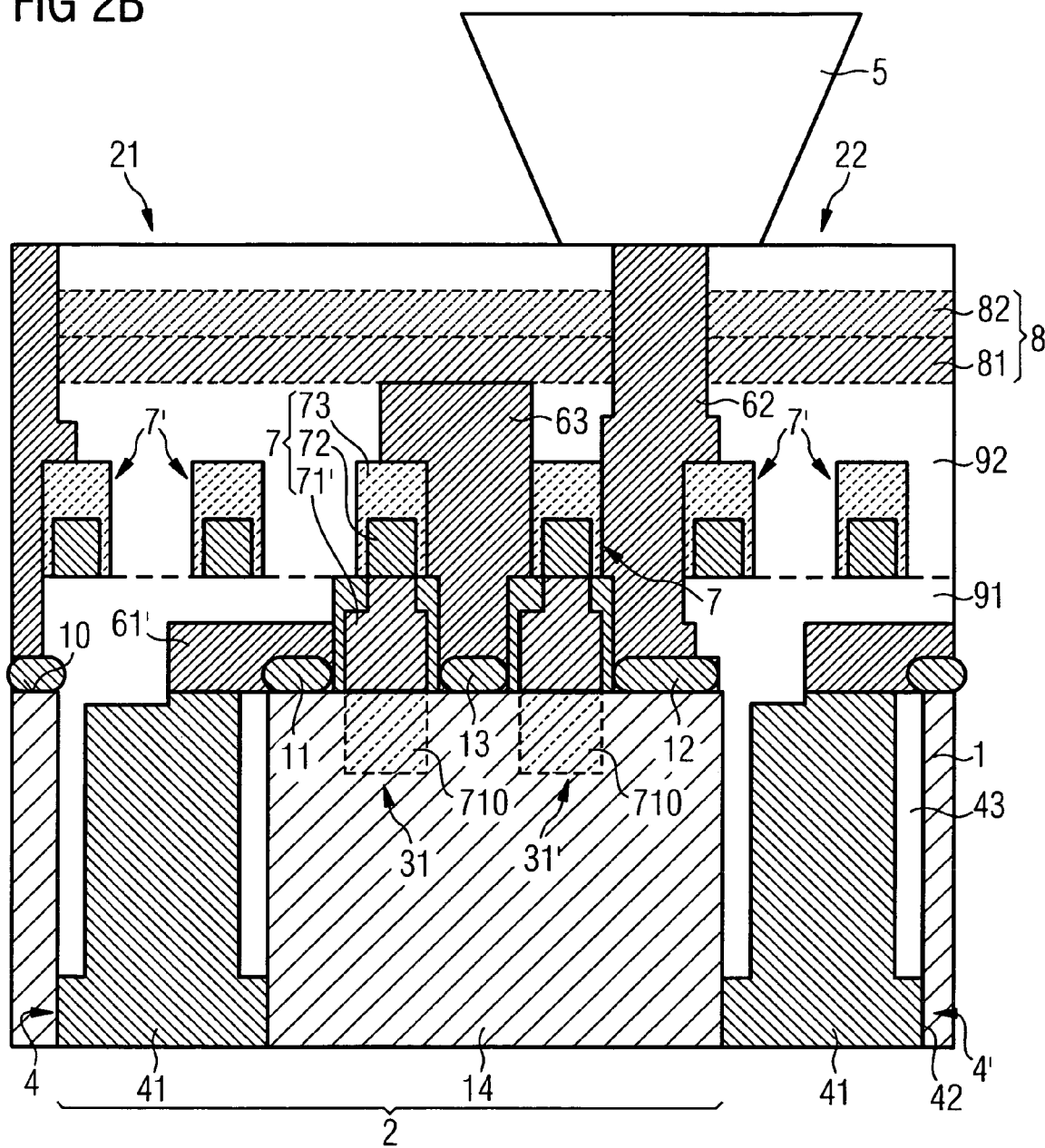
FIG. 2B illustrates a diagrammatic cross section through a cell pair having a trench memory cell and a stack memory cell, along the cell row, in accordance with a following exemplary embodiment with gate conductor dots (GC dots) and FinFets as select transistors.

In FIG. 2B, fin field-effect transistors (FinFETs) are provided as select transistors. In the case of FinFETs, the base layer 71 of the gate electrode structures or the gate conductor dots 71' each have widenings 710 on both sides of the respective semiconductor fin 14, the widenings 710 extending substantially between the two source/drain regions 311, 313 along the vertical side wall of the semiconductor fin 14.

The widenings 710 illustrated in FIG. 2B are formed in a plane that is parallel to the sectional plane illustrated and are indicated by dashed lines.

Figure 2C:
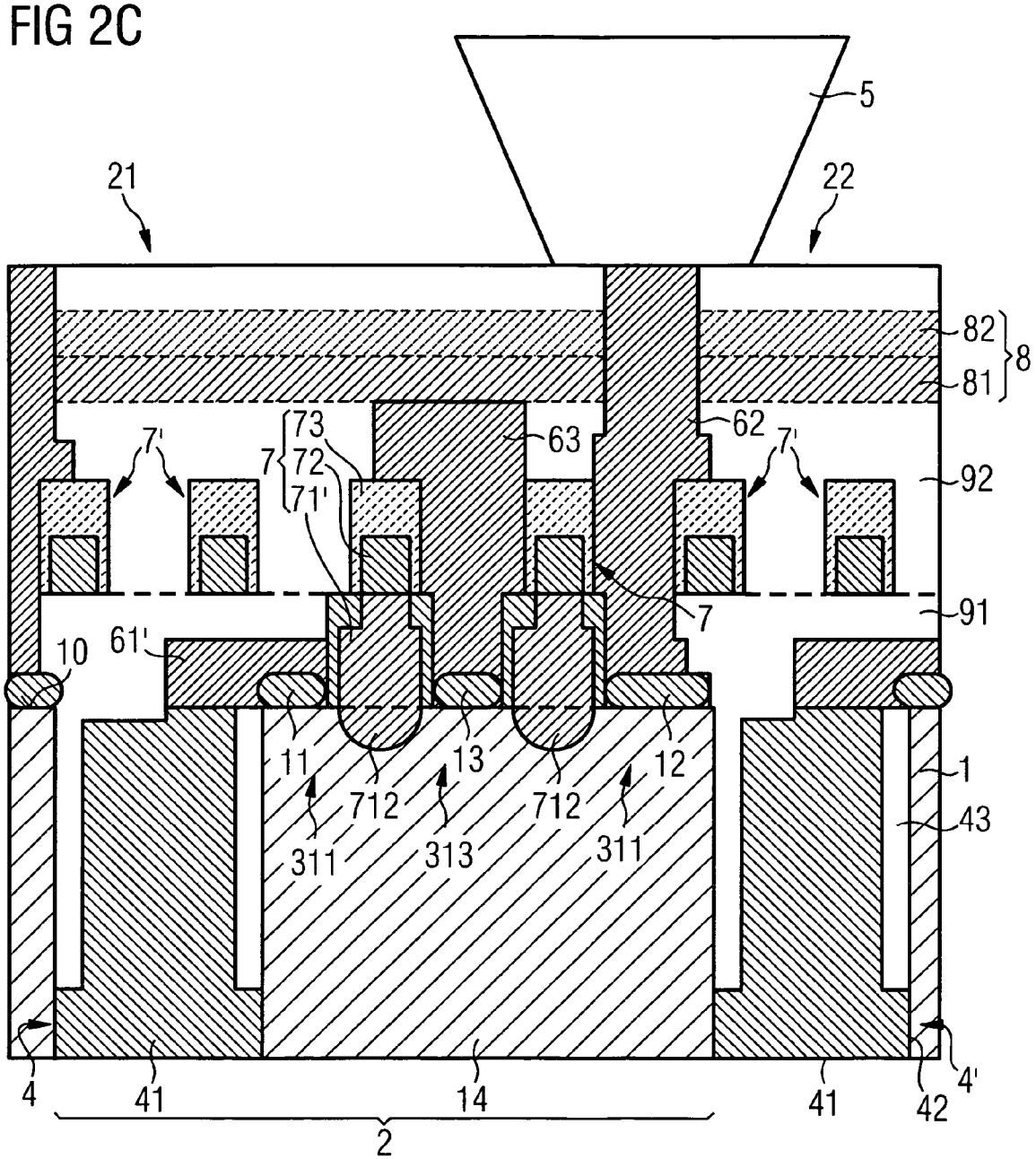
FIG. 2C illustrates a diagrammatic cross section through a cell pair having a trench memory cell and a stack memory cell, along the cell row, in accordance with a further exemplary embodiment with gate conductor dots (GC dots) and U-grooved select transistors.

In the memory cell arrangement illustrated in FIG. 2C, the select transistors are designed as U-groove field-effect transistors. The channel length of the respective select transistor is increased by a gate trench 712 introduced between the two source/drain regions 311, 313.

The gate trenches 712 are filled with the material of the base layer 71 or the material of the gate conductor dots 71'. Starting from the gate trenches 712, the gate electrode structure can continue along the vertical side walls of the semiconductor fin 14.

In a further embodiment (not shown), the FinFETs, in accordance with FIG. 2B, are each provided with a gate trench 712 filled with an insulator material.

Figure 3:
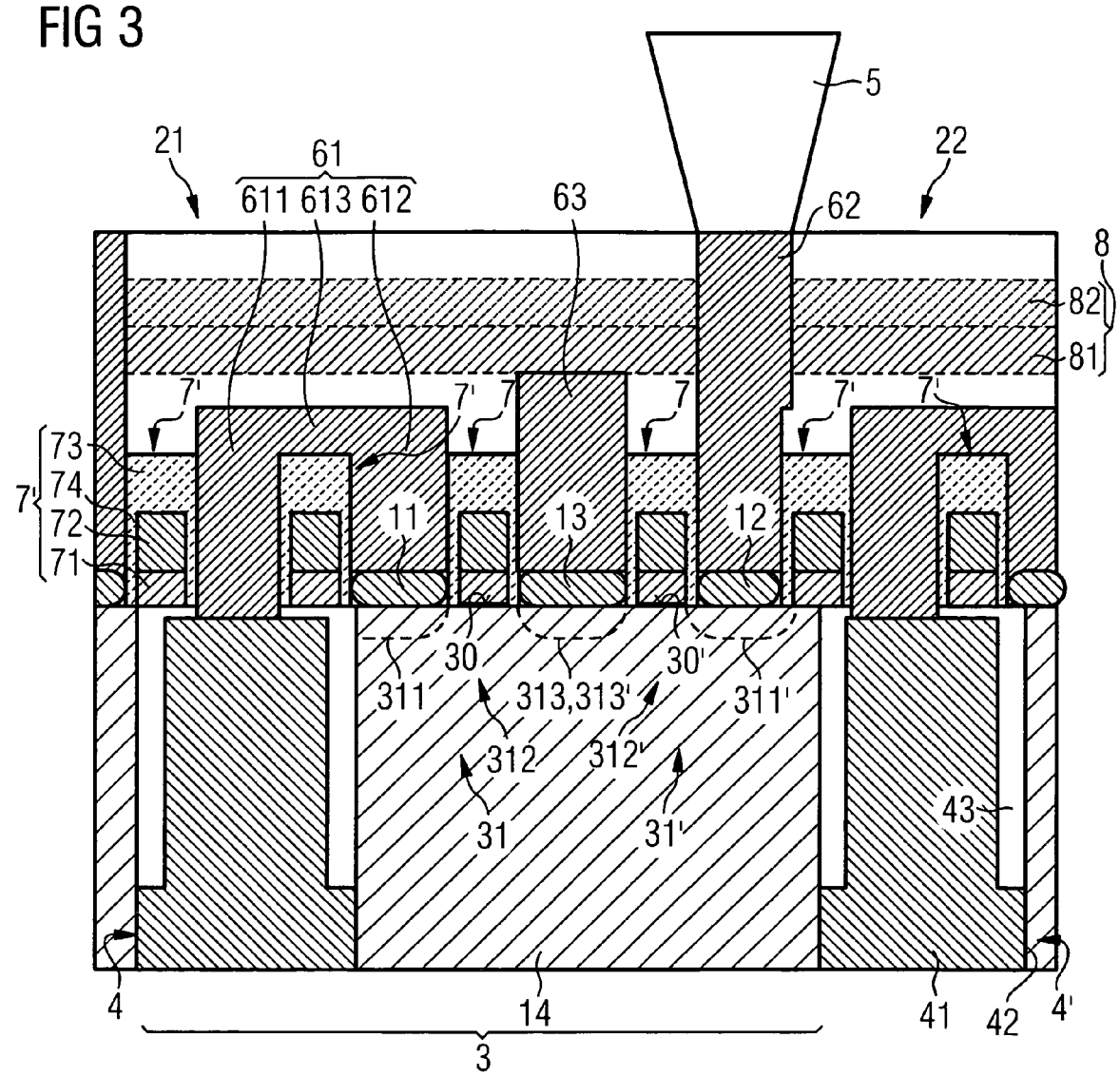
FIG. 3 illustrates a diagrammatic cross section through a cell pair having a trench memory cell and a stack memory cell, along the cell row, in accordance with an exemplary embodiment with word lines which are continuous in all their layers.

The exemplary embodiment, which is illustrated in FIG. 3, differs from the exemplary embodiment, which is illustrated in FIG. 2, by virtue of the word lines 7, 7', which are in the form of continuous strips in all the layers 71, 72, 73. Whereas in the previous exemplary embodiment it is possible for the storage electrodes 41 of the trench capacitors 4 to be directly connected via a short route beneath the crossing word line 7' to the respective trench node section or the trench node widening of the respective trench select transistor, this route is blocked in the exemplary embodiment illustrated in FIG. 3 by the continuous passive word line 7' resting on top.

Accordingly, the first connection structure 61 includes a trench section 611, which runs to the storage electrode 41 of the trench capacitor 4, and a node section 612, which runs to the trench node section, the trench section 611 and the node section 612 being connected via a strip section 613 which lies on the word line 7' located between them. The trench sections 611 and the node sections 612 are formed in the same way as the corresponding sections of the stack connection 62 or the bit contact structure 63.

The dashed lines in the region of the semiconductor fins 14 illustrate an alternative formation of the source/drain regions to the extended sections 11, 12, 13, namely as doped sections within the original semiconductor substrate 14. The active area 31 of the trench select transistor of the trench memory cell 21 then includes a first source/drain region or a node junction 311, a second source/drain region 313, and a channel region 312, which separates the two source/drain regions 311, 313 from one another. Accordingly, the active area 31' of the stack select transistor assigned to the stack memory cell 22 has a first source/drain region 311' a second source/drain region 313 and a channel region 312' which separates the two source/drain regions 311', 313' from one another. The two second source/drain regions 313, 313' form a common, cohesive bit contact terminal region 32.

The planar references of the substructures of a DRAM memory cell arrangement in accordance with the exemplary embodiment illustrated in FIG. 2 with respect to one another are illustrated on the basis of the drawings illustrated in FIG. 4. In this context, FIG. 4 relates first of all to a sequence of photolithographic masks for forming a DRAM memory cell array. The reference symbols refer firstly to mask structures and secondly to structures formed from the use of the mask in question. The figures are each based on a grid. The spacing between the grid lines of the grid corresponds to the minimum feature size F which can be produced using the respective lithography technique.

Figure 4A:
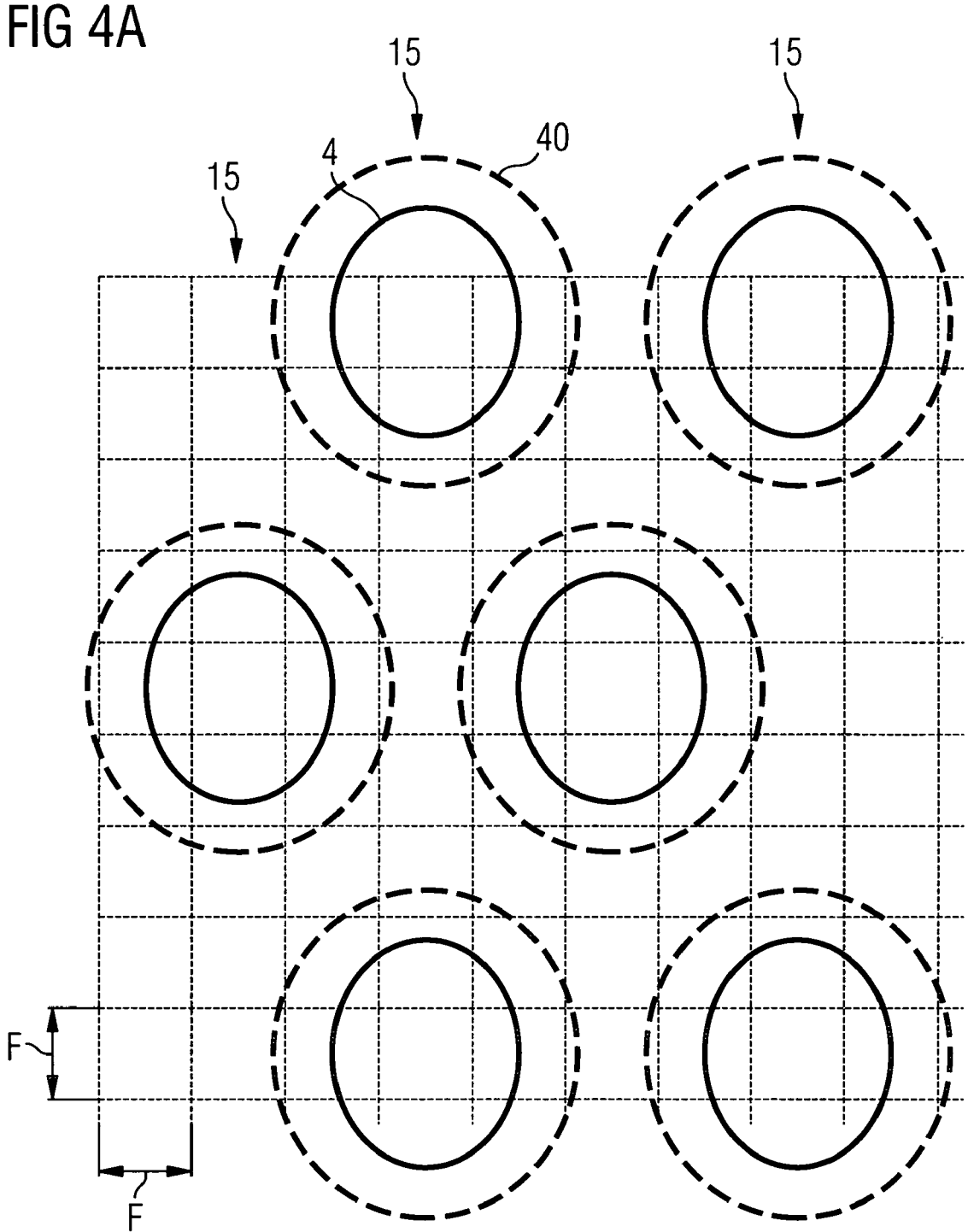

In accordance with the exemplary embodiment of the method according to one embodiment of the invention illustrated in FIG. 4A, first of all hole trenches or trench capacitors 4 are introduced into a semiconductor substrate by means of a perforated mask. The outline of the opening of a trench capacitor 4 at the substrate surface or in a section of the semiconductor substrate 1 close to the surface is defined by the solid line 4. The hole trenches or trench capacitors 4 are widened in a bottle shape in a lower section of the semiconductor substrate below the select transistors that are to be formed in the section close to the surface. The external contour of the bottle-shaped widening 40 is represented by dashed lines.

The openings of the trench capacitors 4 are ovals within a rectangle of 2 F×2.5 F. The trench capacitors 4 are arranged at a distance of in each case 8 F from cell rows 15. Two adjacent cell rows 15 are offset by 4 F with respect to one another in the longitudinal direction of the orientation of the cell rows 15.

Figure 4B:
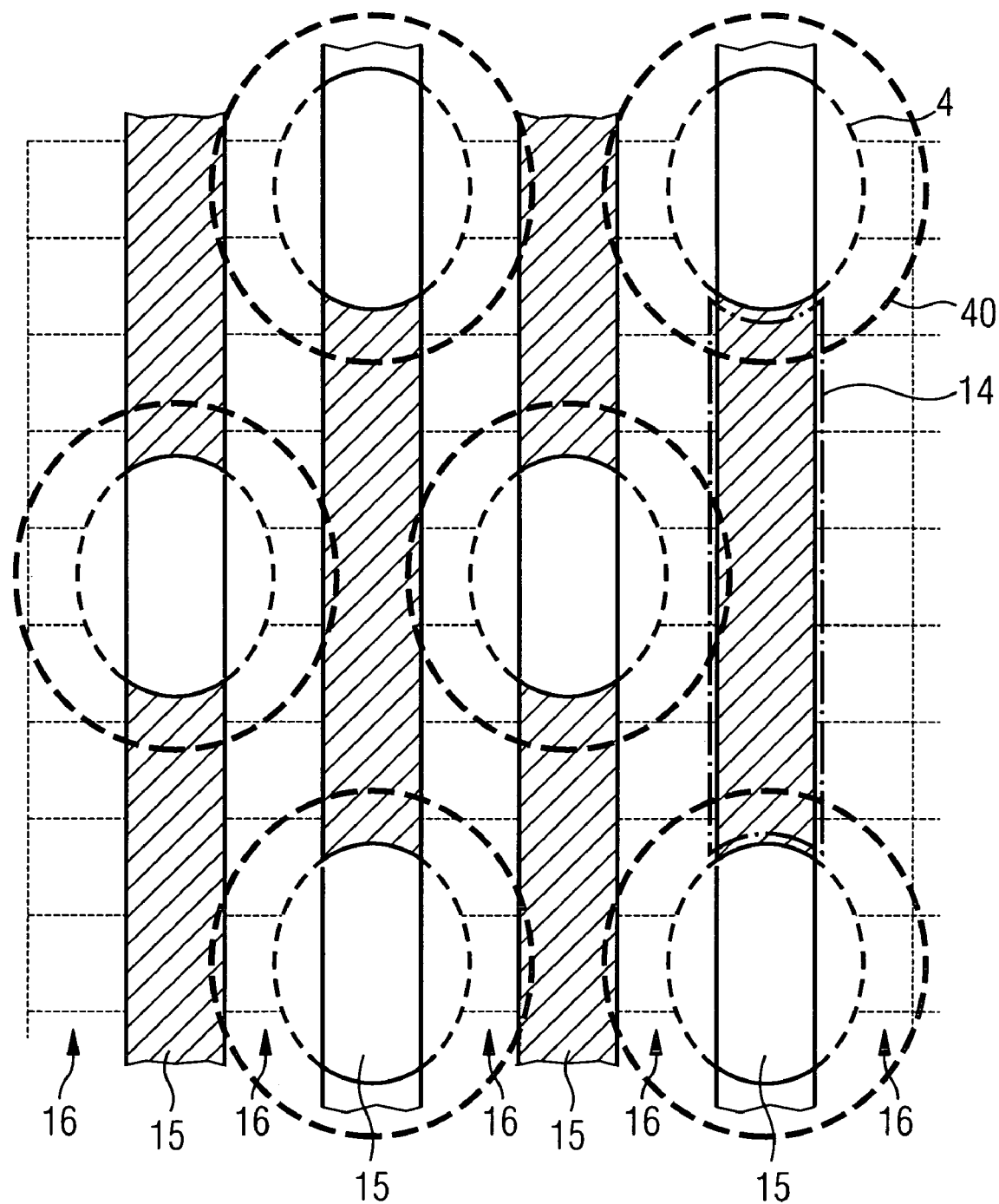

To form semiconductor fins, in accordance with FIG. 4B, the cell rows 15 are covered by a row mask formed as a strip mask. The semiconductor substrate 1 and trench top insulators which cover the openings of the trench capacitors 4 are caused to recede outside the cell rows 15, and the trenches which are formed are filled with trench isolator structures 16.

The row mask for patterning the semiconductor fins 14 and the trench isolator structures 16 is a strip mask, as indicated by the dashed lines in FIG. 4B. The patterning effected through the strip mask affects at least the regions outside the openings of the trench capacitors 4. In one case, the patterning step, in accordance with the illustration presented in FIG. 4B, also acts on trench top insulators that cover the openings of the trench capacitors.

In the following figures, to simplify illustration, only the semiconductor fins 14 which result from the strip mask are illustrated.

In accordance with FIG. 4B, semiconductor fins 14 are formed between in each case two trench capacitors 4, or the openings thereof, arranged in the same cell row 15. The semiconductor fins 14 are in each case insulated from one another by the trench capacitors 4 within the cell rows 15. The semiconductor fins 14 are insulated with respect to the trench capacitors 4 or semiconductor fins 14 in the adjacent cell rows by the trench isolator structures 16.

The openings of the trench capacitors 4 are generally covered by a trench top insulator comprising a material which is comparable in terms of the etching properties to the material of the trench isolator structures 16, in one case with the same material.

The method described in FIGS. 4 and 5 relates to an embodiment with gate conductor dots (GC dots) as the base layer of word lines. Gate conductor dots are provided by a polysilicon layer and a hard mask layer, for example of silicon nitride, being applied in succession and then patterned using a GC dot mask formed as a segmented strip mask in accordance with FIG. 4C using a hard mask process. After the polysilicon layer has been patterned, what remains of this layer is two gate conductor dots 71' per semiconductor fin 14, which GC dots in each case cover precisely one cell row 15 in the region of the respective semiconductor fin 14, in each case from one trench isolator structure 16 to the opposite one.

Figure 4C:
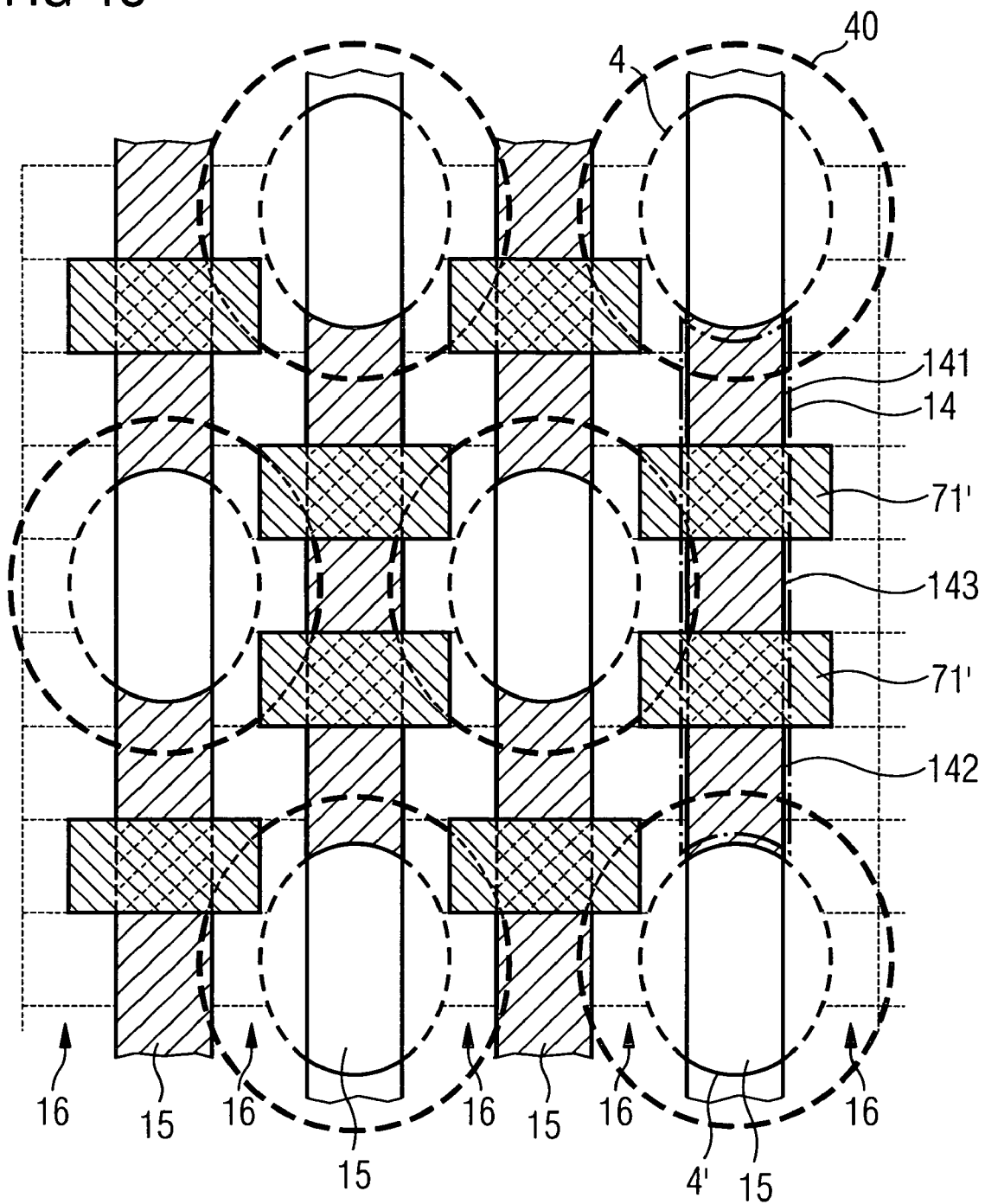

A section of the row mask in the region of a semiconductor fin 14 is surrounded by dot-dashed lines in the right-hand part of FIG. 4C. A bit contact section 143 of the semiconductor fin 14 is uncovered between the two gate conductor dots 71', which form the gate electrodes of the cell pair assigned to the semiconductor fin 14. A trench node section 141 is defined between the gate conductor dot 71' and the trench capacitor 4 associated with the semiconductor fin 14, and a stack node section 142 of the same semiconductor fin 14 is defined between the second gate conductor dot 71' and the trench capacitor 4' associated with the adjacent cell pair. A first partial filling of a dielectric gate filling is provided between the gate conductor dots 71'.

To connect the trench capacitor 4 to the semiconductor fin 14 in the region of the trench node section 141, the dielectric filling above the trench capacitors and above the respectively adjacent trench node sections is removed by means of a strap mask. The strap mask is a segmented strip mask with openings 60', the position of which relative to the cell array can be seen in FIG. 4D. Together with the masked sections of the dielectric filling, trench top insulators 44, which lie on the storage electrodes of the trench capacitors 4, are also opened up.

A conductive material is applied, filling in each case a lower section of the openings that have been introduced into the dielectric filling and in each case forming a surface strip.

The surface strips are formed in accordance with the openings 60' in the strap mask, lie on the storage electrode of the respective trench capacitor 4 and in the trench node section 141 of the semiconductor fin 14 and are covered by dielectric coverings.

Subsequently, the individual gate conductor dots 71' are connected to one another by means of in each case one connecting layer to form word lines 7, 7' running orthogonally with respect to the cell rows 15.

For this purpose, in this exemplary embodiment a metal layer is applied and photolithographically patterned by means of a word line mask designed as a strip mask.

In another exemplary embodiment (not shown), the word lines are provided using Damascene technology, in which case first of all an insulator layer is applied, auxiliary trenches are introduced into the insulator layer through an inverse strip mask, and then these auxiliary trenches are filled with the material of the word lines.

Figure 4D:
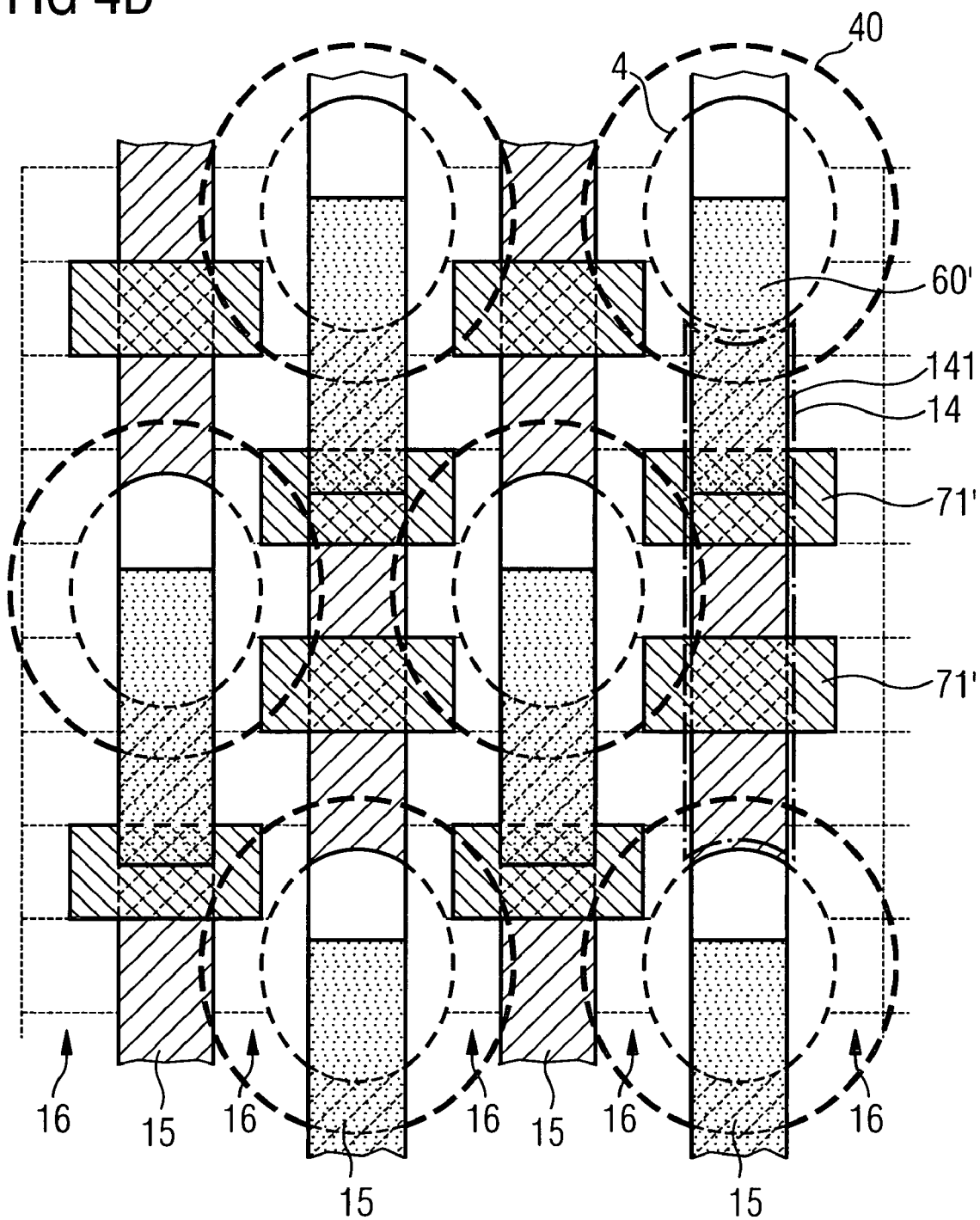
Figure 4E:
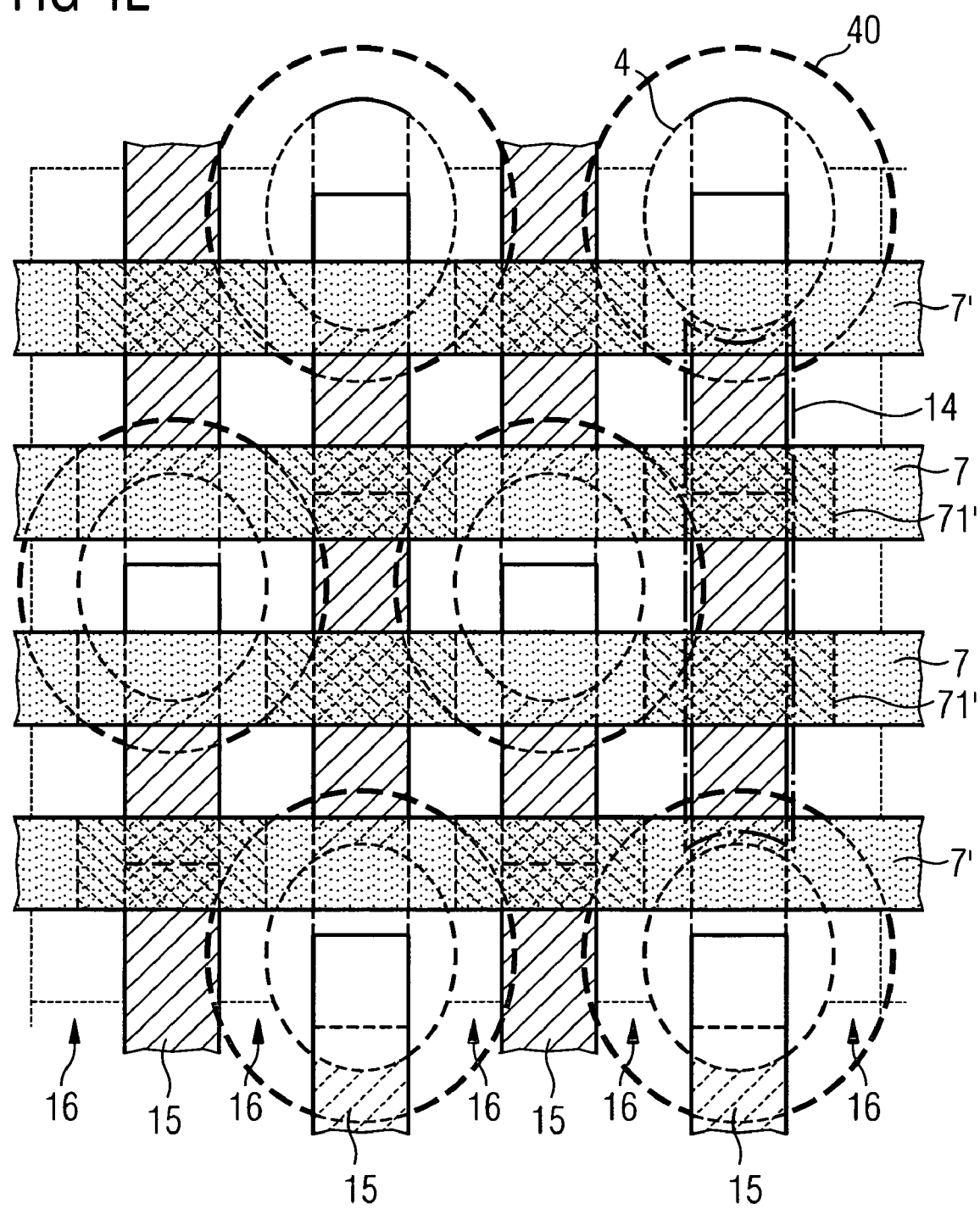

FIG. 4E illustrates the resulting word lines 7, 7'. The word lines 7, 7' each have active sections and passive sections. In the active sections, the respective word line 7, 7' bridges those semiconductor fins 14 having the active areas of the select transistors that can be addressed by the respective word lines 7,7'.

In this exemplary embodiment, the active sections correspond to the gate conductor dots 71'. Cell rows 15 with select transistors that cannot be addressed by the respective word line 7, 7' are in each case bridged by passive sections of the corresponding word line, which are insulated and capacitively decoupled with respect to the structures formed in the respective cell row 15. An insulator material is provided between the word lines.

For contact-connection of the stack node section 142 and of the bit contact section 143 of the semiconductor fin 14, the insulator material is removed between the word lines 7, 7' above the respective semiconductor fin 14 by means of a CA mask.

Figure 4F:
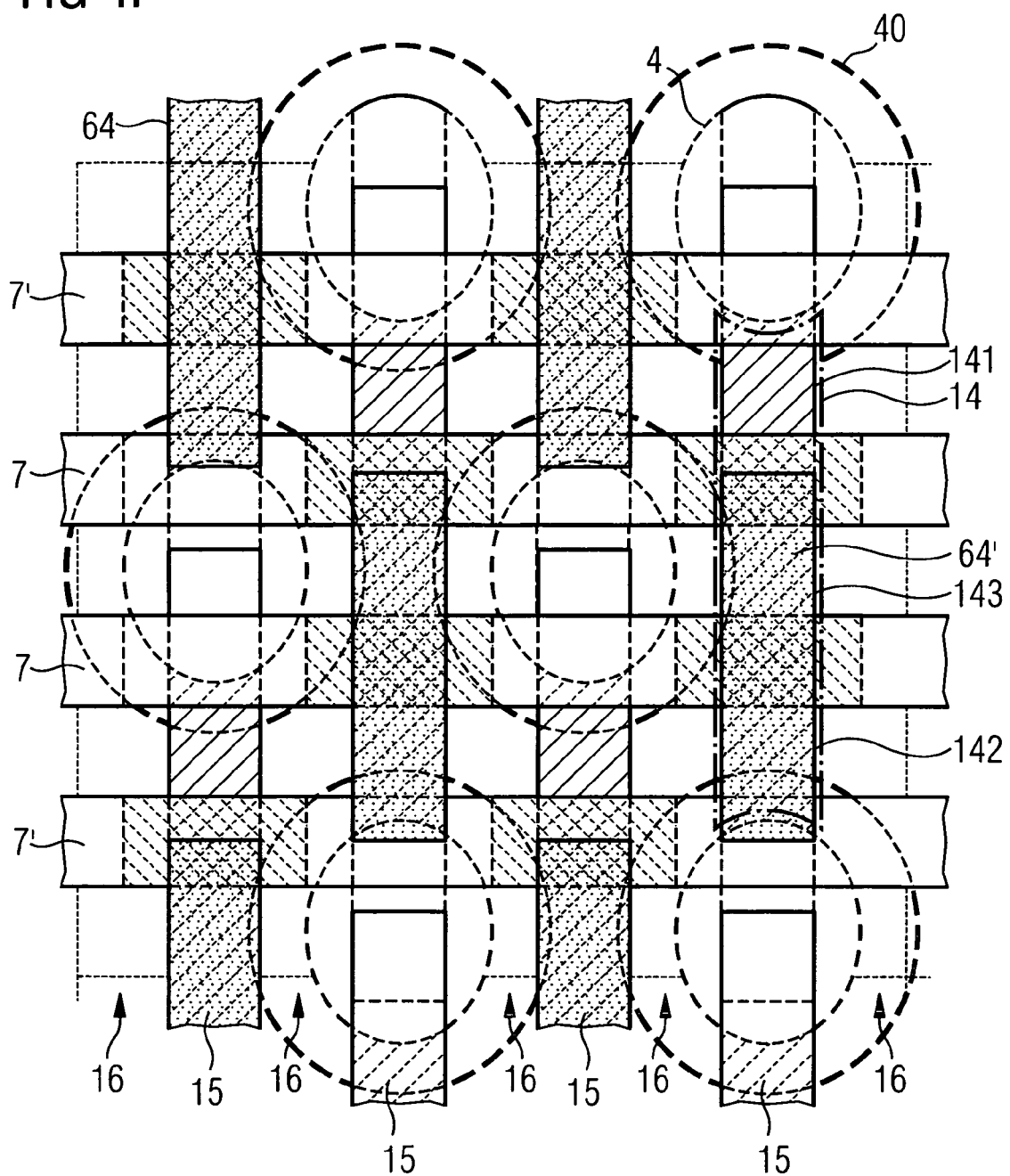

The CA mask used in this case may be a segmented strip mask, the openings 64' in which are illustrated in FIG. 4F. The openings 64' in the CA mask in each case extend over the stack node section 142, the bit contact section 143, the word line 7 between them and over sections of the adjacent word lines 7, 7'. The patterning controlled by the CA mask takes place selectively with respect to the word lines 7 and acts only on the insulator material provided between the word lines 7, 7' above the semiconductor fins 14.

Contact structures are introduced into the contact openings formed by the preceding etching step above the stack node sections 142 and the bit contact sections 143, and the DRAM memory cell array is covered by a further insulator layer. In the region of the bit contact sections 143, the further insulator layer is opened by means of a bit contact mask 63'.

Figure 4G:
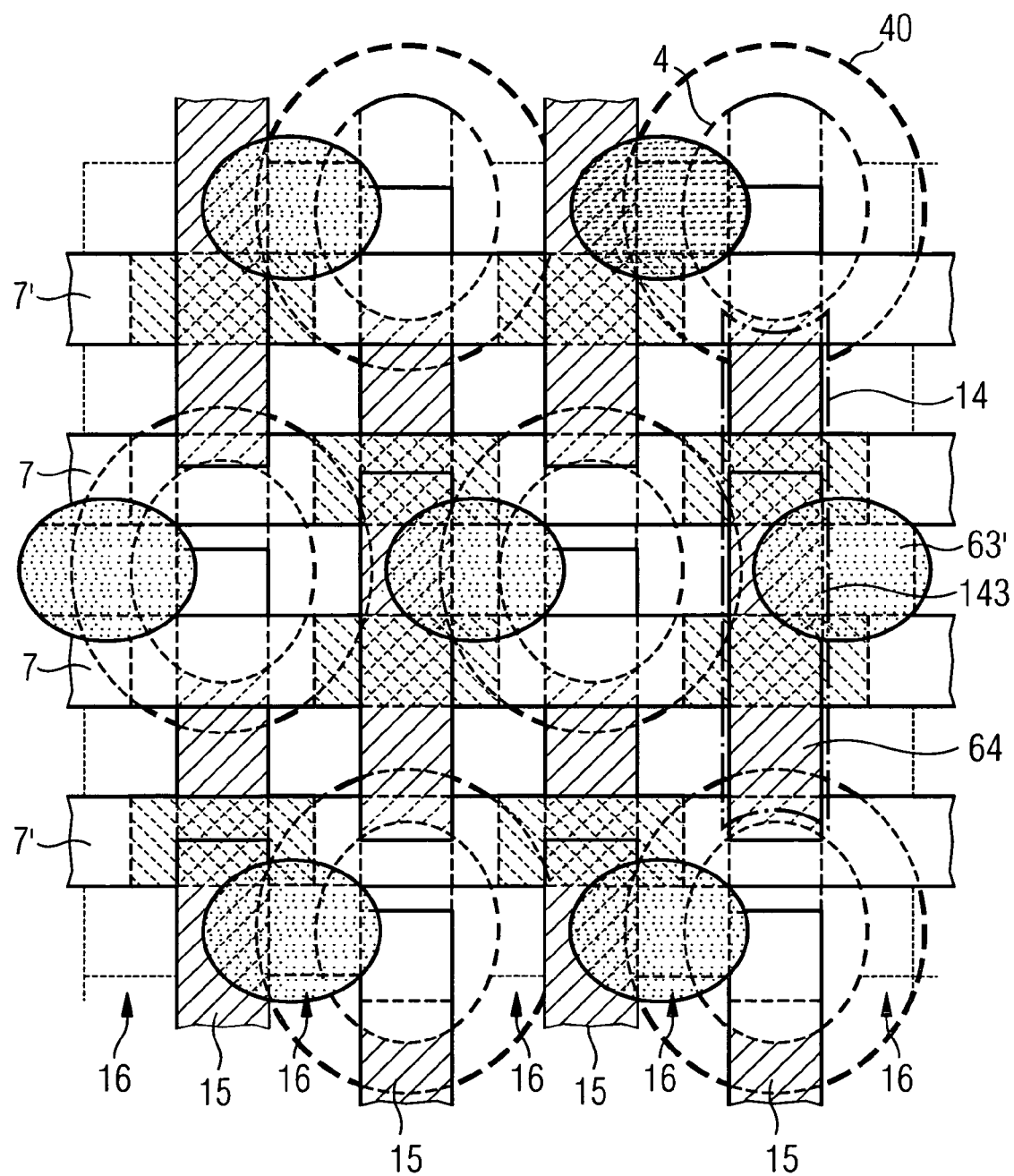

The bit contact mask is a perforated mask with openings 63', the arrangement of which relative to the semiconductor fins 14 can be seen in FIG. 4G. The openings 63' are in each case provided above the bit contact sections 143 and are offset by 0.5 F with respect to the longitudinal axis of the cell rows 15.

The insulator material provided above the word lines is caused to recede in the region of the openings 63' in the bit contact mask. Second sections (CB sections) of bit contact structures, which adjoin the first sections (CA sections), passing between the word lines 7, 7' from below and resting on the semiconductor fin 14, of the respective bit contact structure, are introduced into the openings created.

Figure 4H:
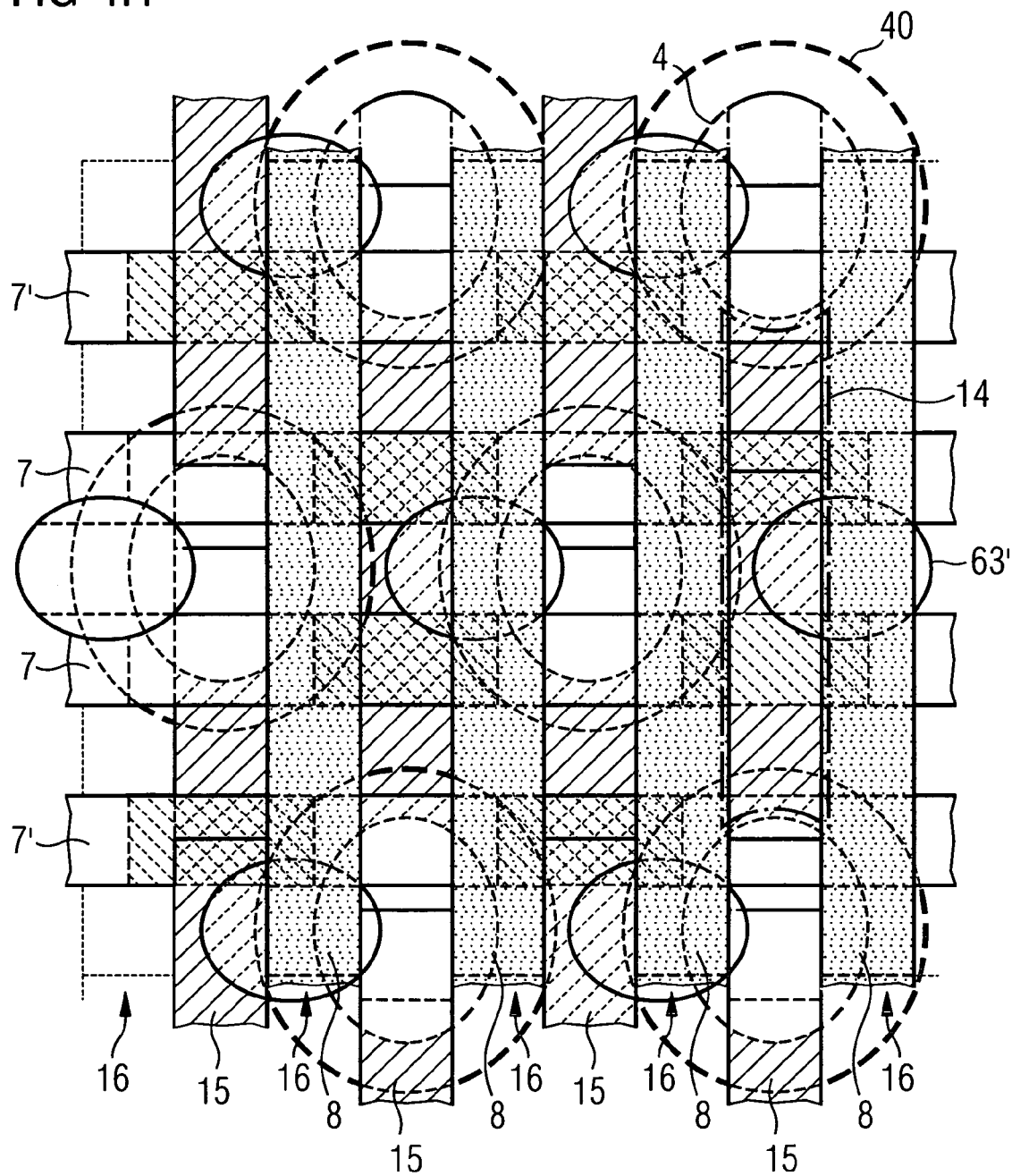

Bit lines 8, which run parallel to the cell row, are offset by 1 F with respect to the cell rows and in accordance with the illustration presented in FIG. 4H lie on the second sections of the bit contact structures 63, are formed with the aid of a bit line mask formed as a strip mask. A further layer of an insulator material is provided, with the spaces between the bit lines 8 being filled and the bit lines 8 being covered by the insulator material.

The insulator material above the stack node sections 142 or the CA sections of the stack connections 62 is removed by means of a stack contact mask formed as a perforated mask with openings 66'.

Figure 4I:
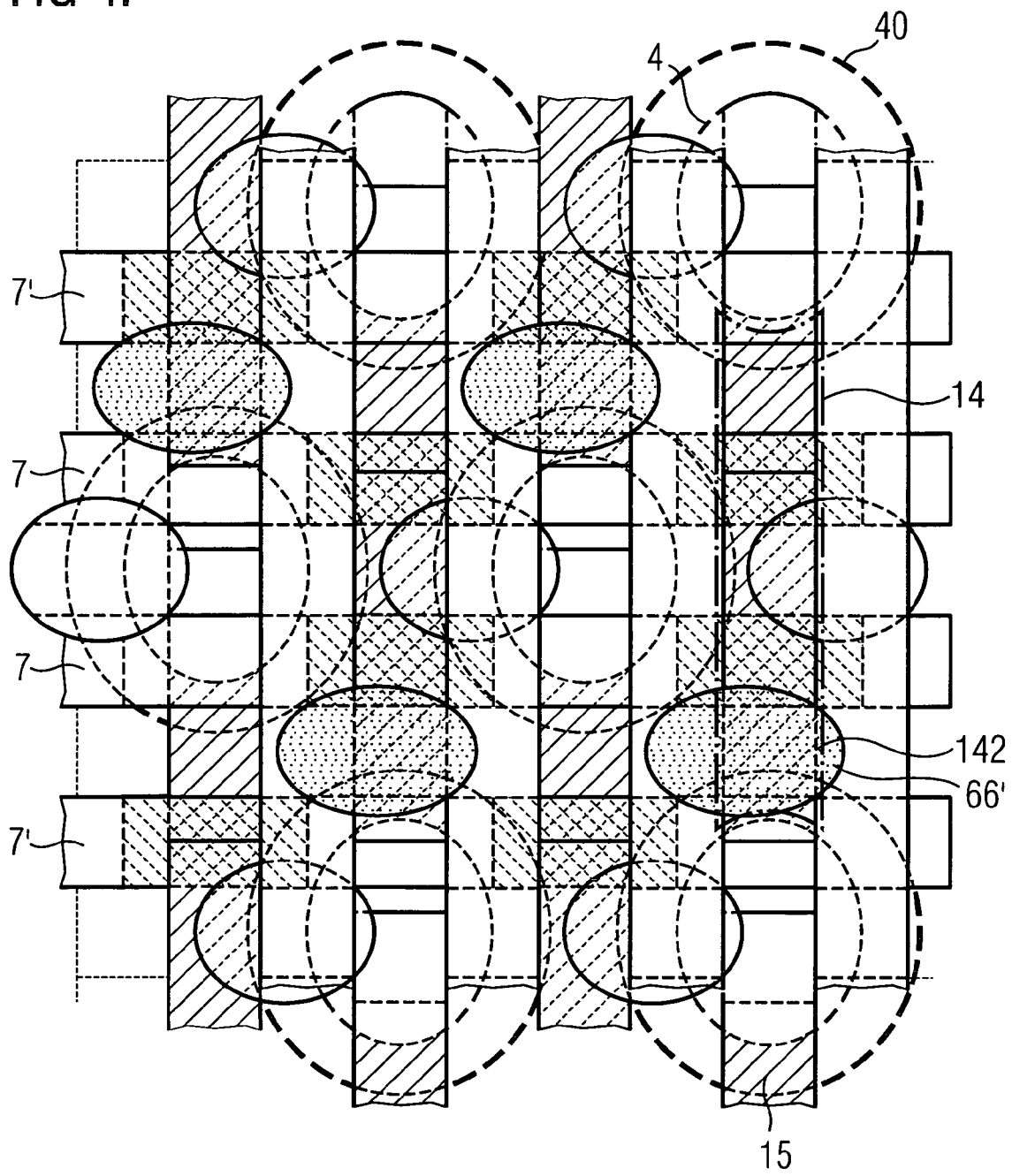

The arrangement of the openings 66' in the stack contact mask relative to the bit lines 8 and the word lines 7 can be seen in FIG. 4I. The insulator material filling the structures above the stack node sections 142 of the semiconductor fin 14 is removed between two bit lines 8, which in each case run offset with respect to the cell row 15, and two adjacent word lines 7, 7'.

Second sections (CC sections) of the stack connections 62 between the first sections of the stack connections 62 and the respective stack capacitor 5 provided above the bit lines 8 are formed in the contact openings produced.

The resulting structure is covered by a further layer of an insulator material. Stack trenches for stack capacitors are formed, aligned with respect to the stack connections 62, in the insulator material with the aid of a stack capacitor mask, which is provided as a perforated mask having openings 67'.

The position of the openings 67' of the stack capacitor mask can be seen from FIG. 4J. A storage electrode of the stack capacitors, which is connected to the respectively associated stack connection 62, can be provided at the inner walls of the stack trenches formed from the openings 67'.

In the text which follows, the method which has been outlined in FIG. 4 on the basis of the lithographic masks required for the method, is explained further by means of the cross sections illustrated in the drawings presented in FIG. 5.

First of all, a protective layer 17 of silicon nitride is applied to a substrate surface 10 of a semiconductor substrate 1 in a way which is customary for memory cell arrays using pure trench technology. The protective layer 17 (pad nitride) may have further layers, for example a stress relief layer, such as a thermal silicon nitride or silicon oxide (pad oxide), beneath it. Perforated masks are introduced into the semiconductor substrate 1 through the protective layer 17, and trench capacitors 4, 4' are formed in the usual way along the hole trenches. In a lower section of the semiconductor substrate 1 (not shown), in each case an outer electrode, formed as a doped region in the semiconductor substrate 1, surrounds the respective hole trench and is insulated from the storage electrode 41, provided as filling of the respective hole trench, by a capacitor dielectric 42. In an upper section of the semiconductor substrate between the substrate surface 10 and the lower section, the filling 41 of the respective hole trench is insulated from the surrounding semiconductor substrate 1 by a collar insulator 43.

After the collar insulator 43 has been formed, the upper section of the respective hole trench is filled with the material of the storage electrode, for example with doped polysilicon. The storage electrode or filling 41 is drawn back to below the substrate surface 10. Above the storage electrode 41 which has been caused to recede, the hole trenches are closed off by a trench top insulator 44.

Strip-like semiconductor fins, in which the active areas of the select transistors are formed, are formed between in each case two trench capacitors 4, 4' which are adjacent in the same cell row. The semiconductor material uncovered by the etching is superficially oxidized. An insulator material, for example silicon oxide, is applied, filling the trenches introduced into the semiconductor substrate 1 by means of the strip mask. Insulator material deposited above the protective layer 17 is removed in a planarization step.

Figure 5A:
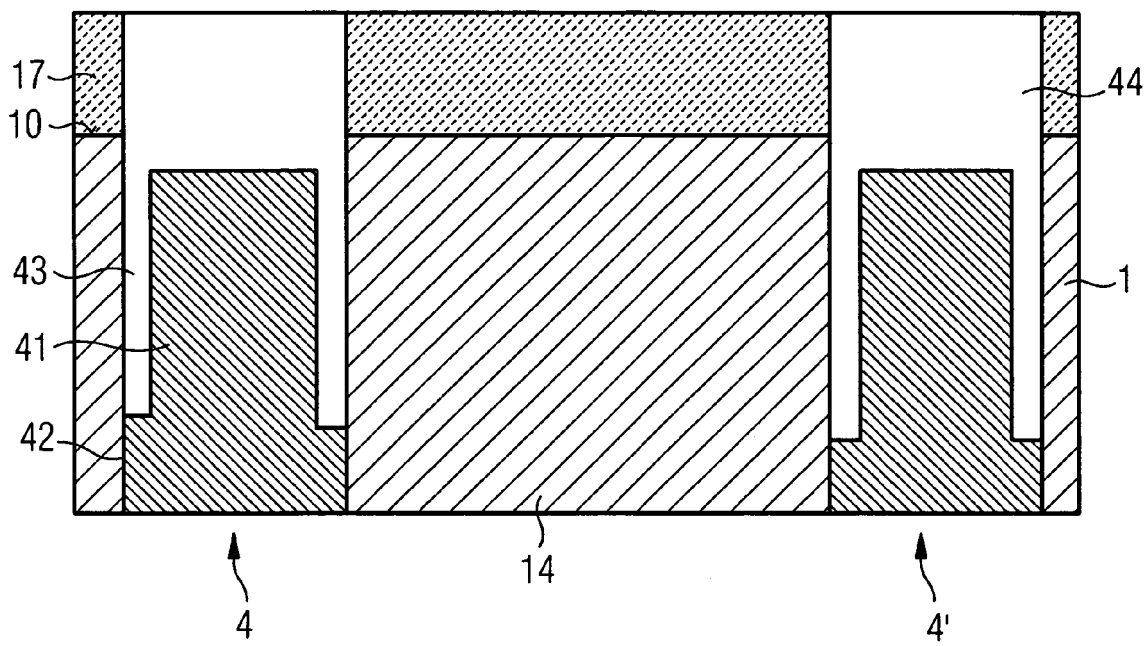
FIGS. 5A to 5G illustrate the method according to one embodiment of the invention in accordance with FIG. 4 on the basis of longitudinal sections through a cell pair in various process phases.

In accordance with the cross section illustrated in FIG. 5A along an excerpt from a cell row, a semiconductor fin 14 formed from the semiconductor substrate 1, within the cell row, is delimited by two adjacent trench capacitors 4, 4'. The storage electrodes 41 of the trench capacitors 4 are caused to recede down to below the substrate surface 10 and are in each case covered by the trench top insulator 44. The semiconductor fins 14 are covered by in each case a section of a protective layer 17 lying on the substrate surface 10. Trench isolator structures 16, which run parallel to the cross-sectional plane and cannot be seen in the cross section illustrated, insulate cell rows running parallel and offset with respect to one another in the longitudinal direction from one another.

The protective layer 17 and any further layers beneath the protective layer 17 are removed. Uncovered sections of the semiconductor substrate 1 at the substrate surface 10 are surface-oxidized. The resulting sacrificial oxide protects the semiconductor substrate 1 during subsequent implantation steps for the at least partial formation of doped regions in the semiconductor fins 14. The sacrificial oxide layer is removed and a gate dielectric layer 33, for example of silicon oxide, is applied to or produced on the uncovered substrate surface 10 in the region of the semiconductor fins 14. Then, polysilicon is deposited and covered with an auxiliary oxide layer 75.

Figure 5B:
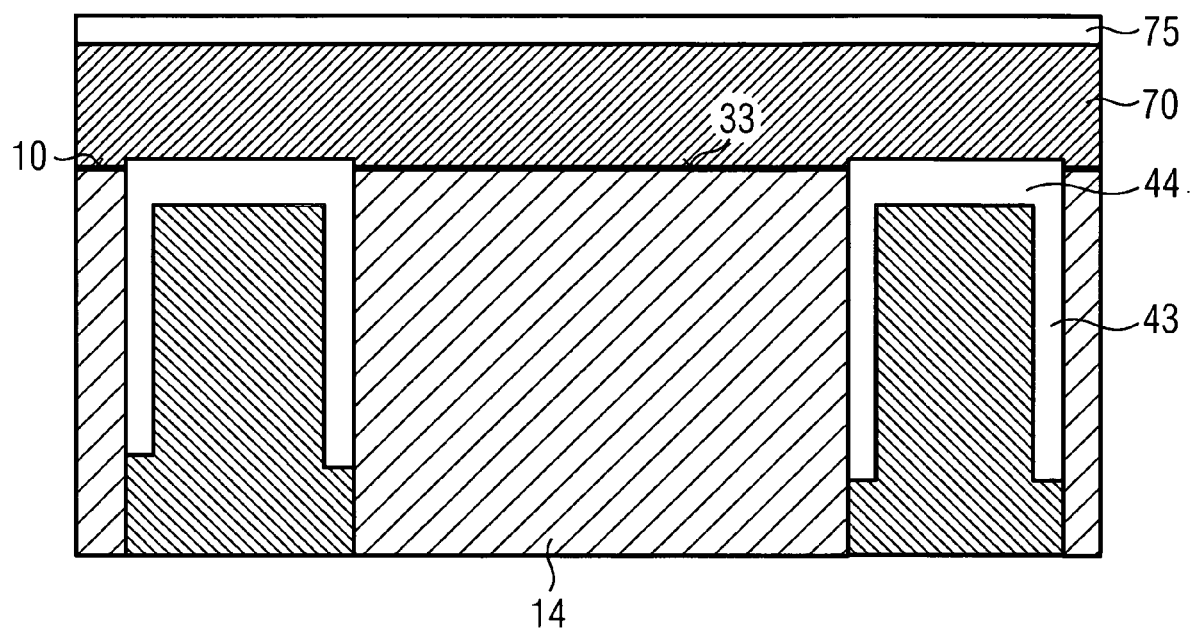

In the exemplary embodiment illustrated, in accordance with FIG. 5B the trench top insulator 44, at least in sections, has been caused to recede in combination with the removal of the protective layer 17.

Accordingly, the deposited polysilicon forms a continuous polysilicon layer 70 which is covered by an auxiliary oxide layer 75. The storage electrodes 41 remain covered by sections of the trench top insulator 44 which has been caused to recede.

The polysilicon layer 71' is patterned by means of the segmented strip mask as illustrated in FIG. 4C. Vertical side walls of the gate conductor dots 71' which result from the polysilicon layer 71' are oxidized, forming side wall oxide structures, which are not illustrated in the figures. Spacer insulator structures 74' are provided at the vertical side walls of the gate conductor dots 71'.

In this exemplary embodiment, the oxide which has been grown on the semiconductor fins 14 outside the gate conductor dots 71' as part of the side wall oxidation is removed and selective epitaxial growth of monocrystalline silicon on the uncovered sections of the semiconductor fins 14 is controlled.

After widening sections 11, 12, 13 of the semiconductor substrate 1 have been grown, the structure is covered by a thin MOL liner, for example of silicon nitride. A dielectric material, for example a BPSG oxide, is applied, filling the structures as far as the top edge of the gate conductor dots 71' as a first partial filling 911 of a dielectric gate filling 91. Excess dielectric material is removed down to the top edge of the gate conductor dots 71', with the structure being planarized.

Figure 5C:
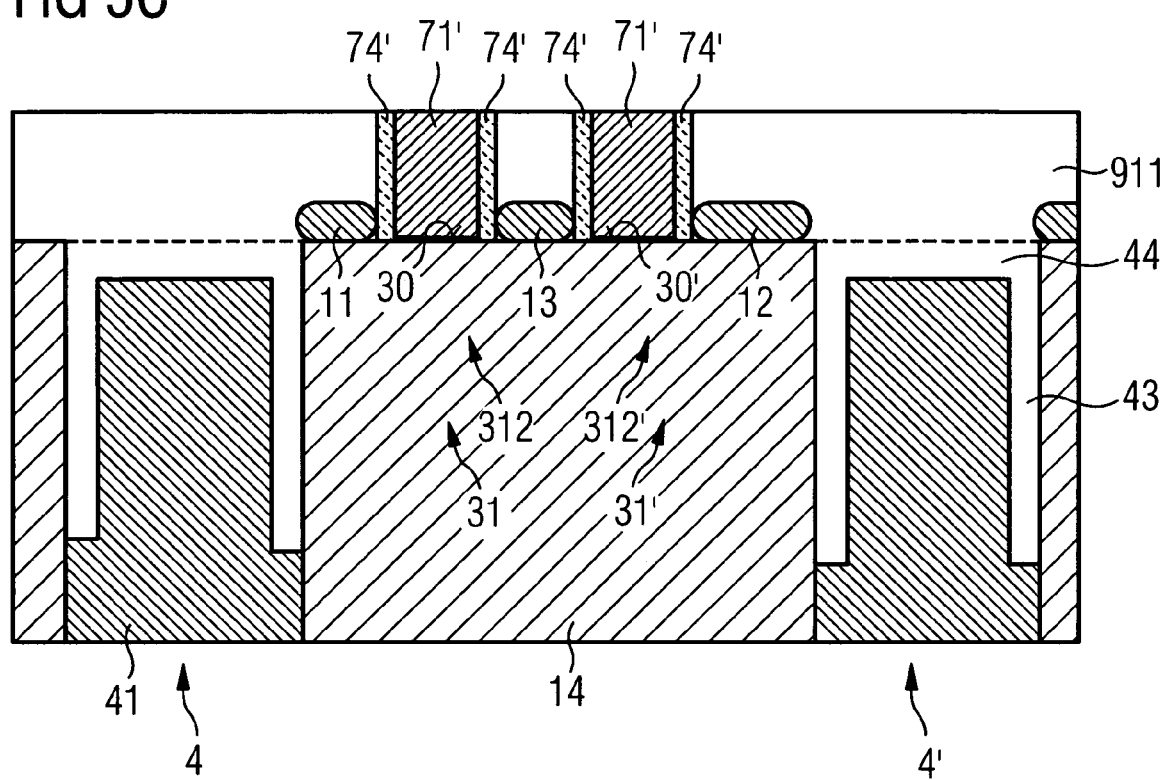

In accordance with FIG. 5C, in each case two gate conductor dots 71' (GC dots) lie on the semiconductor fins 14. Outside the gate conductor dots 71', the semiconductor fins 14 in each case have widening sections 11, 12, 13. The widening sections 11, 12, 13 consist of doped semiconductor material, for example monocrystalline silicon, and at least in sections form the source/drain regions of the active areas 31, 31' of two select transistors. The widening section between the two gate conductor dots 71' forms a bit contact widening 13. An widening section which faces the trench capacitor 4 assigned to the respective semiconductor fin 14 forms a trench node widening, and a widening section facing the trench capacitor 4' of the adjacent cell pair forms a stack node widening 12. The channel regions 312, 312' of the two active areas 31, 31' are formed below the gate conductor dots 71' in the region of the original semiconductor fin 14.

In accordance with the segmented strip mask illustrated in FIG. 4D, the partial filling 911 and the trench top insulator 44 are removed in sections above the openings of the trench capacitors 4, 4' and the respectively adjacent trench node widenings 11.

The node junction widenings 11 are in this case protected by the MOL liner.

Figure 5D:
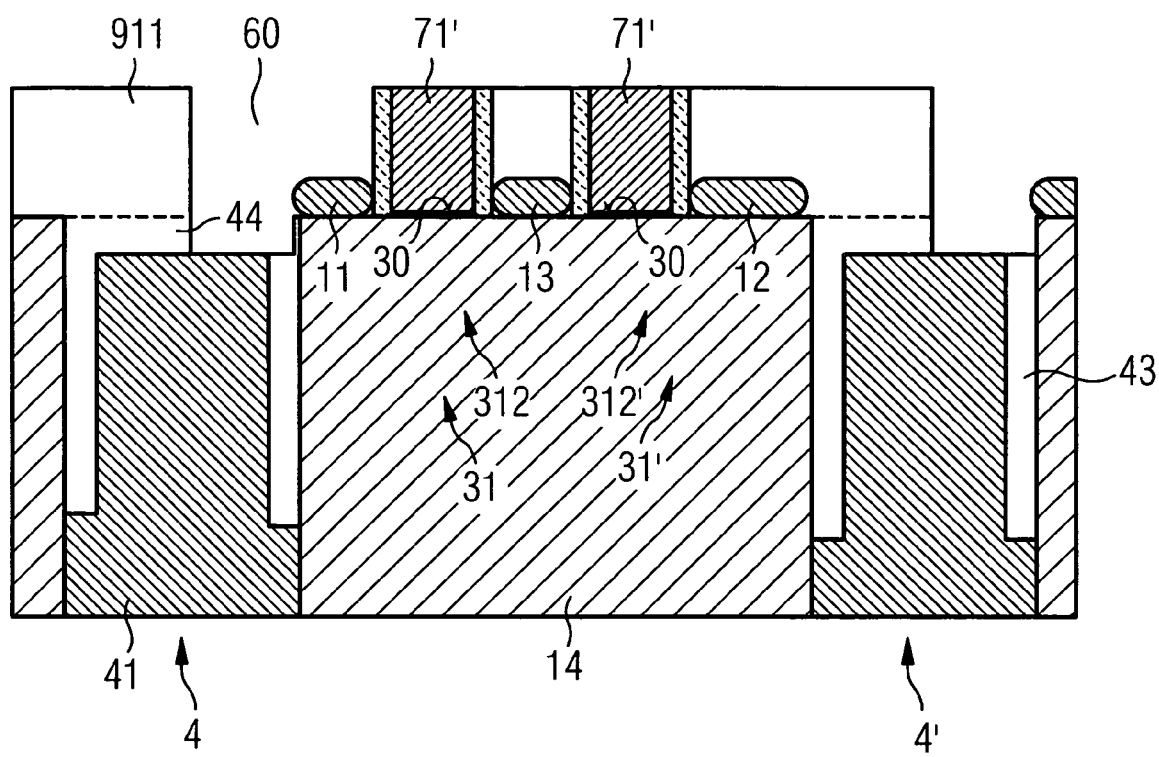
Figure 5E:
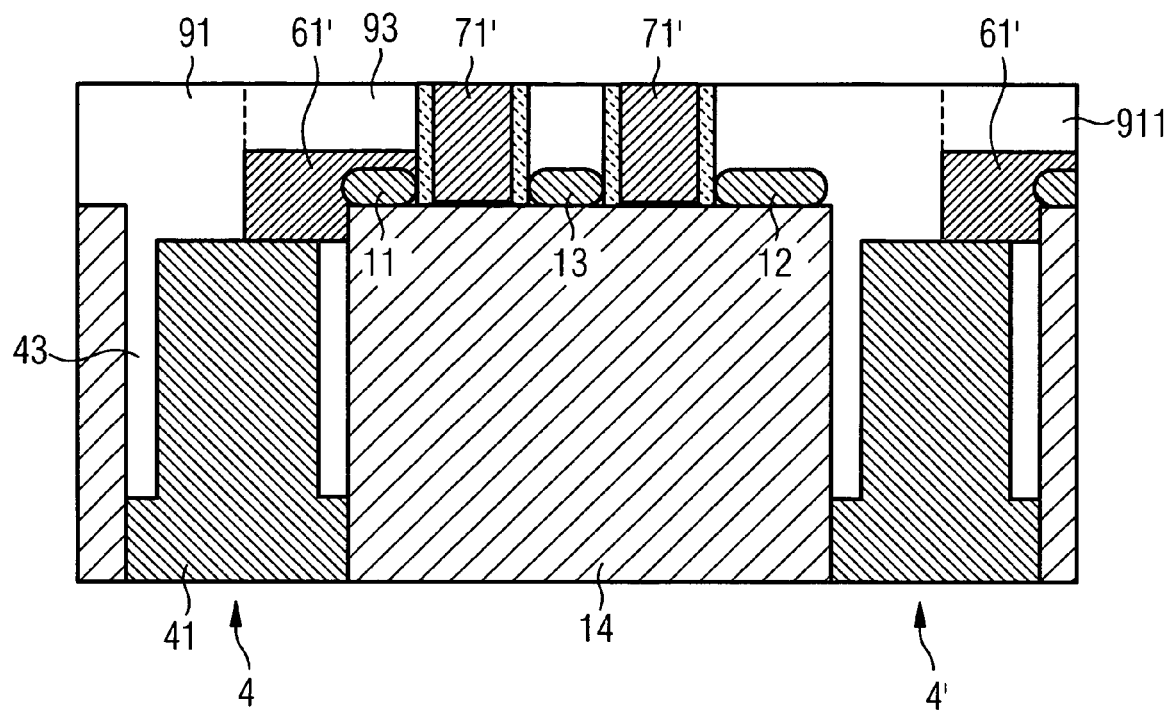

FIG. 5D illustrates the resulting contact openings 60 in the dielectric partial filling 911 and the trench top insulator 44.

One or more metal layers are deposited, filling the contact openings in the partial filling 911 and in the trench top insulators 44. The material which has been deposited is caused to recede to below the top edge of the gate conductor dots 71'. A further dielectric material is deposited, filling the contact openings 60 above the metal layers that have been caused to recede, all the way up to the top edge of the gate conductor dots 71'.

The further dielectric material is, for example, a silicon oxide or a silicon nitride and forms coverings 93. In accordance with FIG. 5E, trench connections which are in each case formed as surface strips 61' are produced from the deposited conductive material, for example polysilicon, a metal or a metal compound. The surface strips 61' in each case lie in sections on the trench node widening 11 and an uncovered section of the storage electrode 41 of the trench capacitor 4 assigned to the trench node widening 11. The surface strips 61' connect the storage electrode 41 to the first source/drain region, which in this exemplary embodiment is formed in the trench node widening 11, of the trench select transistor of the cell pair illustrated.

The formation of word lines 7, 7' follows. For this purpose, one or more barrier and adhesion layers (not shown), a highly conductive metal-containing layer, for example of tungsten, and an insulator layer, for example of silicon nitride, are deposited and patterned by means of the word line mask in accordance with FIG. 4F. The deposited layer stack is overetched into the underlying gate conductor dots 71'. The word lines 7, 7' which result from the patterning are encapsulated with spacer insulator structures 74, for example of silicon nitride. The spaces between the word lines 7, 7' are filled by the application of a dielectric material which is removed down to the top edge of the insulator layer 73 of the word lines 7, 7'. The dielectric material forms a second partial filling 912 of the gate filling 91.

The gate filling 91 is in each case opened up above the bit contact widenings 13 and the stack node widenings 12 by means of the segmented strip mask illustrated in FIG. 4F. During the etching of the dielectric fillings 91, 92, the widening sections 12, 13 of the semiconductor fin 14 are protected by the thin MOL liner which has previously been applied and is not illustrated. A contact metal, for example tungsten, is applied and the openings in the dielectric gate filling 91 above the widening sections 12, 13 are filled by the applied contact metal. The deposited contact metal is caused to recede in planarizing fashion down to the top edge of the insulator layers 73 of the word lines 7, 7'.

Figure 5F:
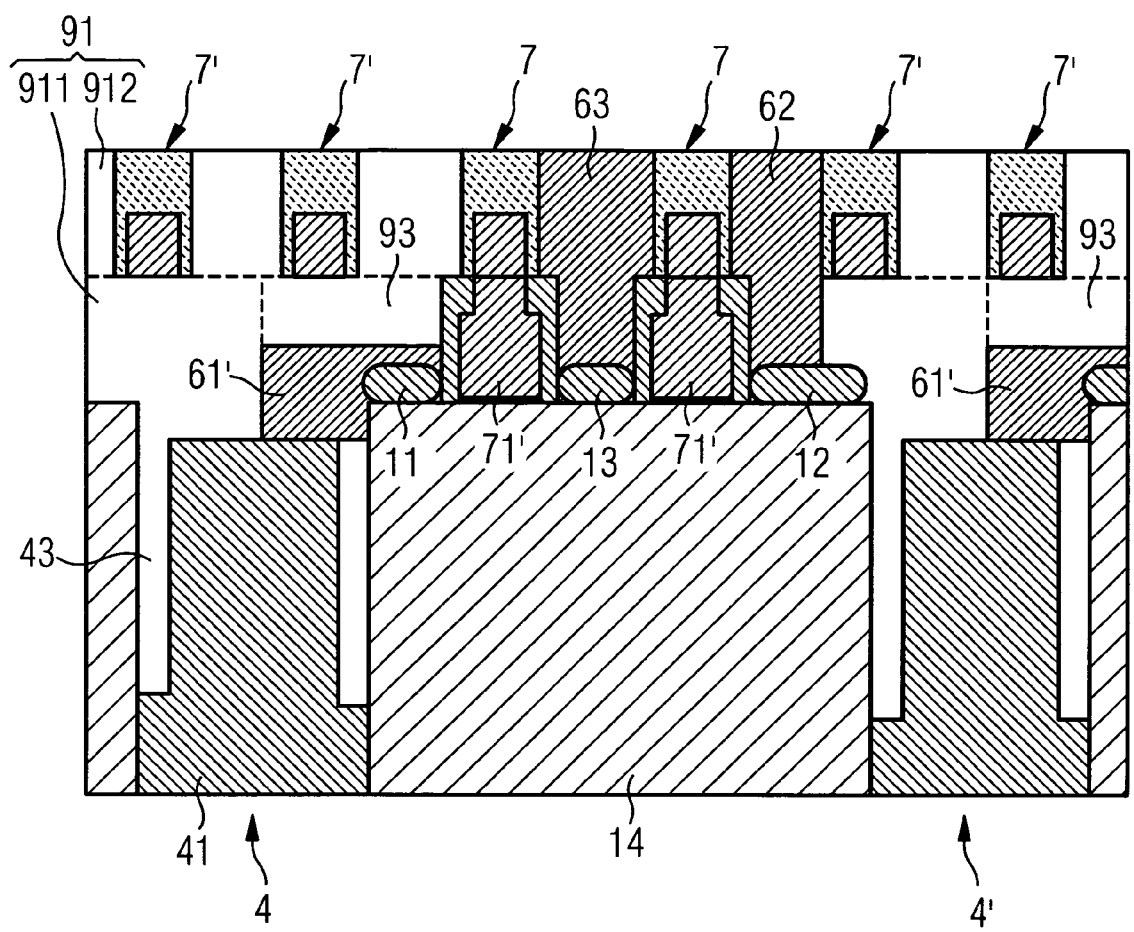

FIG. 5F illustrates the word lines 7, 7' running transversely with respect to the cell rows. The deposited tungsten forms a bit contact structure 63 above the bit contact widening 13 and forms a first section of a stack connection 62 above the stack node widening 12.

An intermediate layer 92 of a dielectric material is applied and opened up above the bit contact widenings 13 in accordance with the bit contact mask illustrated in FIG. 4G. A second section (CB section) of the bit contact structures 63 is introduced into the openings in the dielectric intermediate layer 92.

Bit lines 8 including a metal-containing layer 81 and an insulator layer 82 are formed by means of a bit line mask; the bit lines 8 run above the bit contact structures 63, adjacent to the latter, and are insulated from one another by a further dielectric filling 94. After a further dielectric interlayer 95 has been applied, second sections (CC sections) of the stack connections 62 are formed with the aid of the perforated mask illustrated in FIG. 4I, through the dielectric intermediate layers 92, 95 and 94 and between the bit lines 8.

Figure 5G:
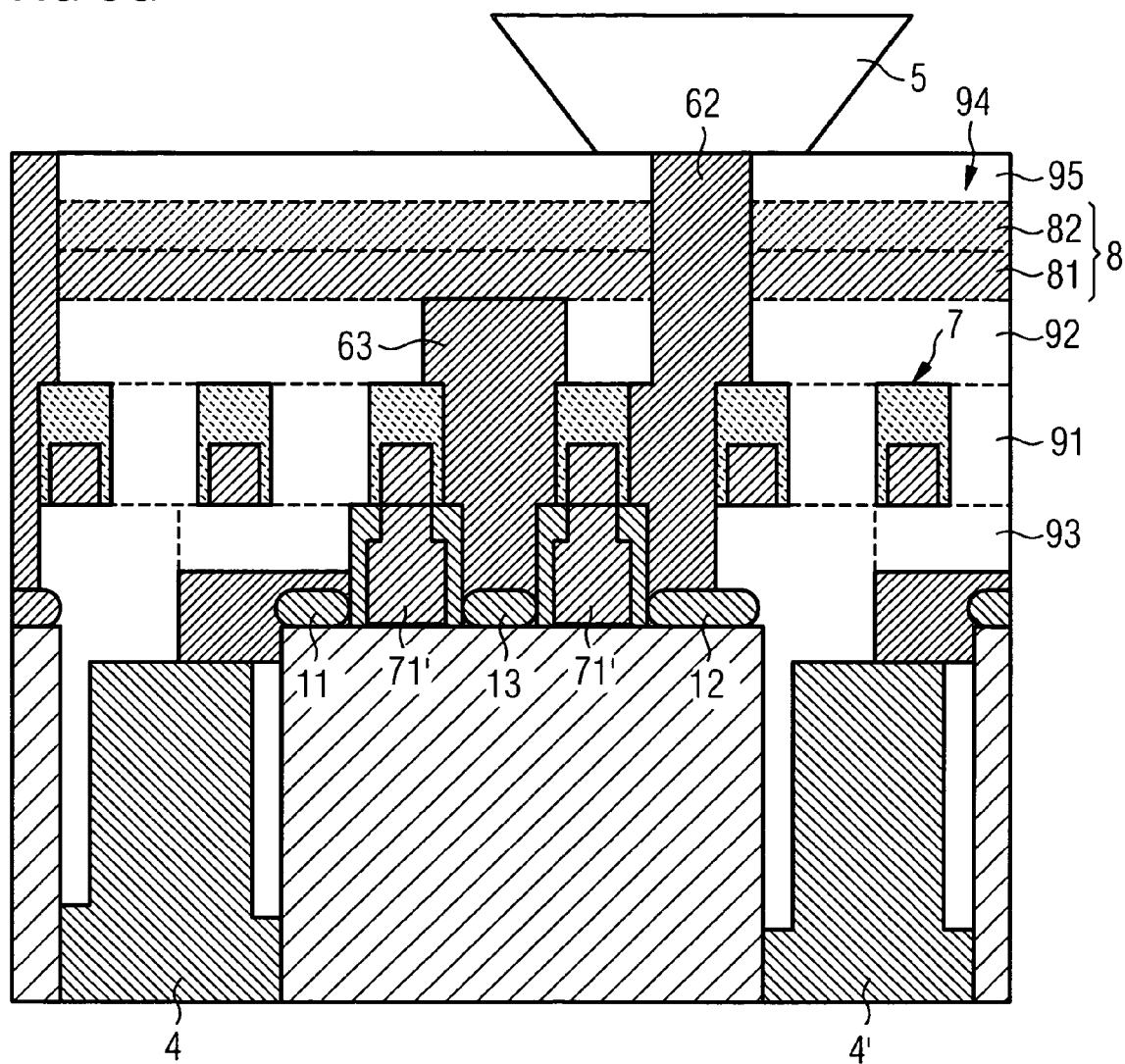

The resulting structure is illustrated in FIG. 5G, which largely corresponds to FIG. 2. The bit line 8 is formed in a plane parallel to the plane of the cross section and in the cross sectional plane illustrated is covered by the material of the dielectric filling 94.

Unlike in the case of the method described with reference to FIGS. 4 and 5, the word lines 7, 7', in the method described with reference to FIGS. 6 to 10, are designed with continuous base layers that have been patterned similarly to the connecting layers. The trench select transistor of the respective trench memory cell is connected to the associated trench capacitor by way of trench connections which are introduced between the word lines in the style of bit contact structures and each include a node section 612 and a trench section 611 of the respective trench connection, which are connected via a strip section 613 provided above the word lines 7, 7'.

Figure 6A:
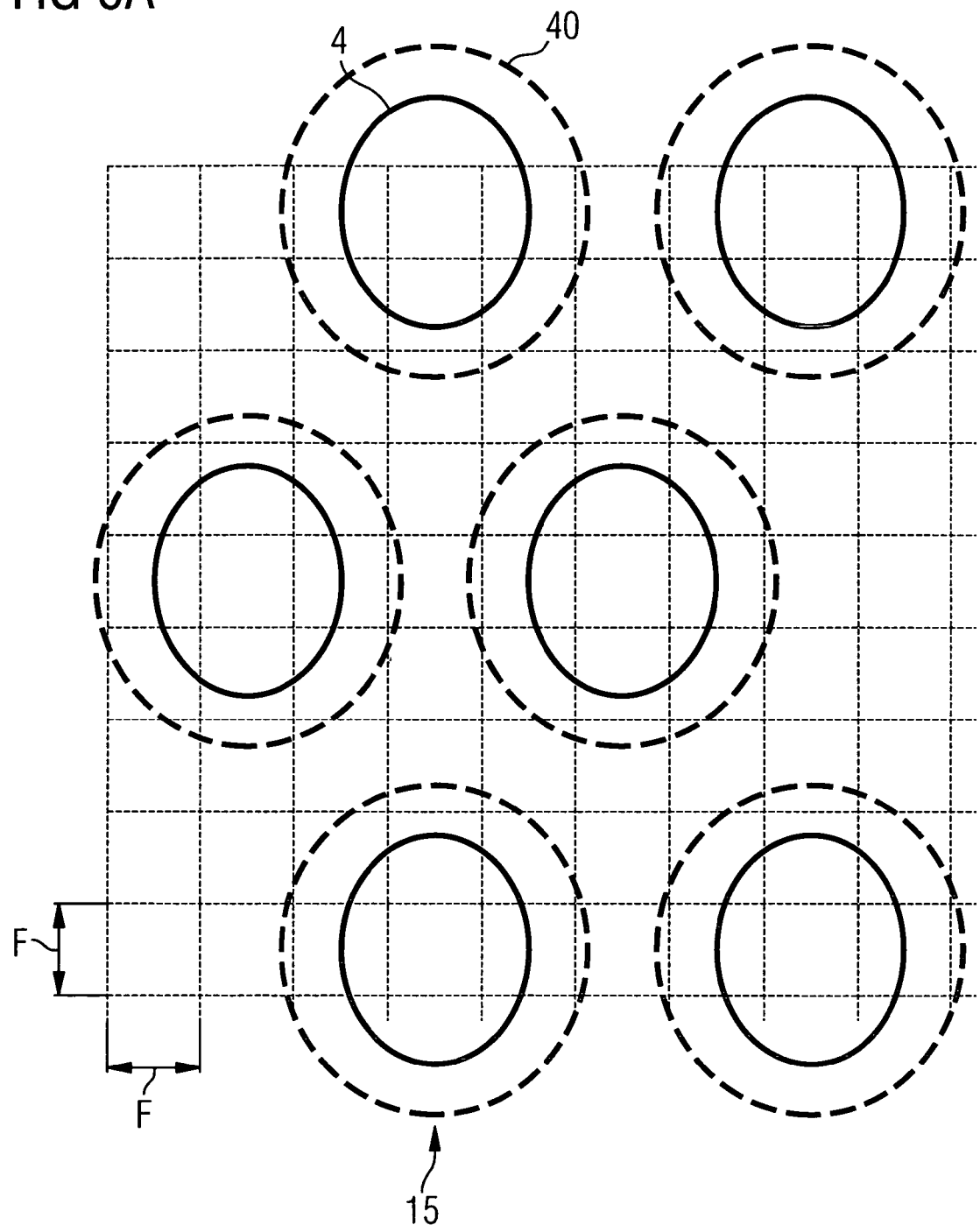
Figure 6B:
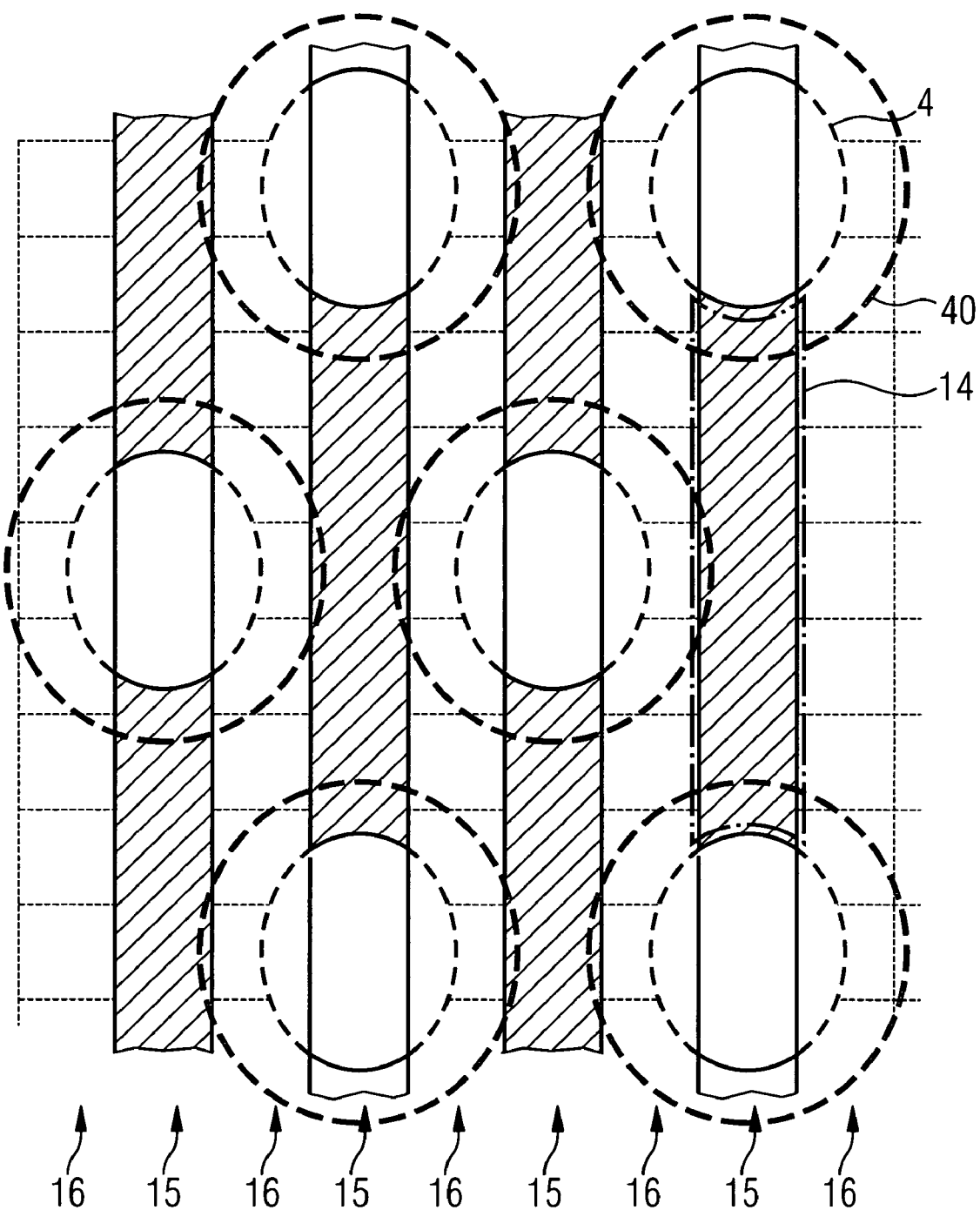

The patterning of hole trenches to form trench capacitors with top openings 4 and contours 40 which are widened in a bottle shape in a lower section of the semiconductor substrate 40 and of the semiconductor fins 14 is carried out, as illustrated in FIGS. 6A and 6B, analogously to FIGS. 4A and 4B.

Figure 6C:
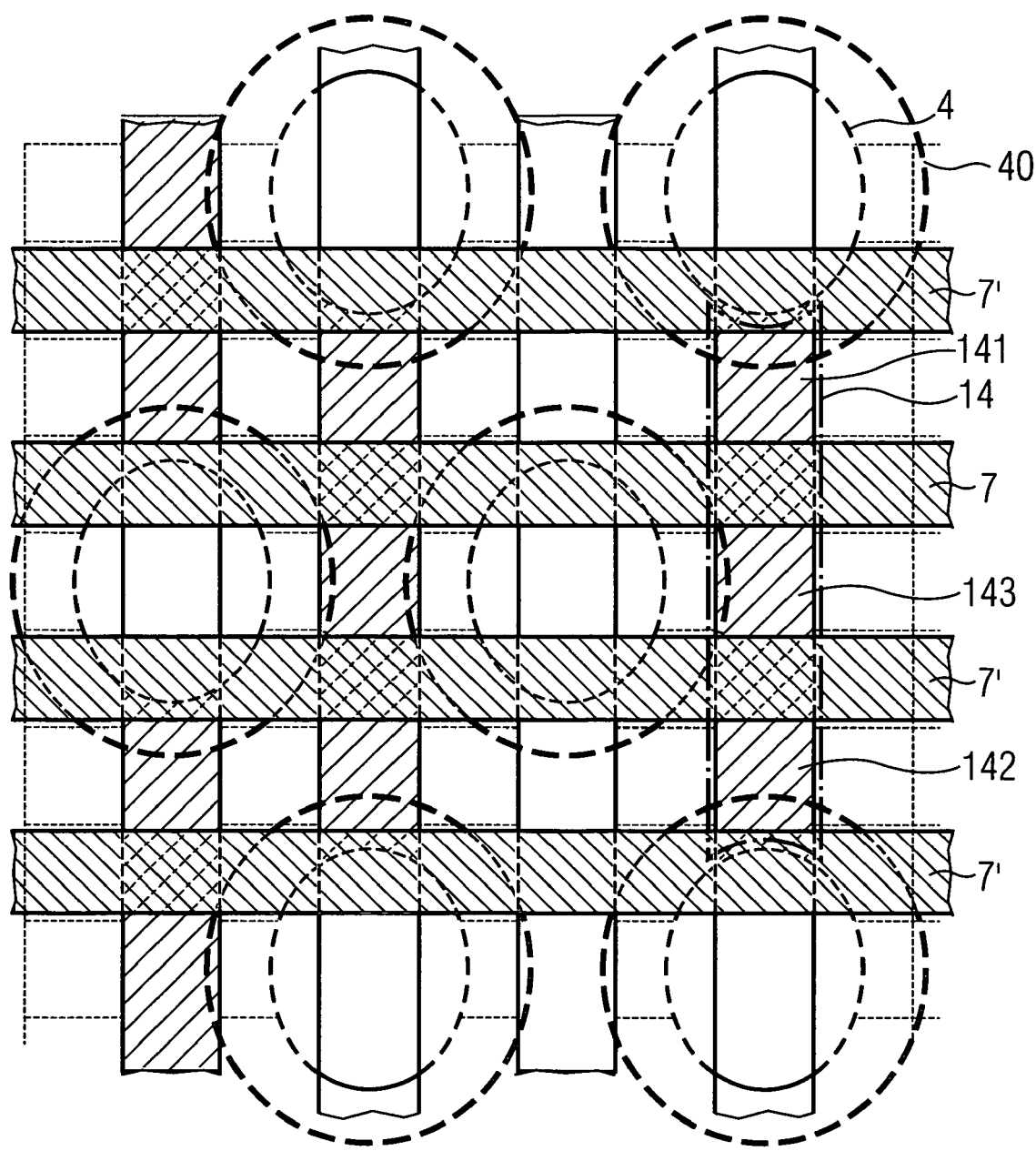
Figure 6D:
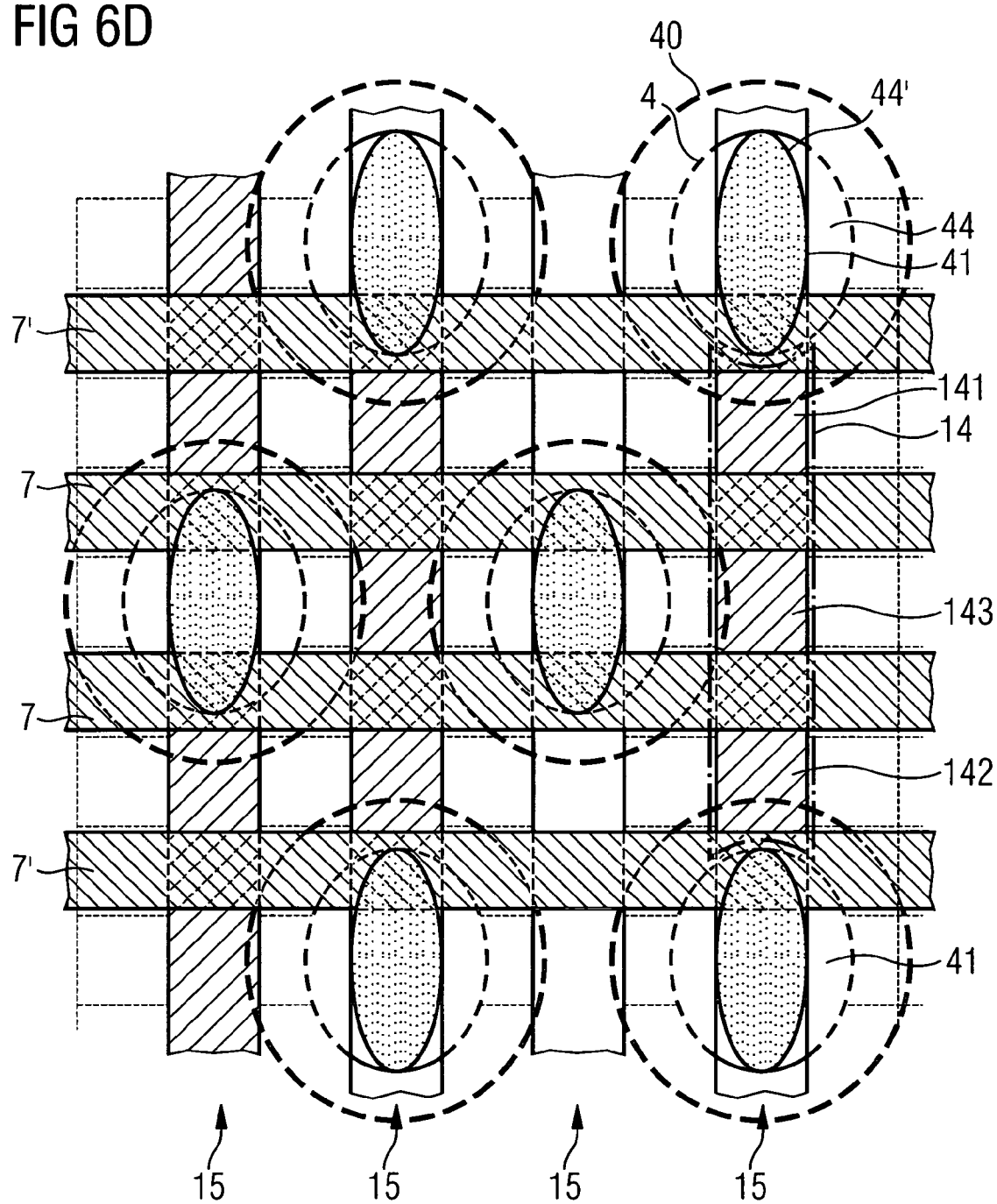
Figure 7A:
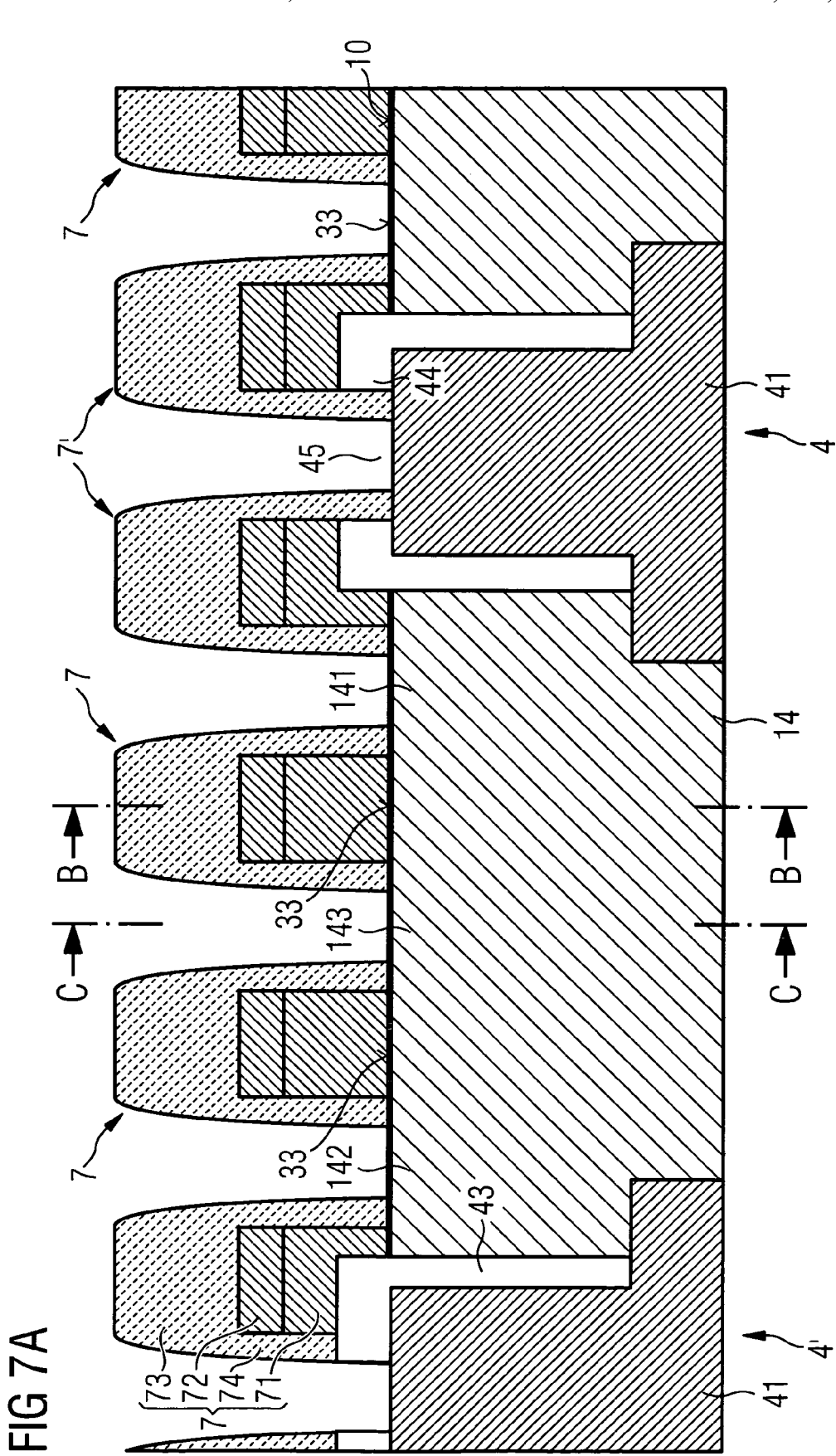
FIGS. 7A to 10C illustrate the method according to one embodiment of the invention in accordance with FIG. 6 on the basis of longitudinal and cross sections through a cell pair in various process phases.

Unlike in the method illustrated in FIG. 4A to FIG. 4J, after an insulator material forming the trench isolator structures 16 has been deposited and planarized down to the top edge of the semiconductor fins 14, a layer stack in accordance with FIG. 7A including at least one base layer 71, for example of polysilicon, a connecting layer 72, for example of a metal, and an insulator layer 73, for example of silicon nitride, is applied and patterned using a strip mask analogously to the illustration presented in FIG. 6C.

The strip-like, parallel and equidistant word lines 7, 7' which originate from the patterning run orthogonally with respect to the cell rows 15.

A resist material which fills the spaces between the word lines 7, 7' is applied. The trench top insulators 44 of the trench capacitors 4 in the region of the cell rows 15 or in the lengthening of the semiconductor fins 14 are uncovered with the aid of a top trench open mask, formed as a perforated mask. The position of the openings 44' in the top trench open mask can be seen in FIG. 6D. Then, the trench top insulators 44 are caused to recede selectively with respect to the resist material and with respect to the insulator material, for example silicon nitride, enclosing the word lines 7, 7', so that the storage electrodes 43 of the trench capacitors 4 are uncovered in a region between two word lines 7, 7' in the lengthening of the semiconductor fins 14 or within the cell rows 15.

Remaining sections of the resist material are removed. A dielectric material, which fills the spaces between the word lines 7, 7' as a gate filling 91, is applied. The dielectric material is planarized down to the top edge of the word lines 7, 7'. The dielectric material between the word lines 7, 7' above the cell rows 15 is removed by means of a CA mask, so as to create contact openings to the underlying structure. The position of the strip-like openings 65' in the CA mask can be seen in FIG. 6E. The contact openings are filled with conductive material, for example polysilicon, a metal, such as tungsten, or a metal compound, and the structure is planarized down to the top edge of the word lines 7, 7'.

Then, the strip sections 613 of the trench connections 61 are formed. This can be done, for example, using the Damascene process as described above.

In one case, a layer of a contact material, for example of a metal, and a silicon nitride layer as an insulator layer, are deposited and patterned jointly by means of a strap mask. The arrangement of remaining sections 60" of the strap mask can be seen in FIG. 6F. The strip sections of the trench connections, via which the storage electrodes of the trench capacitors are in each case connected to the trench node section of the semiconductor fin 14 assigned to the respective trench capacitor, are formed below the remaining sections 60" of the strap mask.

Figure 6E:
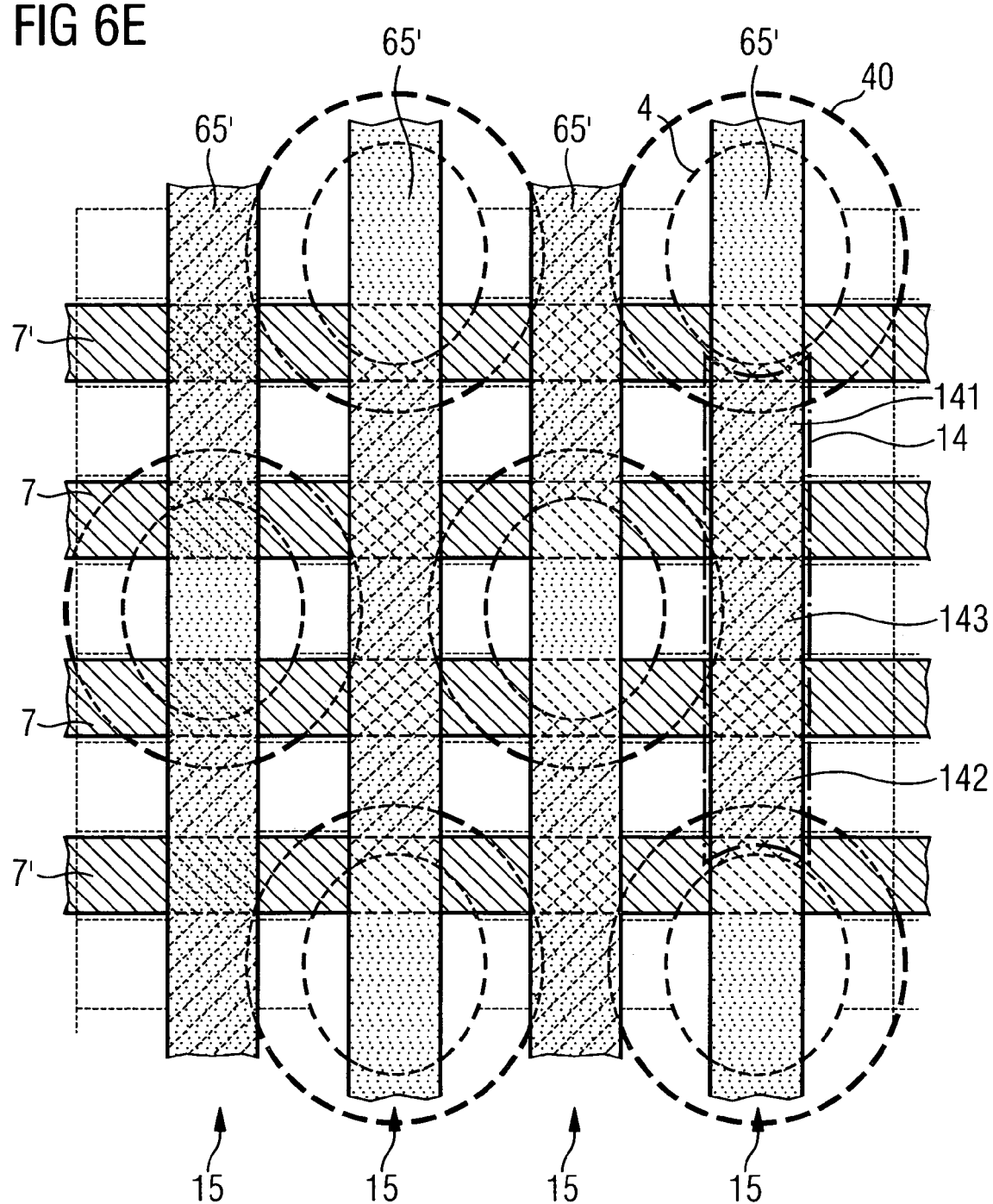
Figure 6G:
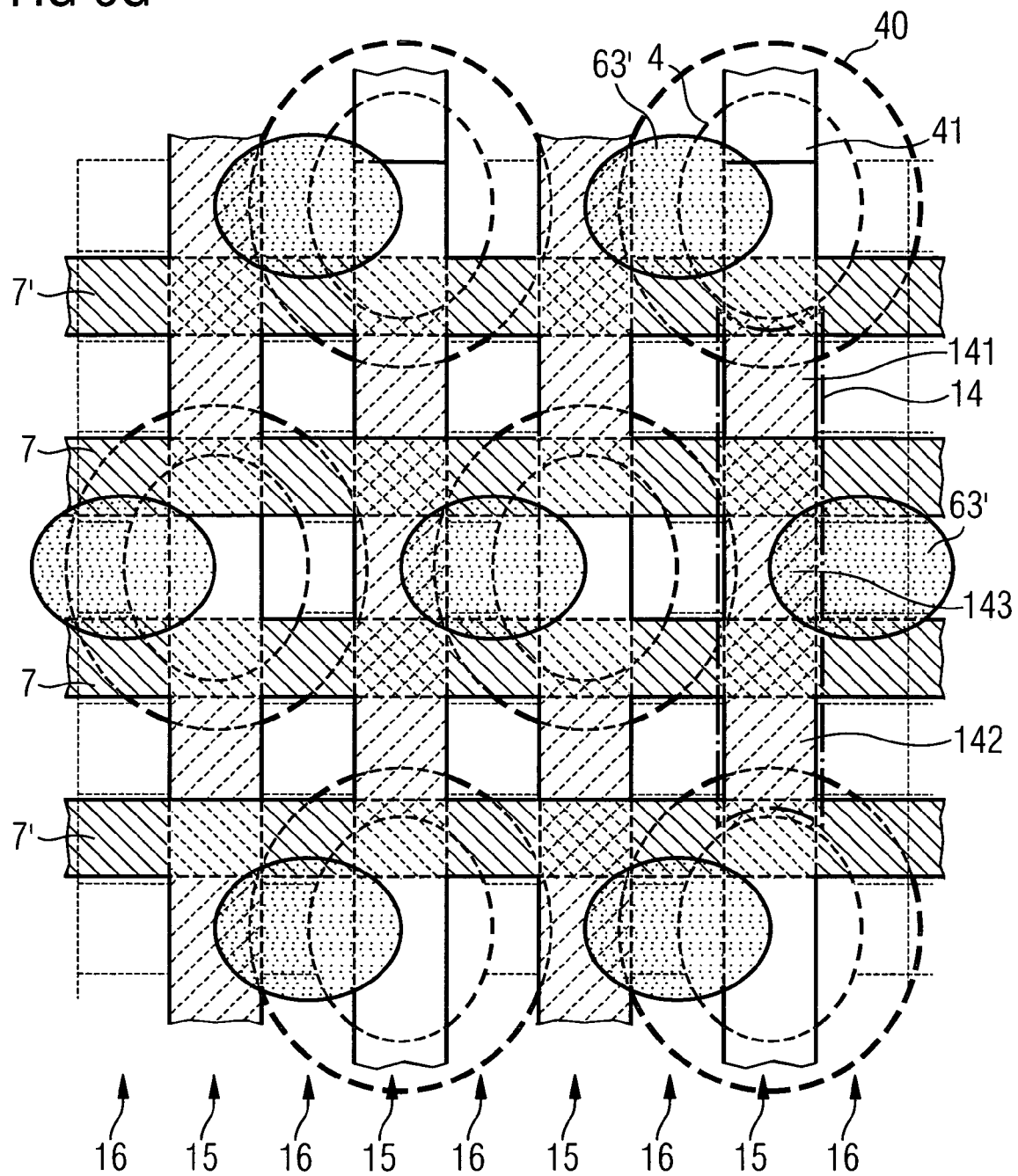
Figure 6H:
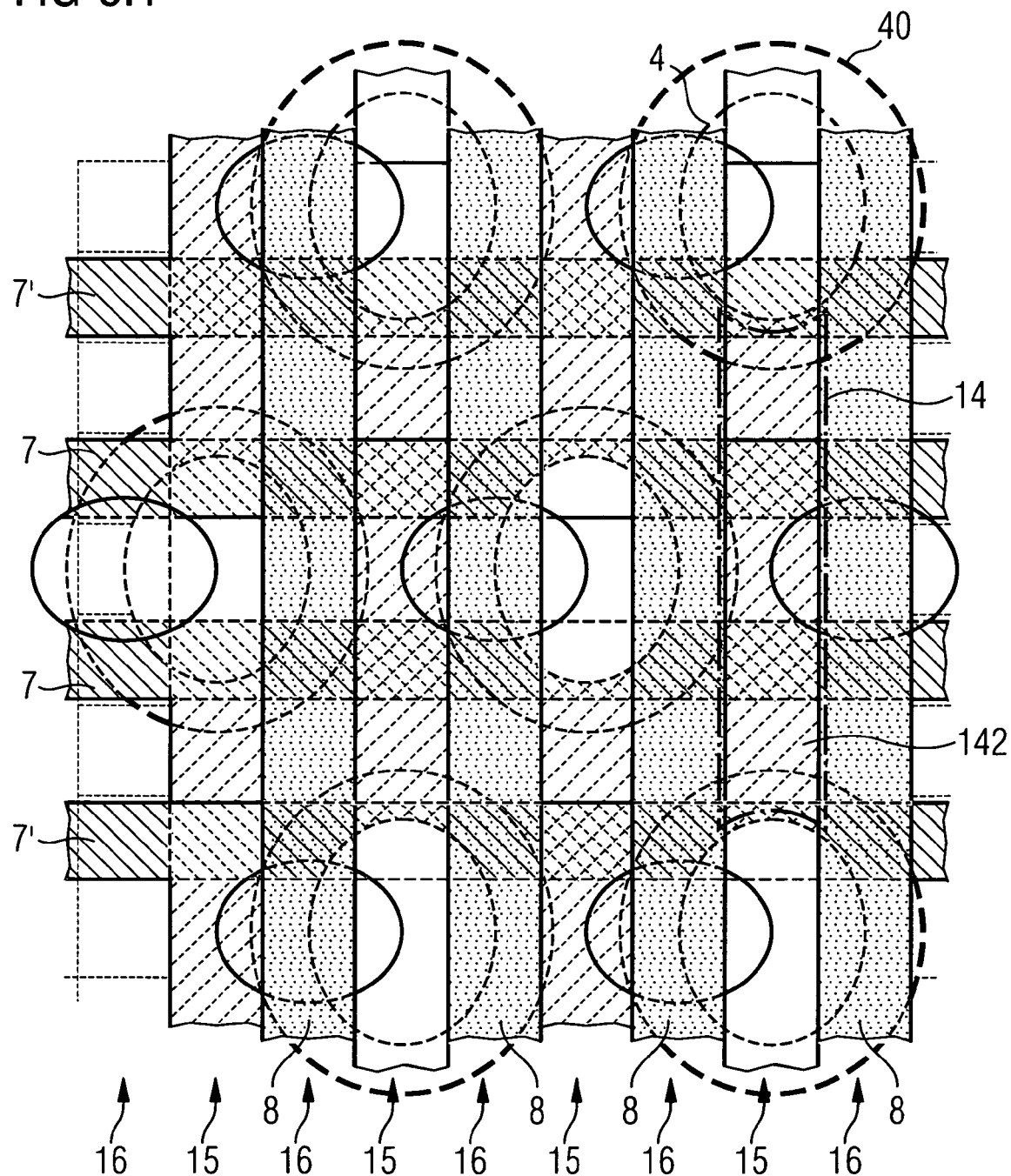

The perforated mask illustrated in FIG. 6G for forming second sections (CB sections) of the bit contact structures and the strip mask for forming bit lines correspond to the respective masks from FIGS. 4G and 4H.

Figure 6I:
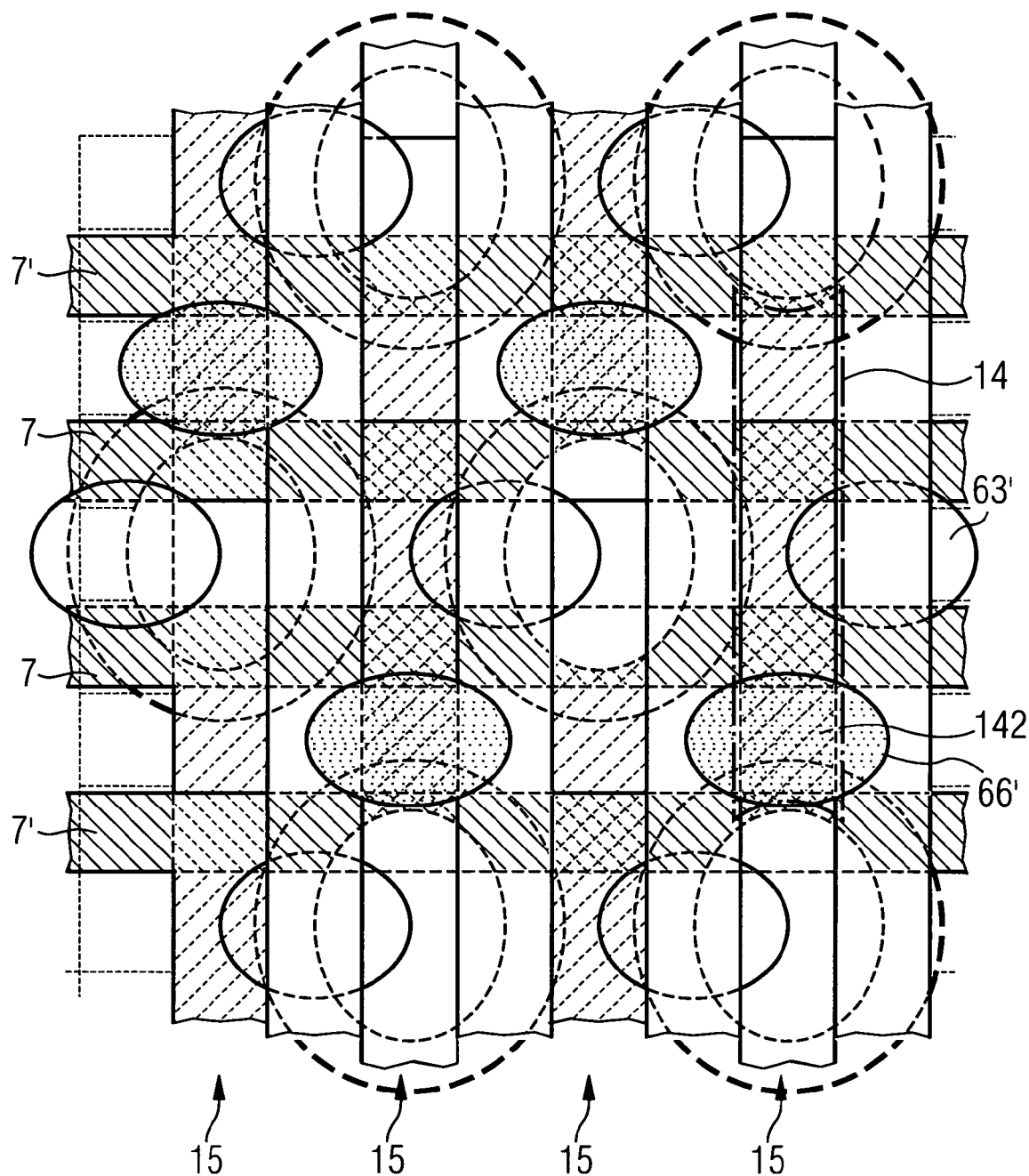
Figure 6J:
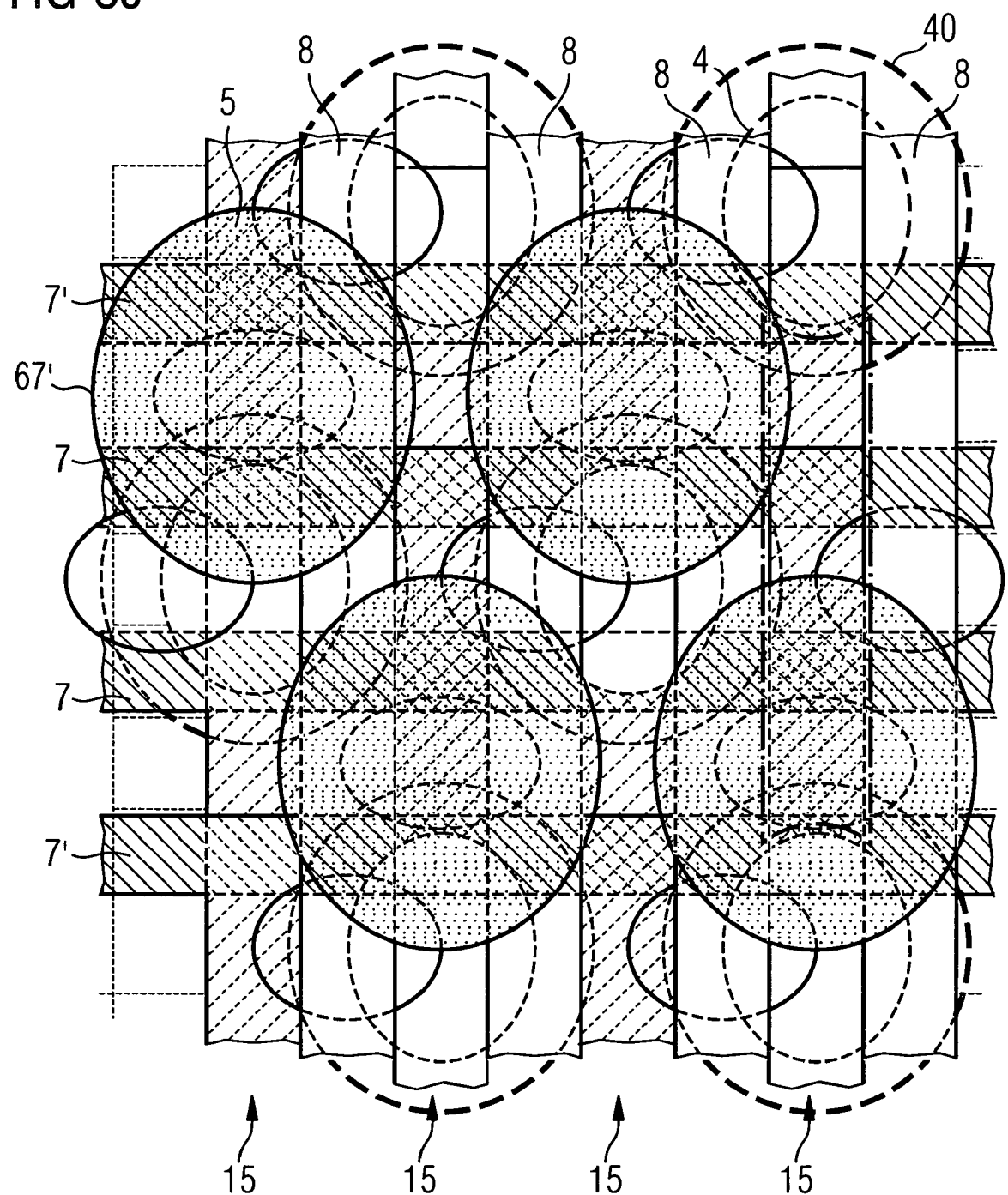

The same is true of the masks illustrated in FIGS. 6I and 6J for forming second sections (CC sections) of the stack connections for connecting the stack capacitors to the respectively associated stack node section and for forming stack trenches for forming the stack capacitors.

The processing in accordance with the exemplary embodiment of the method according to the invention in accordance with FIGS. 7 to 10 initially follows the form of the processing which has already been described with reference to FIG. 5A. After the protective layer 17 has been removed and before the gate dielectric layer 33 is formed, a well implantation is carried out in a region close to the surface of the semiconductor substrate 1.

Unlike the processing described there, after the protective layer 17 has been removed and the gate dielectric layer 33 has been formed, a layer stack comprising a base layer 71 of a semiconductor material, for example n-doped polysilicon, a metal-containing connecting layer 72 and an insulator layer 73 is deposited and jointly patterned with the aid of the strip mask analogous to that illustrated in FIG. 6C.

Then, vertical side walls of the word line structures are covered with spacer insulator structures 74. A photoresist material, which fills the spaces between the word lines 7, 7', is applied. The photoresist material is patterned in a photolithographic method and removed above the trench capacitors 4 between in each case two adjacent word lines 7'. The uncovered sections of the trench top insulators 44 are caused to recede in an etching step, selectively with respect to the photoresist material and the silicon nitride of the spacer insulator structures 74.

FIG. 7A illustrates a section along a cell row 15 after the trench top insulators 44 have been opened up in the region of a cell pair with a trench capacitor 4 and a trench capacitor 4' adjacent to the cell pair.

The trench capacitors 4, 4' are in each case widened in a bottle shape at the circumference 40 in a lower section. In the region of a cell pair, the cell row 15 is crossed by four word lines 7, 7', with in each case two active word lines 7 being used to address the memory cells of the cell pair and in each case two passive word lines 7' being used to address memory cells realized in the adjacent cell rows 15. A semiconductor fin 14 extends between the two trench capacitors 4, 4'. A bit contact section 143 of the semiconductor fin 14 and, symmetrically with respect to the bit contact section 143, two node sections 141, 142, which are each assigned to an active area of one of the two select transistors, are uncovered in the centre of the semiconductor fin 14 between the two active word lines 7.

The storage electrodes 41 of the trench capacitors 4, 4' are in each case uncovered through an opening 45 in the trench top insulator 44.

Figure 7B:
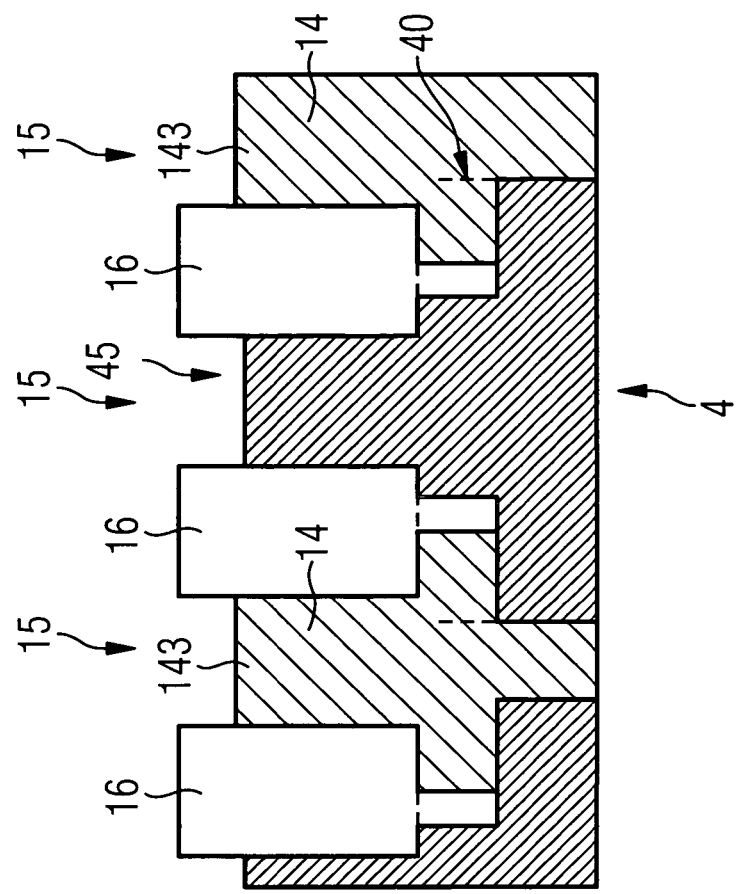

FIG. 7B illustrates a cross section orthogonally with respect to the cross-sectional plane of FIG. 7A, along a word line 7. Adjacent cell rows 15 are offset with respect to one another along the cell rows in each case by 4F, corresponding to half the length of a cell pair within the cell row. The section in accordance with FIG. 7B, in the cell rows 15, in each case alternately intersects semiconductor fins 14 in the region of a channel region 312 and trench capacitors 4 in a region in which the trench top insulator 44 is covered by the word line 7 on top and has not been caused to recede.

The cell rows 15 are isolated from one another in a region close to the surface by trench isolator structures 16. In the region of the semiconductor fins 14, the base layer 71 runs to the semiconductor fin 14 and is insulated from the latter by a gate dielectric layer 33. Outside the semiconductor fins 14, the base layer 71 lies on the trench isolator structures 16 or the trench top insulators 44.

Figure 7C:
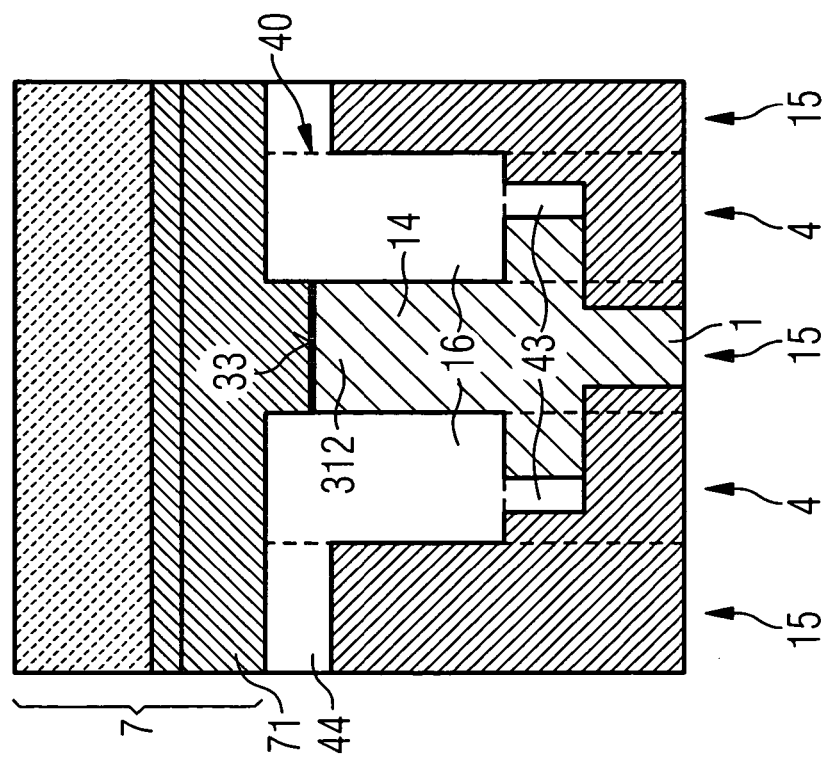

FIG. 7C illustrates a cross section orthogonally with respect to the cross section illustrated in FIG. 7A, in the region of the bit contact section 143. At this point, sections of an original gate dielectric layer 33 are still present in the region of the bit contact sections 143 and in the region of the node sections 141, 142.

In the exemplary embodiment illustrated with reference to FIGS. 7 to 10, the uncovered sections of the gate dielectric layer 33 outside the word lines 7, 7' are subsequently removed, and silicon is grown selectively on the uncovered silicon sections of the semiconductor fins 14 and of the storage electrodes 41 in a first epitaxial method step. The growth is controlled in such a way that respectively adjacent sections of the trench isolator structures 16 are overgrown by in each case about 0.25 F. A thin MOL liner 76 is deposited. Deposition of a dielectric material fills the spaces between the word lines 7, 7'. The deposited dielectric material is caused to recede in planar fashion, by means of a chemical mechanical polishing step, as far as the top edge of the word lines 7, 7', in accordance with FIG. 8A, and forms a gate filling 91.

Figure 8B:
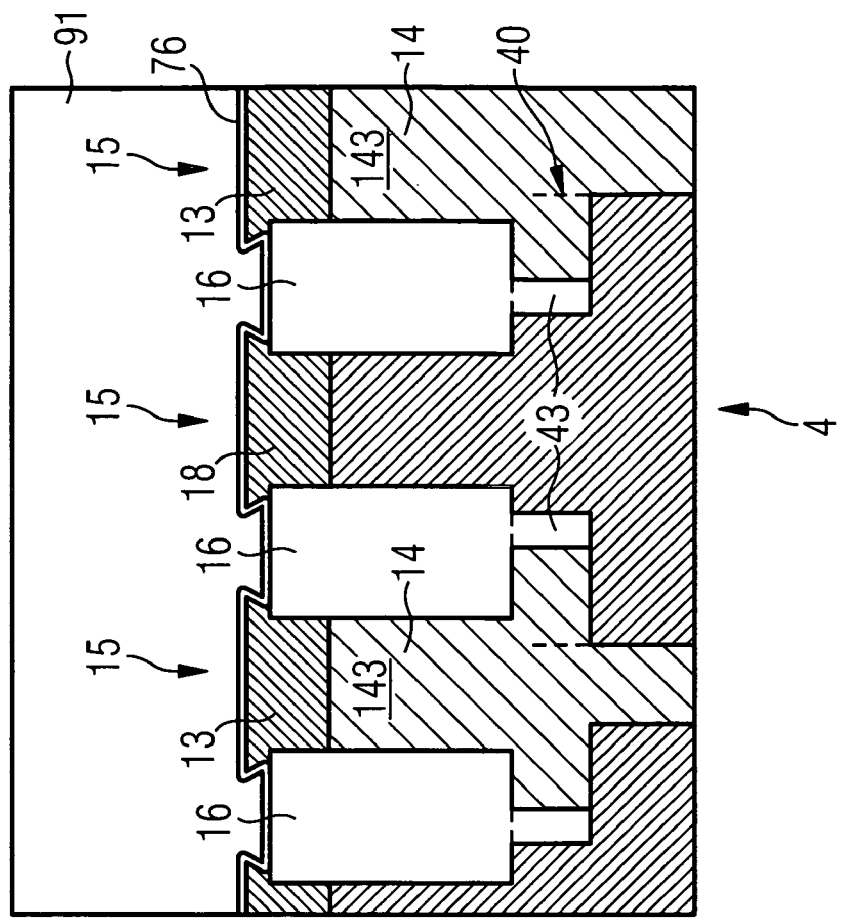

FIG. 8A also reveals the epitaxially grown widening sections 11, 12, 13 and 18 of the semiconductor fin 14 or the storage electrode 41 of the trench capacitor 4', which are in each case covered by the MOL liner 76.

Figure 8C:
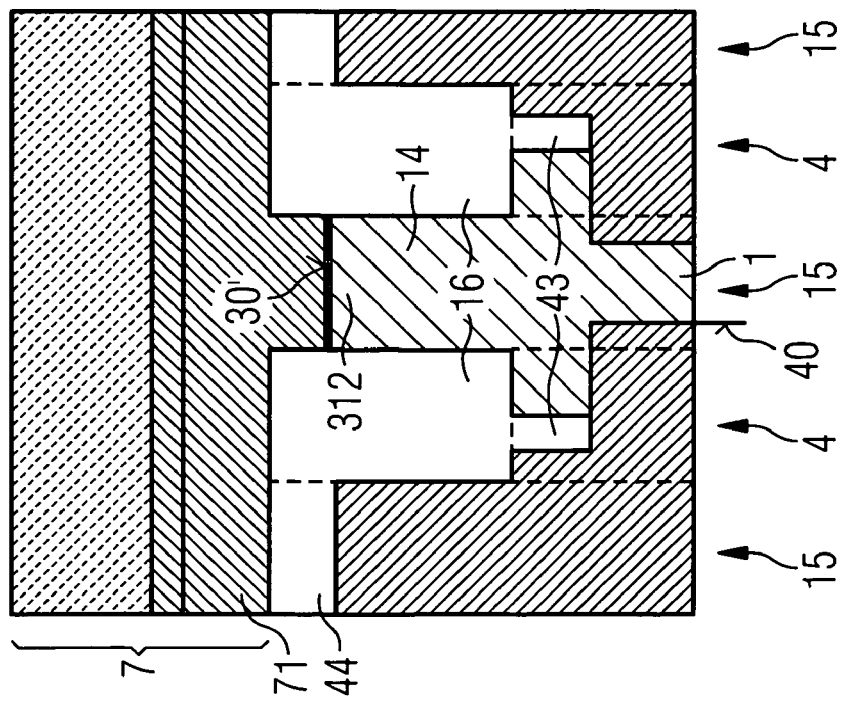
Figure 9A:
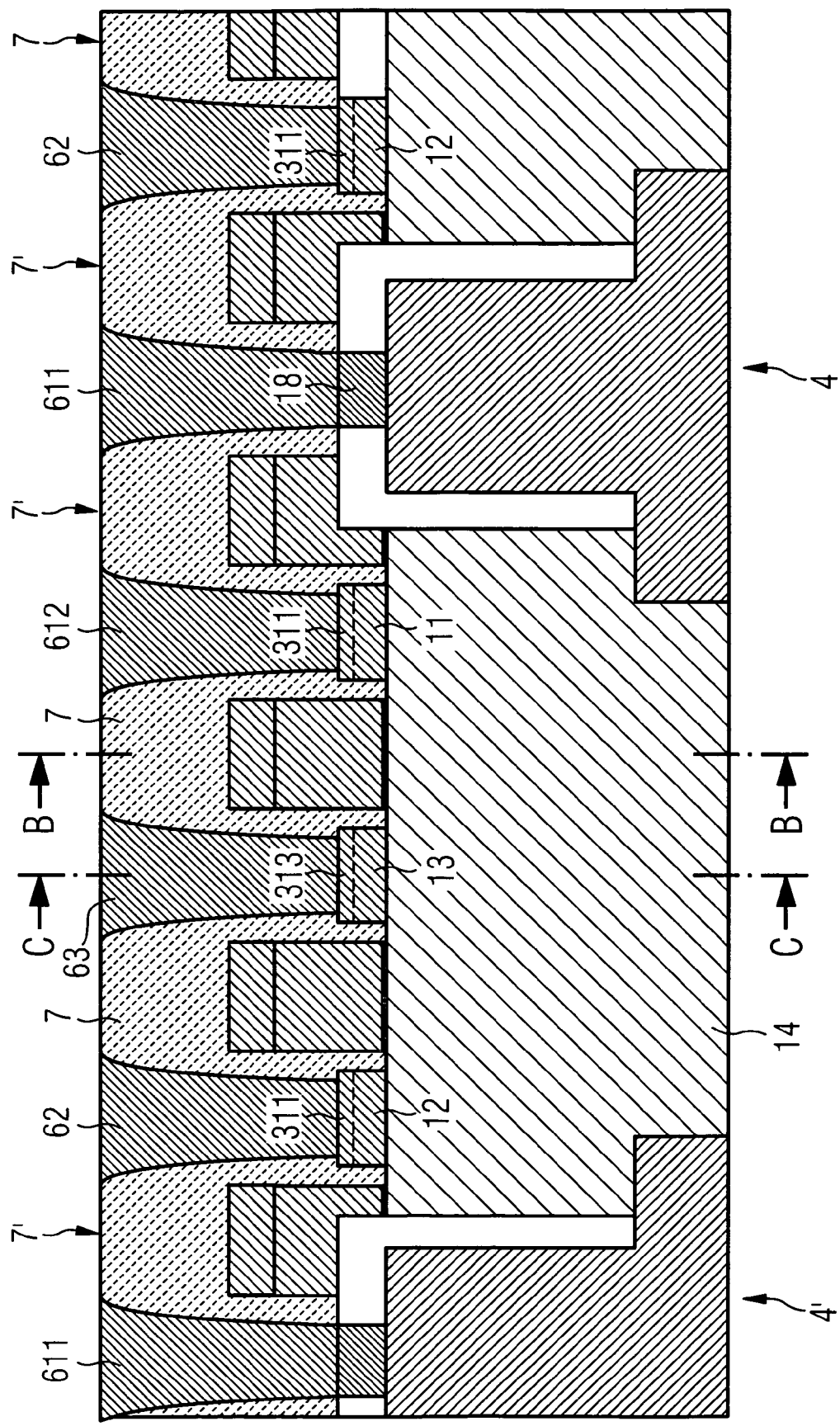

The widening of the node sections 141, 142 of the bit contact sections 143 and of the storage electrode 41 by the corresponding widenings 11, 12, 13, 18 is sketched in FIG. 8C. The widenings 13, 18 illustrated in the cross-sectional plane extend over the adjacent trench isolator structures 16, so that the surface area of the corresponding sections is increased by half.

After the planarizing step, sections of the gate filling 91 above the cell rows 15 are removed by means of the CA mask as illustrated in FIG. 6E. At the same time or subsequently, source/drain regions of auxiliary transistors are formed in the semiconductor substrate 1 in a periphery of the memory cell array to be uncovered by means of a CS mask.

In a second epitaxial method step, the widenings 11, 12, 13 and 18 are supplemented by sections of doped silicon (not shown) formed by selective growth of silicon; the source/drain regions 311, 313 of the select transistors are formed in the supplementary sections of the node widenings 11, 12 and of the bit contact widenings 13. The formation of the source/drain regions 311, 313 above the original substrate surface 10 increases the channel length of the select transistors and improves the insulator action of the locking select transistor. A contact material is deposited and caused to recede as far as the top edge of the word lines 7, 7', resulting in the structure illustrated in FIG. 9A to FIG. 9C.

Contact structures 611, 612, 62, 63 are introduced between the word lines 7, 7' above the cell rows 15. A trench section 611 of a trench connection 61 in each case adjoins the storage electrodes 41, and a node section 612 of a trench connection 61 in each case adjoins the trench electrode widening 11, and a first section of a stack connection 62 in each case adjoins the stack node widening 12 and a first section of a bit contact structure 63 in each case adjoins the bit contact widening 13. The contact structures 611, 612, 62, 63 of a cell row 15 are insulated from the contact structures 611, 612, 62, 63 of adjacent cell rows 15 by remaining sections of the gate filling 91 above the gate insulator structures 16.

In other exemplary embodiments (not shown), the source/drain regions 311, 313 are formed within the original semiconductor substrate 1, in which case at least the second epitaxial method step is dispensed with, or are formed completely or partially by the widenings 11, 12, 13 which result from the first epitaxial method step, in which case the second epitaxial method step can be dispensed with.

Figure 10A:
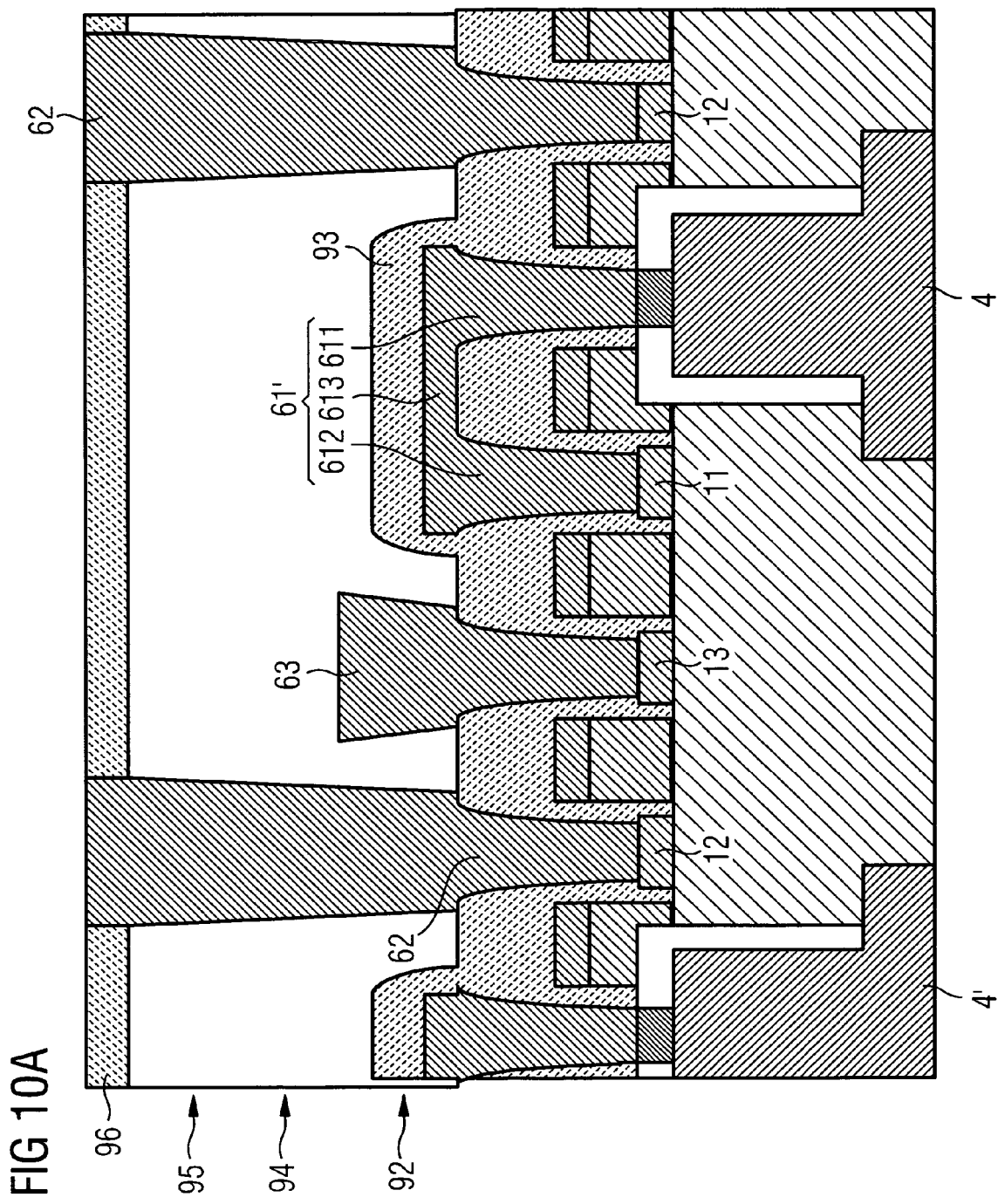

FIGS. 10A to 10C illustrate the structures which result from the lithographic steps which have already been described with reference to FIG. 6F to 6J.

FIG. 10A reveals a complete trench connection 61 having the trench section 611, the node section 612 and a strip section 613 which connects the other two sections and is embedded, with a dielectric covering 93 of silicon nitride on top of it, and together with second sections of the bit contact structures 63 above the word lines 7, 7', in a dielectric interlayer 92.

It can be seen from FIG. 10C that the second sections of the bit contact structures 63 are arranged offset with respect to the cell rows 15 and are thus connected to the bit lines 8 running above the trench isolator structures 16. A dielectric filling 94 is provided between the bit lines 8. A further dielectric interlayer 95 is applied above the bit lines 8.

In accordance with FIG. 10B, second sections of stack connections 62 are introduced through a silicon nitride layer 96, the dielectric interlayer 95, between the bit lines 8, and through the dielectric interlayer 92 to the respectively corresponding first sections.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A DRAM cell pair, comprising:
   a trench memory cell comprising:
      a trench capacitor configured as a storage capacitor and formed in oriented fashion at a hole trench that is introduced into a semiconductor substrate from a substrate surface; and
      a first select transistor connected to the trench capacitor;
   a stack memory cell comprising:
      a stack capacitor arranged above the substrate surface as storage capacitor; and
      a second select transistor connected to the stack capacitor;
   wherein the select transistors each have an active area;
   a first source/drain region coupled to a storage electrode of the respectively associated storage capacitor and formed as a doped region of a first conductivity type;
   a second source/drain region coupled to a bit line for transmitting an electric charge from/to the storage electrode and formed as a doped region of the first conductivity type; and
   a channel region configured to space the two source/drain regions apart from one another, and formed as a region that is not doped by the first conductivity type, and the dimensions of which define a channel length and a channel width of the select transistor;
   wherein the two active areas are formed in a semiconductor fin, which is formed as a section of the semiconductor substrate, which is delimited by trench isolator structures at two parallel sides, and at one end of which the trench capacitor is arranged; and
   wherein the two active areas are arranged one behind the other along a longitudinal axis of the semiconductor fin and are formed in mirror-image fashion with respect to one another, the two source/drain regions of the two select transistors forming a cohesive bit contact terminal region.

2. The DRAM cell pair of claim 1, wherein the channel region is doped by a second conductivity type opposite the first conductivity type.

3. A DRAM memory cell array, comprising:
   memory cells with a storage capacitor and a select transistor having a gate electrode;
   word lines forming in sections a plurality of gate electrodes for selective addressing of the memory cells;
   bit lines coupled to a plurality of the select transistors, for transmitting electric charge stored in the memory cells;
   wherein two of the memory cells are arranged as a DRAM cell pair comprising:

a trench memory cell comprising:
  a trench capacitor configured as a storage capacitor and formed in oriented fashion at a hole trench that is introduced into a semiconductor substrate from a substrate surface; and
  a first select transistor connected to the trench capacitor;
a stack memory cell comprising:
  a stack capacitor arranged above the substrate surface as storage capacitor; and
  a second select transistor connected to the stack capacitor;
wherein the select transistors each have an active area;
a first source/drain region coupled to a storage electrode of the respectively associated storage capacitor and formed as a doped region of a first conductivity type;
a second source/drain region coupled to a bit line for transmitting an electric charge from/to the storage electrode and formed as a doped region of the first conductivity type; and
a channel region configured to space the two source/drain regions apart from one another, and formed as a region that is not doped by the first conductivity type, and the dimensions of which define a channel length and a channel width of the select transistor;
wherein the two active areas are formed in a semiconductor fin, which is formed as a section of the semiconductor substrate, which is delimited by trench isolator structures at two parallel longitudinal sides, and at one end of which the trench capacitor is arranged; and
wherein the two active areas are arranged one behind the other along a longitudinal axis of the semiconductor fin and are formed in mirror-image fashion with respect to one another, the two source/drain regions of the two select transistors forming a cohesive bit contact terminal region.

4. The DRAM memory cell array of claim 3, wherein a plurality of DRAM cell pairs are arranged in succession adjacent to one another along a longitudinal axis of the semiconductor fins to form cell rows, with two cell pairs being separated from one another by the trench capacitor of one of the two cell pairs.

5. The DRAM memory cell array of claim 4, wherein a plurality of parallel cell rows are separated from one another by in each case a trench isolator structure.

6. The DRAM memory cell array of claim 5, wherein two adjacent cell rows are offset with respect to one another by the extent of one cell pair along the cell row.

7. The DRAM memory cell array of claim 6, wherein:
the bit lines run parallel to the cell rows;
the word lines run orthogonally with respect to the cell rows; and
the cell rows in the region of each cell pair, are crossed by two active word lines that address the respective cell pair and by two passive word lines that address cell pairs in adjacent cell rows.

8. The DRAM memory cell array of claim 3, further comprising:
a storage electrode formed as a filling of the respective hole trench, of the trench capacitor of the respective cell pair is connected to the first source/drain region of the first select transistor by way of a trench connection;
wherein the stack capacitor is connected to the first source/drain region of the second select transistor by means of a stack connection; and
wherein the trench connection and the stack connection are formed from the same materials.

9. The DRAM memory cell array of claim 3, wherein the word lines comprise:
a base layer spaced apart from the channel regions by a gate dielectric; and
a connecting layer connected to the base layer.

10. The DRAM memory cell array of claim 9, wherein the base layer is absent above the cell rows that cannot be addressed by the respective word line wherein sections of the base layer that are assigned to a select transistor are separated from one another, and wherein the sections that are separated from one another are connected by the connecting layer of the respective word line.

11. The DRAM memory cell array of claim 10, wherein the trench connections are formed completely between the substrate surface and a bottom edge of the connecting layer of the word lines.

12. The DRAM memory cell array of claim 9, wherein the base layers are formed completely along the word lines, and the trench connections run via a word line that runs between the first source/drain region of the respective first select transistor and a terminal of the storage electrode of the respective trench capacitor.

13. The DRAM memory cell array of claim 9, wherein the base layer is formed from a different material from the connecting layer.

14. The DRAM memory cell array of claim 3, wherein the channel region is doped by a second conductivity type opposite the first conductivity type.

15. A DRAM cell pair, comprising:
a trench memory cell comprising:
  a trench capacitor configured as a storage capacitor and formed in oriented fashion at a hole trench that is introduced into a semiconductor substrate from a substrate surface; and
  a first select transistor connected to the trench capacitor;
a stack memory cell comprising:
  a stack capacitor arranged above the substrate surface as storage capacitor; and
  a second select transistor connected to the stack capacitor;
  means for forming an active area of each of the select transistors;
  wherein the two active areas are formed in a semiconductor fin which is formed as a section of the semiconductor substrate, which is delimited by trench isolator structures at two parallel longitudinal sides, and at one end of which the trench capacitor is arranged.

16. The DRAM cell pair of claim 15, wherein the active area of each of the select transistors comprises:
a first source/drain region coupled to a storage electrode of the respectively associated storage capacitor and formed as a doped region of a first conductivity type;
a second source/drain region coupled to a bit line for transmitting an electric charge from/to the storage electrode and formed as a doped region of the first conductivity type; and
means for spacing the first and second source/drain regions apart from one another.

17. A DRAM memory cell array, comprising:
memory cells with a storage capacitor and a select transistor having a gate electrode;
word lines forming in sections a plurality of gate electrodes for selective addressing of the memory cells;
bit lines coupled to a plurality of the select transistors, for transmitting electric charge stored in the memory cells;

wherein two of the memory cells are arranged as a DRAM cell pair comprising:
a trench memory cell comprising a trench capacitor configured as a storage capacitor and formed in oriented fashion at a hole trench that is introduced into a semiconductor substrate from a substrate surface; and
a stack memory cell comprising a stack capacitor arranged above the substrate surface as storage capacitor; and
means for forming a first select transistor connected to the trench capacitor and a second select transistor connected to the stack capacitor;
means for forming an active area of each of the select transistors;
wherein the two active areas are formed in a semiconductor fin which is formed as a section of the semiconductor substrate, which is delimited by trench isolator structures at two parallel longitudinal sides, and at one end of which the trench capacitor is arranged.

18. The DRAM memory cell array of claim 17, wherein the active area of each of the select transistors comprises:

a first source/drain region coupled to a storage electrode of the respectively associated storage capacitor and formed as a doped region of a first conductivity type;

a second source/drain region coupled to a bit line for transmitting an electric charge from/to the storage electrode and formed as a doped region of the first conductivity type; and means for spacing the first and second source/drain regions apart from one another.

19. The DRAM memory cell array of claim 18, further comprising:

a plurality of the DRAM cell pairs being arranged in succession adjacent to one another to form a plurality of parallel cell rows; and means for separating the parallel cell rows from one another.

* * * * *